(12) United States Patent
Motohashi et al.

(10) Patent No.: US 10,314,169 B2
(45) Date of Patent: Jun. 4, 2019

(54) ELECTRONIC DEVICE

(71) Applicant: Renesas Electronics Corporation, Tokyo (JP)

(72) Inventors: Norikazu Motohashi, Tokyo (JP); Tomohiro Nishiyama, Tokyo (JP); Tadashi Shimizu, Tokyo (JP); Shinji Nishizono, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 49 days.

(21) Appl. No.: 15/562,992

(22) PCT Filed: Aug. 21, 2015

(86) PCT No.: PCT/JP2015/073628
§ 371 (c)(1),
(2) Date: Sep. 29, 2017

(87) PCT Pub. No.: WO2017/033244
PCT Pub. Date: Mar. 2, 2017

(65) Prior Publication Data
US 2018/0368262 A1   Dec. 20, 2018

(51) Int. Cl.
*H05K 1/18* (2006.01)
*H02M 7/48* (2007.01)
(Continued)

(52) U.S. Cl.
CPC ............. *H05K 1/181* (2013.01); *F02M 37/08* (2013.01); *H01L 23/3107* (2013.01);
(Continued)

(58) Field of Classification Search
CPC ............ H05K 1/18; H05K 1/181; H05K 1/14; H05K 1/115; H05K 2201/09063;
(Continued)

(56) References Cited

U.S. PATENT DOCUMENTS 5,576,575 A     11/1996  Terasawa
10,043,755 B2 *  8/2018  Betsui ................... H01L 25/04
(Continued)

FOREIGN PATENT DOCUMENTS

JP    06-237574 A    8/1994
JP    2001-284524 A  10/2001
(Continued)

OTHER PUBLICATIONS

International Search Report of PCT/JP2015/073628 dated Nov. 2, 2015 [PCT/ISA/210].

*Primary Examiner* — Hieu T Vo
(74) *Attorney, Agent, or Firm* — Sughrue Mion, PLLC

(57) ABSTRACT

A plurality of semiconductor devices each including a semiconductor chip having a high-side MOSFET and a semiconductor chip having a low-side MOSFET are mounted on a wiring board (PB1). The wiring board (PB1) includes a power supply wiring WV1 to which a power supply potential is supplied and output wirings WD1, WD2, and WD3 electrically connecting a low-side drain terminal of each of the plurality of semiconductor devices to a plurality of output terminals. A minimum value and a maximum value of a current path width in the power supply wiring WV1 are referred to as a first minimum width and a first maximum width, respectively, and a minimum value and a maximum value of a current path width in the output wirings WD1, WD2, and WD3 are referred to as a second minimum width and a second maximum width, respectively. When the first minimum width is smaller than the second minimum width, the first minimum width is larger than half of the second maximum width, and when the second minimum width is smaller than the first minimum width, the second minimum width is larger than half of the first maximum width.

15 Claims, 21 Drawing Sheets

(51) Int. Cl.
| | | |
|---|---|---|
| H02K 11/33 | (2016.01) | |
| F02M 37/08 | (2006.01) | |
| H01L 23/31 | (2006.01) | |
| H01L 23/495 | (2006.01) | |
| H02M 7/00 | (2006.01) | |
| H02P 27/06 | (2006.01) | |
| H05K 1/11 | (2006.01) | |
| H05K 1/14 | (2006.01) | |

(52) U.S. Cl.
CPC .... *H01L 23/4952* (2013.01); *H01L 23/49513* (2013.01); *H01L 23/49562* (2013.01); *H01L 23/49575* (2013.01); *H02K 11/33* (2016.01); *H02M 7/003* (2013.01); *H02M 7/48* (2013.01); *H02P 27/06* (2013.01); *H05K 1/115* (2013.01); *H05K 1/14* (2013.01); *F02M 2037/085* (2013.01); *H02K 2211/03* (2013.01); *H05K 2201/042* (2013.01); *H05K 2201/09027* (2013.01); *H05K 2201/09063* (2013.01); *H05K 2201/10166* (2013.01)

(58) Field of Classification Search
CPC ............ H05K 2201/042; F02M 37/08; F02M 2037/085; H02K 11/33; H02K 2011/03; H01L 23/49513; H01L 23/49562; H01L 23/3107; H01L 23/4952; H01L 23/49575
See application file for complete search history.

(56) References Cited

U.S. PATENT DOCUMENTS

| | | | |
|---|---|---|---|
| 10,165,673 | B2 * | 12/2018 | Tsukuda ............... H05K 1/0216 |
| 2001/0015478 | A1 | 8/2001 | Tsunoda et al. |
| 2011/0199800 | A1 | 8/2011 | Yahata et al. |
| 2012/0104886 | A1 | 5/2012 | Yamasaki et al. |
| 2013/0141871 | A1 | 6/2013 | Omae et al. |
| 2018/0263108 | A1 * | 9/2018 | Tsukuda ................ H05K 1/181 |

FOREIGN PATENT DOCUMENTS

| | | |
|---|---|---|
| JP | 2004-194382 A | 7/2004 |
| JP | 2004-297847 A | 10/2004 |
| JP | 2010-088195 A | 4/2010 |
| JP | 2011-176999 A | 9/2011 |
| JP | 2013-062959 A | 4/2013 |
| JP | 2013-085409 A | 5/2013 |
| JP | 2014-007189 A | 1/2014 |
| JP | 2014-159276 A | 9/2014 |
| JP | 2015-039295 A | 2/2015 |

* cited by examiner

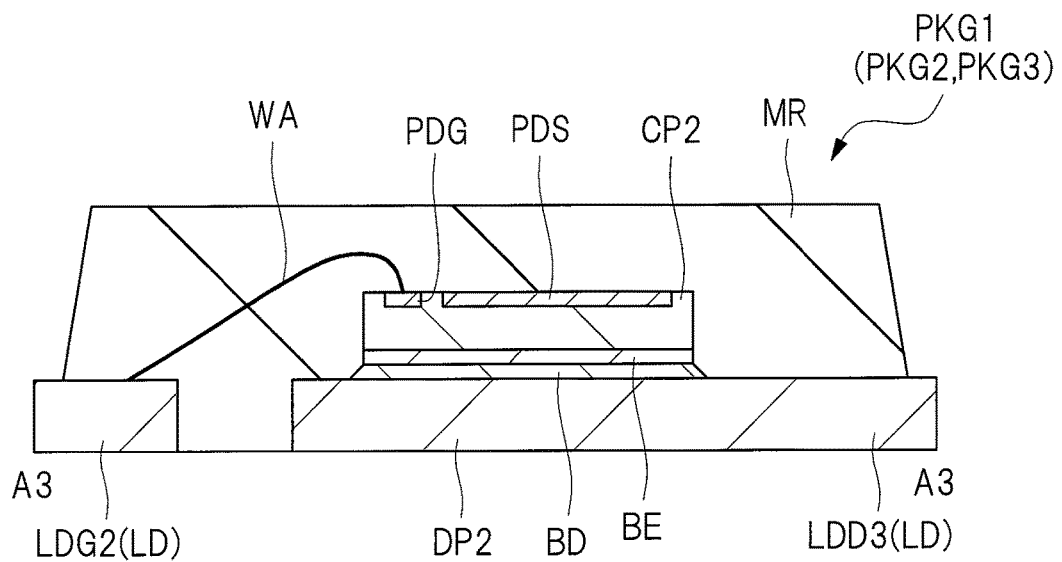
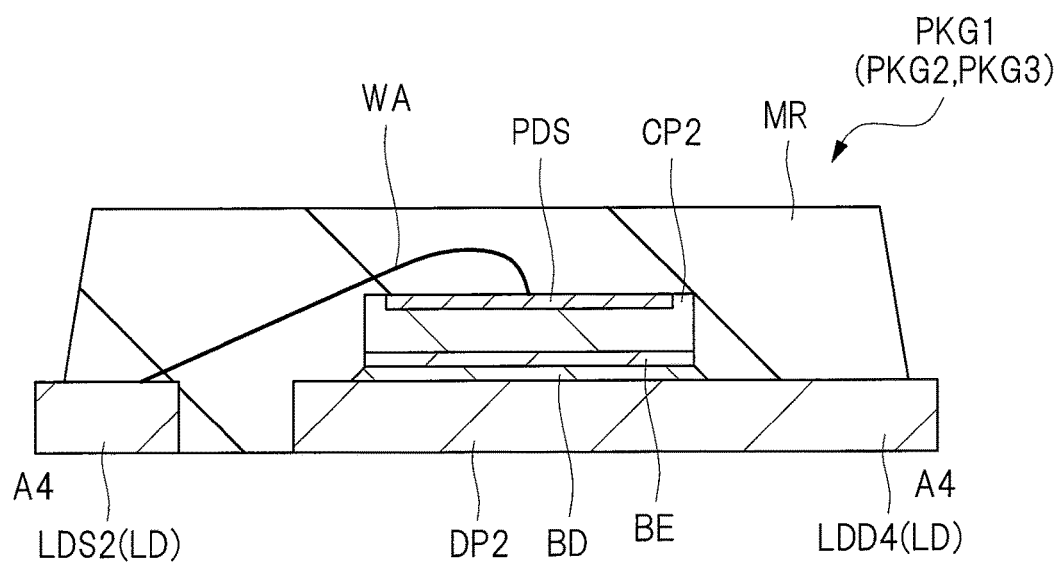

ELECTRONIC DEVICE

TECHNICAL FIELD

The present invention relates to an electronic device and can be suitably used for, for example, an electronic device for driving a motor.

BACKGROUND ART

Japanese Patent Application Laid-Open Publication No. 2013-62959 (Patent Document 1), No. 2011-176999 (Patent Document 2), and No. 2004-297847 (Patent Document 3) describe a technique related to a motor drive device.

RELATED ART DOCUMENTS

Patent Documents

Patent Document 1: Japanese Patent Application Laid-Open Publication No. 2013-62959
Patent Document 2: Japanese Patent Application Laid-Open Publication No. 2011-176999
Patent Document 3: Japanese Patent Application Laid-Open Publication No. 2004-297847

SUMMARY OF THE INVENTION

Problems to be Solved by the Invention

It has been desired to improve the performance in an electronic device in which a plurality of semiconductor devices each including a high-side semiconductor chip having a high-side MOSFET and a low-side semiconductor chip having a low-side MOSFET are mounted on a wiring board.

Other problems and novel features will become apparent from descriptions of this specification and accompanying drawings.

Means for Solving the Problems

In an electronic device according to one embodiment, a plurality of semiconductor devices each including a high-side semiconductor chip having a high-side MOSFET and a low-side semiconductor chip having a low-side MOSFET are mounted on a wiring board. Each of the plurality of semiconductor devices has a low-side drain terminal that is electrically connected to a drain electrode of the low-side semiconductor chip incorporated therein. The wiring board has a first conductor pattern to which a power supply potential is supplied and a second conductor pattern that electrically connects the low-side drain terminal of each of the plurality of semiconductor devices to a plurality of output terminals. In the wiring board, a width of a current path in the first conductor pattern and a width of a current path in the second conductor pattern are made uniform.

Effects of the Invention

According to one embodiment, it is possible to improve the performance of the electronic device.

BRIEF DESCRIPTIONS OF THE DRAWINGS

FIG. 15 is a sectional view of the semiconductor device;

FIG. 16 is a sectional view of the semiconductor device;

DETAILED DESCRIPTION OF PREFERRED EMBODIMENTS

Figure 1:
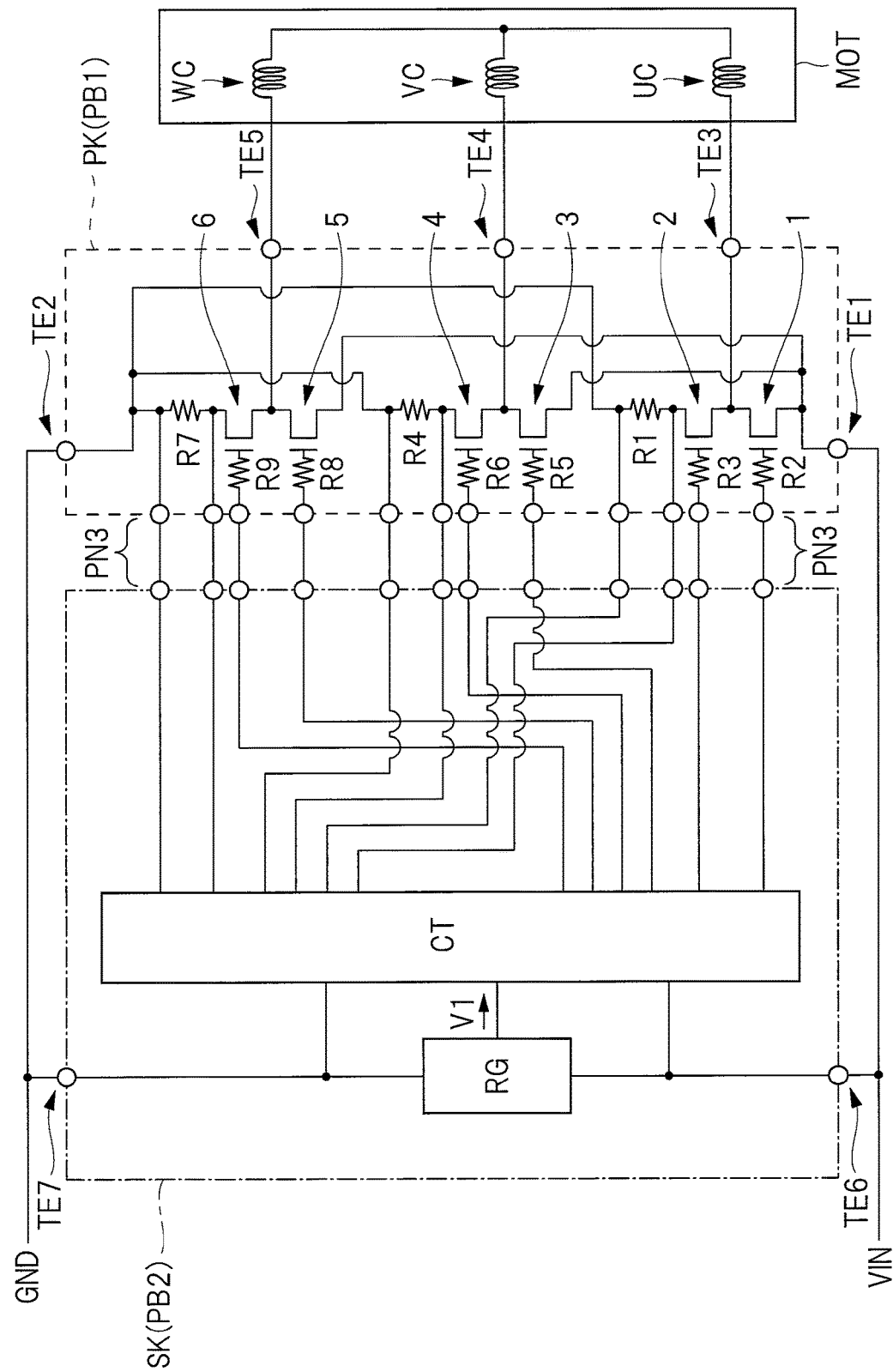
FIG. 1 is a circuit diagram showing a motor drive system using an electronic device according to one embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above. In particular, "circular shape" used in the specification is not limited to "perfectly circular shape" and includes a so-called "approximately circular shape other than perfectly circular shape".

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

Embodiment

<Circuit Configuration>

FIG. 1 is a circuit diagram showing a motor drive system using the electronic device according to the present embodiment.

The motor drive system shown in FIG. 1 includes a power system circuit constituting unit PK and a control system circuit constituting unit SK. The power system circuit constituting unit PK is constituted of a power wiring board PB1 and electronic components mounted thereon described later, and the control system circuit constituting unit SK is constituted of a control wiring board PB2 and electronic components mounted thereon described later.

In FIG. 1, a circuit configuration in a region surrounded by a dotted line corresponds to the power system circuit constituting unit PK, and a circuit configuration in a region surrounded by a dash-dotted line corresponds to the control system circuit constituting unit SK.

The control system circuit constituting unit SK includes a regulator RG and a control circuit unit CT. The power system circuit constituting unit PK includes power MOSFETs (Metal Oxide Semiconductor Field Effect Transistors) 1, 2, 3, 4, 5, and 6 and resistors R1, R2, R3, R4, R5, R6, R7, R8, and R9 that constitute an inverter circuit.

Note that, when referring to a MOSFET in the present application, the MOSFET includes not only a MOSFET using an oxide film as a gate insulating film but also a MOSFET using an insulating film other than an oxide film as a gate insulating film.

DC power supplied to the power system circuit constituting unit PK (inverter circuit) is converted into AC power by the power system circuit constituting unit PK (inverter circuit) and is supplied to a motor MOT. The motor MOT is driven by the AC power supplied from the power system circuit constituting unit PK. The power system circuit constituting unit PK is controlled by the control circuit unit CT of the control system circuit constituting unit SK.

First, the power system circuit constituting unit PK will be specifically described.

In the power system circuit constituting unit PK, the power MOSFET 1 and the power MOSFET 2 are connected in series between a terminal TE1 to which a power supply potential (power supply voltage) VIN is supplied and a terminal TE2 to which a ground potential (ground voltage, reference voltage) GND is supplied. The power MOSFET 1 corresponds to a high-side MOSFET, and the power MOSFET 2 corresponds to a low-side MOSFET. A drain of the power MOSFET 1 is connected to the terminal TE1 (power supply potential VIN), and a source of the power MOSFET 1 is connected to a drain of the power MOSFET 2. A source of the power MOSFET 2 is connected to the terminal TE2 (ground potential GND) through the resistor (shunt resistor) R1. A connection point between the power MOSFET 1 and the power MOSFET 2 is connected to a terminal TE3 connected to the motor MOT (more specifically, a U-phase coil UC of the motor MOT). A gate of the power MOSFET 1 is connected to a driving circuit in the control circuit unit CT through the resistor R2, and a gate of the power MOSFET 2 is connected to the driving circuit in the control circuit unit CT through the resistor R3.

Note that the terminal TE1 corresponds to a hole HP1 of the power wiring board PB1 described below or a power supply connection pin PN1 described below that is inserted through the hole HP1. The terminal TE2 corresponds to a hole HP2 of the power wiring board PB1 described below or a ground connection pin PN2 described below that is inserted through the hole HP2. The terminal TE3 corresponds to a hole HM1 of the power wiring board PB1 described below or a connection pin BB1 described below that is inserted through the hole HM1. A terminal TE4 corresponds to a hole HM2 of the power wiring board PB1 described below or a connection pin BB2 described below that is inserted through the hole HM2. Further, a terminal TE5 corresponds to a hole HM3 of the power wiring board PB1 described below or a connection pin BB3 described below inserted through the hole HM3.

Also, in the power system circuit constituting unit PK, the power MOSFET 3 and the power MOSFET 4 are connected in series between the terminal TE1 to which the power supply potential VIN is supplied and the terminal TE2 to which the ground potential GND is supplied. The power MOSFET 3 corresponds to the high-side MOSFET, and the power MOSFET 4 corresponds to the low-side MOSFET. A drain of the power MOSFET 3 is connected to the terminal TE1 (power supply potential VIN), a source of the power MOSFET 3 is connected to a drain of the power MOSFET 4, and a source of the power MOSFET 4 is connected to the terminal TE2 (ground potential GND) through the resistor (shunt resistor) R4. A connection point between the power MOSFET 3 and the power MOSFET 4 is connected to the terminal TE4 connected to the motor MOT (more specifically, a V-phase coil VC of the motor MOT). A gate of the power MOSFET 3 is connected to the driving circuit in the control circuit unit CT through the resistor R5, and a gate of the power MOSFET 4 is connected to the driving circuit in the control circuit unit CT through the resistor R6.

Further, in the power system circuit constituting unit PK, the power MOSFET 5 and the power MOSFET 6 are connected in series between the terminal TE1 to which the power supply potential VIN is supplied and the terminal TE2 to which the ground potential GND is supplied. The power MOSFET 5 corresponds to the high-side MOSFET, and the power MOSFET 6 corresponds to the low-side MOSFET. A drain of the power MOSFET 5 is connected to the terminal TE1 (power supply potential VIN), a source of the power MOSFET 5 is connected to a drain of the power MOSFET 6, and a source of the power MOSFET 6 is connected to the terminal TE2 (ground potential GND) through the resistor (shunt resistor) R7. A connection point between the power MOSFET 5 and the power MOSFET 6 is connected to the terminal TE5 connected to the motor MOT (more specifically, a W-phase coil WC of the motor MOT). A gate of the power MOSFET 5 is connected to the driving circuit in the control circuit unit CT through the resistor R8, and a gate of the power MOSFET 6 is connected to a driving circuit in the control circuit unit CT through the resistor R9.

The U-phase coil UC, the V-phase coil VC, and the W-phase coil WC of the motor MOT are respectively connected to the terminals TE3, TE4, TE5 of the power system circuit constituting unit PK, and the motor MOT is driven by the AC power supplied from the terminals TE3, TE4, TE5 of the power system circuit constituting unit PK.

In a pair of MOSFETs connected in series between the power supply potential VIN and the ground potential GND, the MOSFET on a side of the power supply potential VIN (that is, a high potential side) corresponds to the high-side MOSFET, and the MOSFET on a side of the ground potential GND (that is, a low potential side) corresponds to the low-side MOSFET. The high-side MOSFET is a field effect transistor for high-side switching, and the low-side MOSFET is a field effect transistor for low-side switching.

Next, the control system circuit constituting unit SK will be specifically described.

The power supply potential VIN and the ground potential GND are supplied also to the control system circuit constituting unit SK. Namely, the power supply potential VIN is supplied to a terminal TE6, and the ground potential GND is supplied to a terminal TE7. The terminal TE6 corresponds to a connection portion of a cable CB for supplying the power supply potential VIN in a power supply wiring of the control wiring board PB2 described below, and the terminal TE7 corresponds to a connection portion of a cable CB for supplying the ground potential GND in a ground wiring of the control wiring board PB2 described below.

The regulator RG is connected to the terminal TE6 to which the power supply potential VIN is supplied and the terminal TE7 to which the ground potential GND is supplied, the power supply potential VIN supplied to the terminal TE6 is input to the regulator RG and is converted (stepped down) by the regulator RG into a predetermined constant voltage (V1), and the constant voltage (V1) generated by the regulator RG is supplied to the control circuit unit CT. The constant voltage (V1) supplied from the regulator RG to the control circuit unit CT is used as an operating voltage of the control circuit unit CT. Further, the power supply potential VIN supplied to the terminal TE6 and the ground potential GND supplied to the terminal TE7 are also supplied to the control circuit unit CT.

The control circuit unit CT includes a circuit for controlling (driving) the power MOSFETs 1, 2, 3, 4, 5, and 6. The driving circuit in the control circuit unit CT supplies a gate signal (gate voltage) to a gate of each of the power MOSFETs 1, 2, 3, 4, 5, and 6. It is possible to control on/off of each of the power MOSFETs 1, 2, 3, 4, 5, and 6 by the gate signal supplied from the control circuit unit CT to the gate of each of the power MOSFETs 1, 2, 3, 4, 5, and 6. Thus, the control circuit unit CT can control the power system circuit constituting unit PK.

The resistor R1 is interposed between the source of the power MOSFET 2 and the terminal TE2 (ground potential GND), the resistor R4 is interposed between the source of the power MOSFET 4 and the terminal TE2 (ground potential GND), and the resistor R7 is interposed between the source of the power MOSFET 6 and the terminal TE2 (ground potential GND). Both ends of each of the resistors R1, R4, and R7 are connected to a detection circuit in the control circuit unit CT. By detecting a voltage applied to the resistors R1, R4, and R7 by the control circuit unit CT, it is possible to detect a current flowing through each of the U-phase coil, the V-phase coil and the W-phase coil of the motor MOT.

For example, the control circuit unit CT detects the current flowing through each of the resistors R1, R4, and R7, and controls the power MOSFETs 1, 2, 3, 4, 5, and 6 by using the detected current such that power supplied from the power system circuit constituting unit PK to the motor MOT has a desired waveform.

As described above, in the motor drive system shown in FIG. 1, by controlling the power system circuit constituting unit PK (inverter circuit) by the control circuit unit CT of the control system circuit constituting unit SK, DC power that is supplied to the power system circuit constituting unit PK through the terminals TE1 and TE2 can be converted into AC power, and the motor MOT can be driven by supplying the AC power to the motor MOT through the terminals TE3, TE4, and TE5.

<Overall Configuration>

Figure 2:
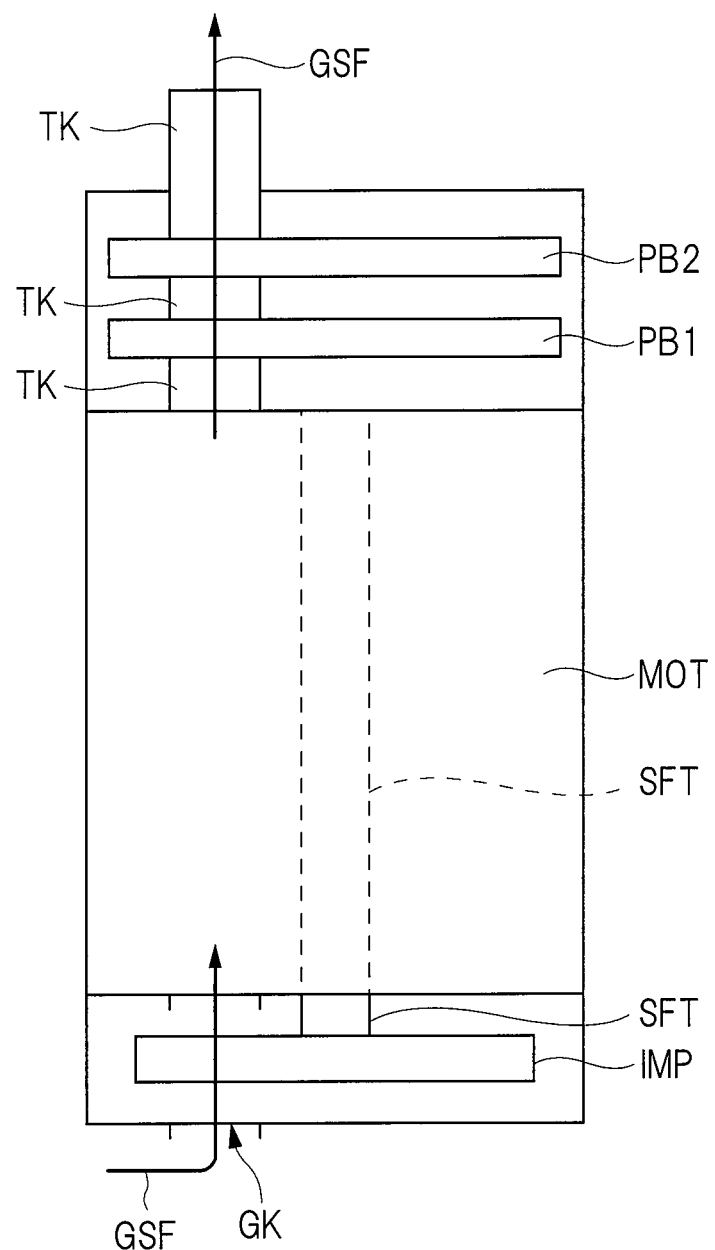
FIG. 2 is a schematic diagram (side view) showing an entire motor drive system using the electronic device according to one embodiment.
Figure 3:
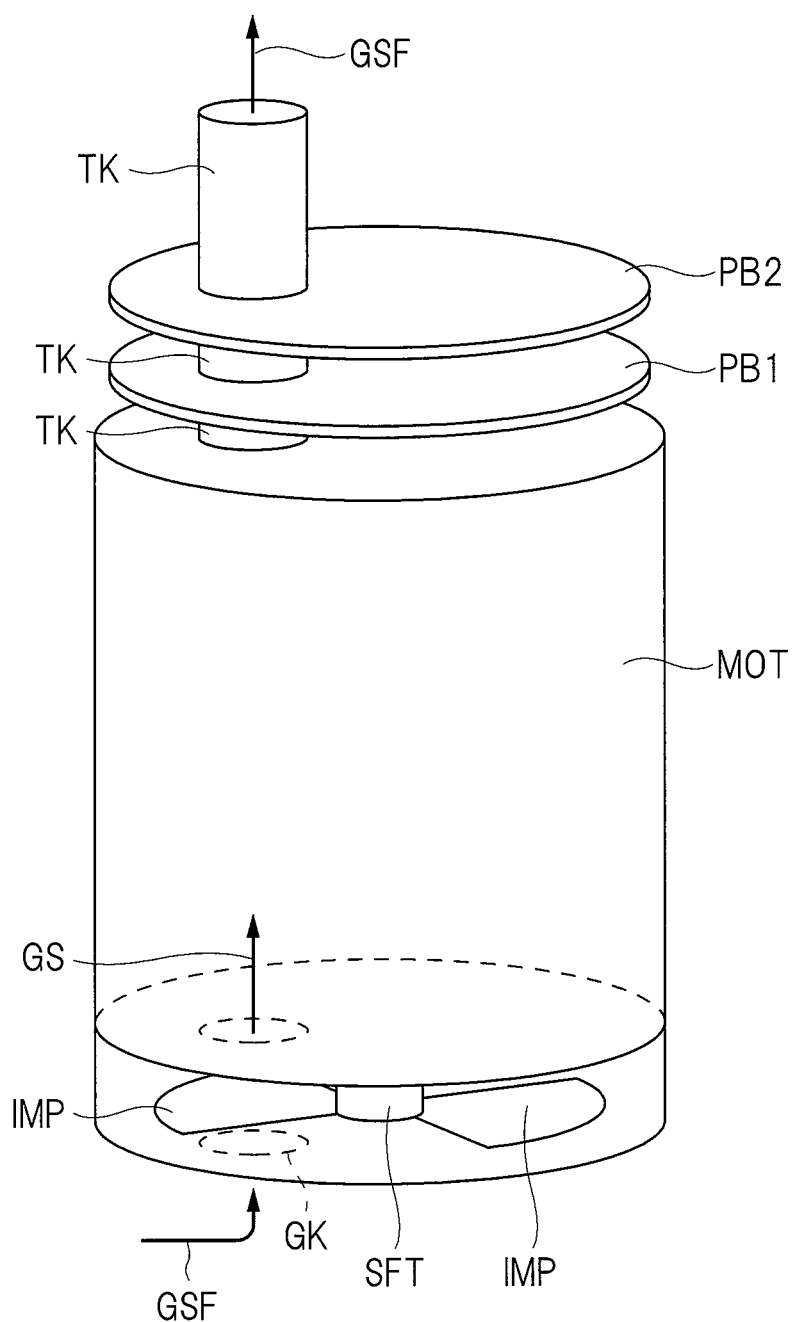
FIG. 3 is a schematic diagram (perspective view) showing the entire motor drive system using the electronic device according to one embodiment.

FIGS. 2 and 3 are schematic diagrams showing the entire motor drive system using the electronic device according to the present embodiment. A side view is shown in FIG. 2 and a perspective view is shown in FIG. 3. Note that illustration of a member that covers a lamination of the power wiring board PB1 and the control wiring board PB2 is omitted in FIG. 3. Although both of the power wiring board PB1 and the control wiring board PB2 are wiring boards, the power wiring board PB1 is a wiring board for forming the above-described power system circuit constituting unit PK, and the control wiring board PB2 is a wiring board for forming the above-described control system circuit constituting unit SK.

In the motor drive system shown in FIGS. 2 and 3, the power wiring board PB1 and the control wiring board PB2 are attached to the motor MOT. More specifically, the power wiring board PB1 and the control wiring board PB2 are attached above an upper part (upper surface) of the motor MOT such that the power wiring board PB1 and the control wiring board PB2 are stacked in order from the bottom.

The motor MOT is, for example, a motor for a fuel pump (corresponding to a fuel pump PM described below), and has an impeller IMP that rotates with a shaft SFT. As described above, the power system circuit constituting unit PK is constituted of the power wiring board PB1 and the electronic components (not shown in FIGS. 2 and 3) mounted thereon, and the control system circuit constituting unit SK is constituted of the control wiring board PB2 and the electronic components (not shown in FIGS. 2 and 3) mounted thereon. The shaft SFT of the motor MOT is rotated by the AC power supplied from the power system circuit constituting unit PK, and thus the impeller IMP fixed to the shaft SFT of the motor MOT is rotated.

Since the power wiring board PB1 and the control wiring board PB2 are attached above the upper part of the motor MOT so as to be stacked, it is desirable that a planar size of each of the power wiring board PB1 and the control wiring board PB2 is equal to or smaller than a planar size of the motor MOT. However, since a planar shape of the motor MOT is circular, it is more preferable that the planar shape of each of the power wiring board PB1 and the control wiring board PB2 is also circular with the same planar size (diameter or area) as that of the motor MOT because a space can be effectively used without causing waste in a mounting space.

In addition, a discharge port (pipe, piping) TK for discharging fuel that has been sucked up by the rotation of the impeller IMP is provided in the upper surface of the motor MOT. The discharge port TK is a tubular member configured to allow the fuel to pass therethrough. A through hole through which the discharge port TK penetrates is provided in each of the power wiring board PB1 and the control wiring board PB2. Therefore, the discharge port TK protrudes above the motor MOT from the upper surface of the motor MOT through each of the through holes of the power wiring board PB1 and the control wiring board PB2. The through hole (corresponding to a hole HT1 described below) through which the discharge port TK passes in the power wiring board PB1 and the through hole (corresponding to a hole HT2 described below) through which the discharge port TK passes in the control wiring board PB2 are overlapped with each other in a plan view.

In FIGS. 2 and 3, a flow GSF of the fuel that has been sucked up by the rotation of the impeller IMP is schematically indicated with arrows. As indicated with the arrows (GSF) in FIGS. 2 and 3, the fuel that has been sucked up by the rotation of the impeller IMP passes through a space through which the fuel can pass within the motor MOT, flows from inside of the motor MOT to the discharge port TK, and is sent to the outside of the motor MOT through the discharge port TK. A fuel pipe (not shown) or the like is connected to the discharge port TK, and the fuel that has been sucked up by the rotation of the impeller IMP is sent from the motor MOT through the discharge port TK and the fuel pipe to an engine ENG described below.

Figure 4:
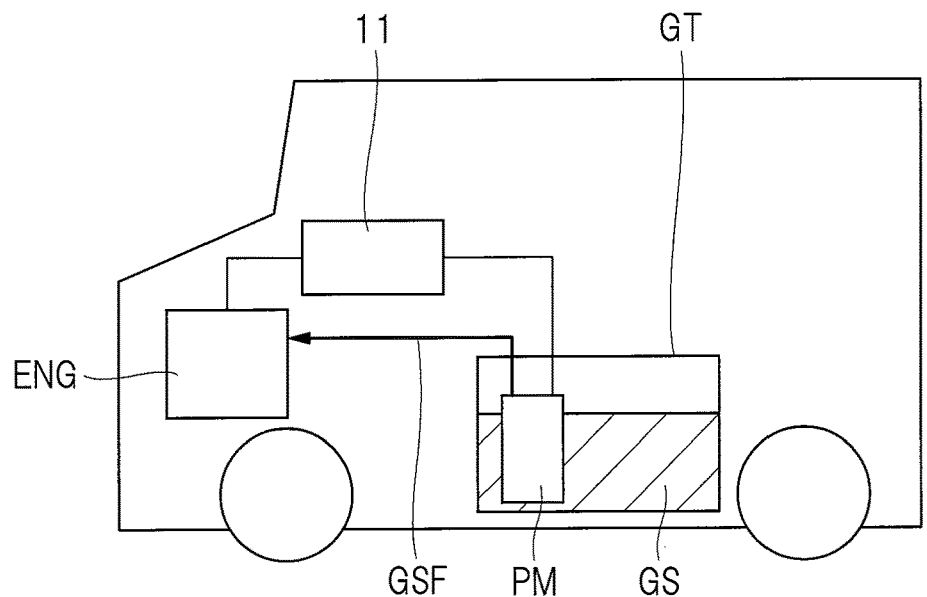
FIG. 4 is an explanatory diagram showing a control system of a vehicle.
Figure 5:
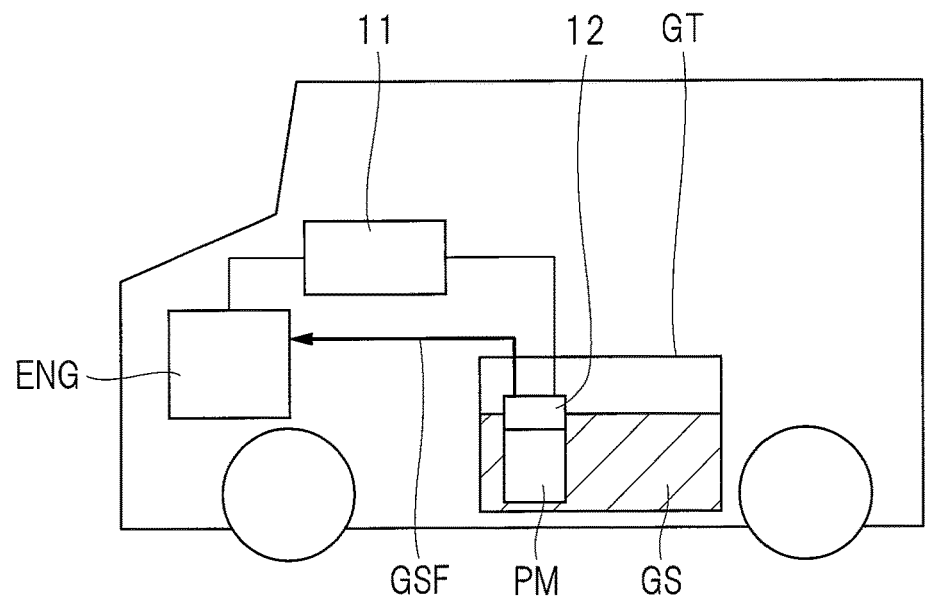
FIG. 5 is an explanatory diagram showing a control system of the vehicle.

FIGS. 4 and 5 are explanatory diagrams showing a control system of a vehicle. Note that FIG. 5 corresponds to a case where the motor drive system of FIGS. 1 to 3 is applied to the fuel pump PM. Further, hatching is given to fuel GS stored in a fuel tank GT so as to make the drawings easy to see.

In the control system of the vehicle shown in FIGS. 4 and 5, the fuel GS stored in the fuel tank GT is sucked up by the fuel pump PM and is supplied to the engine ENG. In FIGS. 4 and 5, the flow GSF of the fuel GS sent from the fuel pump PM to the engine ENG through the fuel pipe and the like is schematically indicated with an arrow. The engine ENG is controlled by an ECU (Electronic Control Unit) 11 for controlling the engine.

In the case of FIG. 4, the ECU 11 for controlling the engine controls also the fuel pump PM. Namely, the ECU 11 for controlling the engine supplies electric power for driving a motor to the fuel pump PM, and thus the motor of the fuel pump PM is driven. Then, the ECU 11 for controlling the engine controls the motor of the fuel pump PM by controlling the electric power for driving the motor to be supplied to the fuel pump PM, thereby controlling the amount of the fuel GS supplied from the fuel tank GT to the engine ENG by the fuel pump PM.

In the case of FIG. 5, an ECU 12 for controlling the fuel pump attached to the fuel pump PM controls the fuel pump PM. Namely, the ECU 12 for controlling the fuel pump supplies the electric power for driving the motor to the fuel pump PM, thereby driving the motor of the fuel pump PM. Then, the ECU 12 for controlling the fuel pump controls the motor of the fuel pump PM by controlling the electric power for driving the motor to be supplied to the fuel pump PM, thereby controlling the amount of the fuel GS supplied from the fuel tank GT to the engine ENG by the fuel pump PM. Between the ECU 11 for controlling the engine and the ECU 12 for controlling the fuel pump, a command signal (control signal) from the ECU 11 for controlling the engine to the ECU 12 for controlling the fuel pump and a feedback signal from the ECU 12 for controlling the fuel pump to the ECU 11 for controlling the engine are transmitted as necessary.

Namely, in the case of FIG. 4, the ECU 11 for controlling the engine serves also as an equivalent of the ECU 12 for controlling the fuel pump, and the equivalent of the ECU 12 for controlling the fuel pump is not attached to the fuel pump PM. On the other hand, in the case of FIG. 5, the ECU 12 for controlling the fuel pump is separated from the ECU 11 for controlling the engine and is attached to the fuel pump PM.

In the case of FIG. 4, the ECU 11 for controlling the engine serves also as the equivalent of the ECU 12 for controlling the fuel pump, and the electric power for driving the motor is supplied to the fuel pump PM from the ECU 11 for controlling the engine which is located relatively far from the fuel pump PM. Therefore, a power loss is large. In addition, it causes a weight increase due to the wiring disposed in the vehicle and accompanying deterioration of fuel efficiency and an increase of a required space.

On the other hand, in the case of FIG. 5, the ECU 12 for controlling the fuel pump is attached to the fuel pump PM, and the ECU 12 for controlling the fuel pump is in proximity to the fuel pump PM. Since the electric power for driving the motor is supplied from the ECU 12 for controlling the fuel pump attached to the fuel pump PM to the fuel pump PM, it is possible to suppress the power loss. In addition, it is also possible to reduce the weight increase due to the wiring disposed in the vehicle and to reduce the required space.

Note that the ECU 12 for controlling the fuel pump and the fuel pump PM in FIG. 5 correspond to the motor drive system shown in FIGS. 1 to 3. Namely, the motor MOT shown in FIGS. 1 to 3 corresponds to the motor of the fuel pump PM. Also, a circuit configuration of the ECU 12 for controlling the fuel pump corresponds to a circuit configuration other than the motor MOT (the power system circuit constituting unit PK and the control system circuit constituting unit SK) of the circuit configuration shown in the above drawings. Therefore, the ECU 12 for controlling the fuel pump is constituted of the power wiring board PB1 and the electronic components (not shown in FIGS. 2 and 3) mounted thereon and the control wiring board PB2 and the electronic components (not shown in FIGS. 2 and 3) mounted thereon in FIGS. 2 and 3.

<Configuration of Electronic Device>

Figure 6:
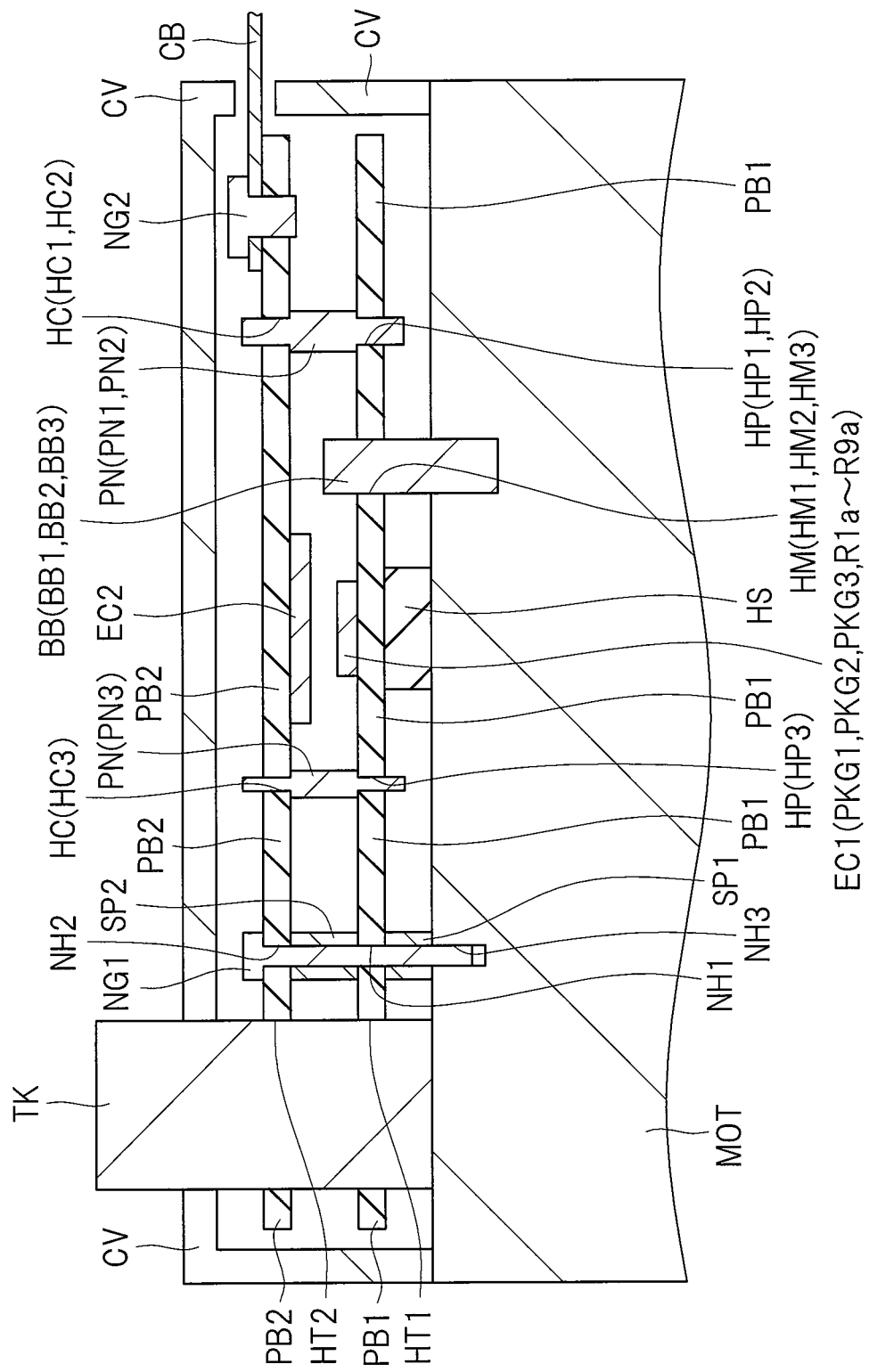
FIG. 6 is an explanatory diagram showing the electronic device according to one embodiment attached to a motor.
Figure 7:
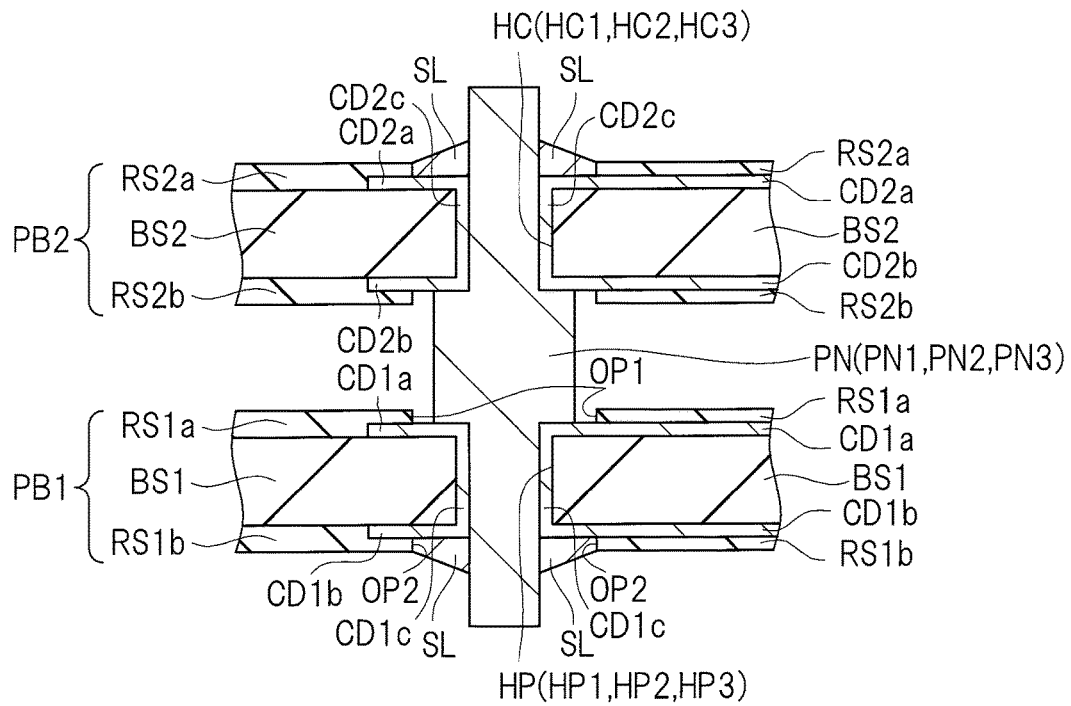
FIG. 7 is an enlarged partial sectional view showing a part of FIG. 6 in an enlarged manner.
Figure 8:
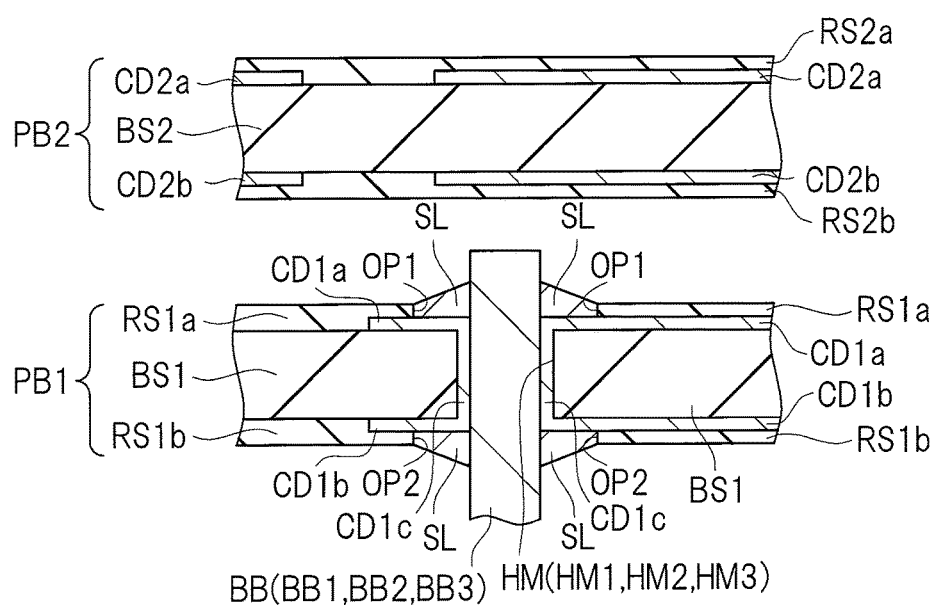
FIG. 8 is an enlarged partial sectional view showing a part of FIG. 6 in an enlarged manner.

FIG. 6 is an explanatory diagram showing the electronic device according to the present embodiment attached to the motor MOT. Although FIG. 6 corresponds to a sectional view, illustration of an internal sectional structure of the motor MOT is omitted. Also, FIGS. 7 and 8 are enlarged partial sectional views showing a part of FIG. 6 in an enlarged manner. Specifically, FIG. 7 shows a structure that connects the power wiring board PB1 and the control wiring board PB2 to a connection pin PN (PN1, PN2, and PN3), and FIG. 8 shows a structure that connects the power wiring board PB1 to a connection pin BB (BB1, BB2, and BB3).

Although described above with reference to FIGS. 2 and 3, the power wiring board PB1 and the control wiring board PB2 are attached above the upper surface (upper part) of the motor MOT so as to be stacked in order from the bottom as shown in FIG. 6. As shown in FIG. 6, the power wiring board PB1 and the control wiring board PB2 are attached and fixed to the motor MOT by, for example, a screw (fixing screw) NG1, and a predetermined gap is interposed between the motor MOT and the power wiring board PB1 and between the power wiring board PB1 and the control wiring board PB2.

Specifically, as shown in FIG. 6, a hole (through hole) NH2 through which the screw NG1 is inserted is formed in the control wiring board PB2, and a hole (through hole) NH1 through which the screw NG1 is inserted is formed in the power wiring board PB1. A screw hole NH3 for screwing the screw NG1 is formed in the upper part of the motor MOT. Note that the hole NH2 in the control wiring board PB2, the hole NH1 in the power wiring board PB1, and the screw hole NH3 in the motor MOT are overlapped with each other in a plan view. Then, the screw NG1 is inserted through the hole NH2 of the control wiring board PB2, a spacer SP2 disposed between the control wiring board PB2 and the power wiring board PB1, the hole NH1 of the power wiring board PB1, and a spacer SP1 disposed between the power wiring board PB1 and the upper surface of the motor MOT, and the screw NG1 is screwed into the screw hole NH3 of the motor MOT. The spacer SP1 secures a predetermined interval between the motor MOT and the power wiring board PB1, and the spacer SP2 secures a predetermined interval between the power wiring board PB1 and the control wiring board PB2. Further, the control wiring board PB2 and the power wiring board PB1 are attached and fixed to the upper surface (upper part) of the motor MOT by the screw NG1. Although only one screw NG1 is shown as a representative in FIG. 6, three screws NG1 are used for fixing the control wiring board PB2 and the power wiring board PB1 to the motor MOT as described below.

In addition, as shown in FIG. 6, it is also possible to provide a protective cover member (case, housing) CV so as to cover the power wiring board PB1 and the control wiring board PB2 attached to the upper part of the motor MOT. The cover member CV is fixed to the motor MOT. The cover member CV may be a separate member from the motor MOT or may be an integral member with the motor MOT.

Further, (wiring of) the power wiring board PB1 and (wiring of) the control wiring board PB2 are electrically connected by a plurality of connection pins PN. The connection pins PN that electrically connect (the wiring of) the power wiring board PB1 to (the wiring of) the control wiring board PB2 include the power supply connection pin PN1, the ground connection pin PN2, and a signal pin PN3. In FIG. 6, two connection pins PN are representatively shown, and one of the two connection pins PN is the signal pin PN3 and the other thereof is the power supply connection pin PN1 or the ground connection pin PN2.

Here, a structure in which (the wiring of) the power wiring board PB1 and (the wiring of) the control wiring board PB2 are electrically connected through the connection pin PN will be described with reference to FIG. 7.

A plurality of holes (through holes) HC through which the connection pins PN are respectively inserted are formed in the control wiring board PB2, and a plurality of holes (through holes) HP through which the connection pins PN are respectively inserted are formed in the power wiring board PB1. However, a pair of the holes HC and HP and one connection pin PN inserted therethrough are shown as a representative in FIG. 7. In practice, as shown in FIG. 6, a diameter of the signal pin PN3 is smaller than a diameter of each of the power supply connection pin PN1 and the ground connection pin PN2.

The hole HC of the control wiring board PB2 and the hole HP of the power wiring board PB1 are overlapped with each other in a plan view. As shown in FIG. 7, one end side of each of the connection pins PN is inserted through the hole HC of the control wiring board PB2, and the other end side of each of the connection pins PN is inserted through the hole HP of the power wiring board PB1. Each of the connection pins PN is made of a conductor and is preferably made of a metal material.

A part of each of the connection pins PN located in the hole HC of the control wiring board PB2 has a diameter slightly smaller than a diameter of the hole HC, and a part thereof located in the hole HP of the power wiring board PB1 has a diameter slightly smaller than a diameter of the hole HP. On the other hand, a part of each of the connection pins PN located outside the holes HC and HP and located between the power wiring board PB1 and the control wiring board PB2 may have a diameter larger than each of the diameters of the holes HP and HC, whereby it is also possible to determine a height position of the power wiring board PB1 and the control wiring board PB2 relative to each of the connection pins PN.

The control wiring board PB2 and the power wiring board PB1 are, for example, resin substrates. The control wiring board PB2 includes an insulating base material layer BS2, a wiring pattern (conductive film CD2a) formed on an upper surface of the base material layer BS2, a wiring pattern (conductive film CD2b) formed on a lower surface of the base material layer BS2, a resist layer RS2a formed on the upper surface of the base material layer BS2 so as to cover the wiring pattern, and a resist layer RS2b formed on the lower surface of the base material layer BS2 so as to cover the wiring pattern. Also, the power wiring board PB1 includes an insulating base material layer BS1, a wiring pattern (conductive film CD1a) formed on an upper surface of the base material layer BS1, a wiring pattern (conductive film CD1b) formed on a lower surface of the base material layer BS1, a resist layer RS1a formed on the upper surface of the base material layer BS1 so as to cover the wiring pattern, and a resist layer RS1b formed on the lower surface of the base material layer BS1 so as to cover the wiring pattern. The base material layers BS1 and BS2 are formed of, for example, an insulating material (insulating layer) such as glass epoxy resin. The wiring pattern on an upper surface of the control wiring board PB2 is formed of the conductive film CD2a, and the wiring pattern on a lower surface of the control wiring board PB2 is formed of the conductive film CD2b. The wiring pattern on an upper surface of the power wiring board PB1 is formed of the conductive film CD1a, and the wiring pattern on a lower surface of the power wiring board PB1 is formed of the conductive film CD1b. Each of the resist layers RS1a, RS1b, RS2a, and RS2b is made of an insulating material (insulating layer) and is, for example, a solder resist layer. Each of the resist layers RS1a, RS1b, RS2a, and RS2b can be regarded also as a protective film.

A conductive film CD2c is formed on a side surface (inner wall) of the hole HC in the control wiring board PB2, and a conductive film CD1c is formed on a side surface (inner wall) of the hole HP in the power wiring board PB1. The conductive film CD2c on the side surface of the hole HC of the control wiring board PB2 is electrically connected to the connection pin PN inserted through the hole HC, and the conductive film CD1c on the side surface of the hole HP of the power wiring board PB1 is electrically connected to the connection pin PN inserted through the hole HP. For example, a conductive bonding material such as solder SL is interposed between the conductive film CD2c on the side surface of the hole HC of the control wiring board PB2 and the connection pin PN, so that they are electrically connected through the conductive bonding material. Also, a conductive bonding material such as solder SL is interposed between the conductive film CD1c on the side surface of the hole HP of the power wiring board PB1 and the connection pin PN, so that they are electrically connected through the conductive bonding material. Alternatively, the conductive film CD2c on the side surface of the hole HC of the control wiring board PB2 may be electrically connected to the connection pin PN by being in contact with each other, and the conductive film CD1c on the side surface of the hole HP of the power wiring board PB1 may be electrically connected to the connection pin PN by being in contact with each other.

Accordingly, the conductive film CD2c on the side surface of the hole HC of the control wiring board PB2 is electrically connected to the conductive film CD1c on the side surface of the hole HP of the power wiring board PB1 through the connection pin PN inserted through the holes HP and HC. Note that it is also possible to fix the connection pins PN to the control wiring board PB2 and the power wiring board PB1 by using a conductive bonding material such as the solder SL.

The conductive film CD1c on the side surface of the hole HP of the power wiring board PB1 is electrically connected to the conductive film CD1a formed around the hole HP on the upper surface of the power wiring board PB1 and is electrically connected to the conductive film CD1b formed around the hole HP on the lower surface of the power wiring board PB1. Further, the conductive film CD2c on the side surface of the hole HC of the control wiring board PB2 is electrically connected to the conductive film CD2a formed around the hole HC on the upper surface of the control wiring board PB2 and is electrically connected to the conductive film CD2b formed around the hole HC on the lower surface of the control wiring board PB2. Thus, in FIG. 7, it is possible to electrically connect the conductive films CD1a, CD1b, and CD1c of the power wiring board PB1 and the conductive films CD2a, CD2b, and CD2c of the control wiring board PB2 through the connection pins PN.

Namely, in order to electrically connect the wiring pattern (corresponding to the conductive film CD2a or the conductive film CD2b) formed on the upper surface or the lower surface of the control wiring board PB2 to the connection pin PN, a part of the wiring pattern is provided around the hole HC, the conductive film CD2c which is electrically connected to the wiring pattern is formed on the side surface of the hole HC, and the connection pin PN is inserted through the hole HC. Then, as necessary, the connection pin PN is bonded to the control wiring board PB2 with a conductive bonding material such as the solder SL. In this manner, it is possible to electrically connect the wiring pattern famed on the upper surface or the lower surface of the control wiring board PB2 to the connection pin PN.

Also, in order to electrically connect the wiring pattern (corresponding to the conductive film CD1a or the conductive film CD1b) formed on the upper surface or the lower surface of the power wiring board PB1 to the connection pin PN, a part of the wiring pattern is provided around the hole HP, the conductive film CD1c which is electrically connected to the wiring pattern is formed on the side surface of the hole HP, and the connection pin PN is inserted through the hole HP. Then, as necessary, the connection pin PN is bonded to the power wiring board PB1 with a conductive bonding material such as the solder SL. In this manner, it is possible to electrically connect the wiring pattern famed on the upper surface or the lower surface of the power wiring board PB1 to the connection pin PN.

Also, in the control wiring board PB2, the resist layers RS2a and RS2b may have opening portions that enclose the hole HC in a plan view. In this case, it is also possible to electrically connect one or both of the conductive films CD2a and CD2b exposed from the opening portions of the resist layers RS2a and RS2b around the hole HC of the control wiring board PB2 to the connection pin PN through a conductive bonding material such as the solder SL. Further, in the power wiring board PB1, the resist layers RS1a and RS1b may have opening portions OP1 and OP2 that enclose the hole HP in a plan view. Here, the opening portion OP1 is an opening portion of the resist layer RS1a on the upper surface of the power wiring board PB1, and the opening portion OP2 is an opening portion of the resist layer RS1b on the lower surface of the power wiring board PB1. In this case, it is also possible to electrically connect one or both of the conductive films CD1a and CD1b exposed from the opening portions OP1 and OP2 of the resist layers RS1a and RS1b around the hole HP of the power wiring board PB1 to the connection pin PN through a conductive bonding material such as the solder SL.

In this manner, it is possible to electrically connect the wiring pattern (the conductive film CD2a or the conductive film CD2b) famed on the upper surface or the lower surface of the control wiring board PB2 to the wiring pattern (the conductive film CD1a or the conductive film CD1b) formed on the upper surface or the lower surface of the power wiring board PB1 through the connection pin PN.

Next, a method for supplying the power supply potential VIN and the ground potential GND to the power wiring board PB1 and the control wiring board PB2 will be described with reference to FIG. 6.

The power supply potential VIN and the ground potential GND are supplied to both of the power wiring board PB1 and the control wiring board PB2. In the case of FIG. 6, the power supply potential VIN and the ground potential GND are supplied from a battery (not shown) and the like to the control wiring board PB2 through respective cables CB, and the power supply potential VIN and the ground potential GND that have been supplied to the control wiring board PB2 are supplied to the power wiring board PB1 through the power supply connection pin PN1 and the ground connection pin PN2, respectively. The power supply connection pin PN1 is the connection pin PN used for supplying the power supply potential VIN from the control wiring board PB2 to the power wiring board PB1. Also, the ground connection pin PN2 is the connection pin PN used for supplying the ground potential GND from the control wiring board PB2 to the power wiring board PB1.

Although only one cable CB is shown in FIG. 6 for the sake of simplicity, there are two cables CB in practice, and one of them is the cable CB for supplying the power supply potential VIN and the other is the cable CB for supplying the ground potential GND. The cable CB for supplying the power supply potential VIN and the cable CB for supplying the ground potential GND are not electrically connected with each other and are separate members. Further, although the power supply connection pin PN1 and the ground connection pin PN2 are represented by one connection pin PN in FIG. 6 for the sake of simplicity, there are one power supply connection pin PN1 and one ground connection pin PN2 in practice, and the power supply connection pin PN1 and the ground connection pin PN2 are not electrically connected with each other and are separate members.

More specifically, as shown in FIG. 6, the cable CB for supplying the power supply potential VIN is fixed to the control wiring board PB2 with a screw NG2 and the like, whereby the cable CB for supplying the power supply potential VIN is electrically connected to the power supply wiring of the control wiring board PB2. Accordingly, the power supply potential VIN is supplied from the cable CB for supplying the power supply potential VIN to the power supply wiring of the control wiring board PB2. Also, the cable CB for supplying the ground potential GND is fixed to the control wiring board PB2 with the screw NG2 and the like, whereby the cable CB for supplying the ground potential GND is electrically connected to the ground wiring of the control wiring board PB2. Accordingly, the ground potential GND is supplied from the cable CB for supplying the ground potential GND to the ground wiring of the control wiring board PB2.

Further, the power supply wiring of the control wiring board PB2 is electrically connected to the power supply wiring (corresponding to power supply wirings WV1 and WV2 described below) of the power wiring board PB1 through the power supply connection pin PN1. More specifically, the control wiring board PB2 has a hole (through hole) HC1 through which the power supply connection pin PN1 is inserted, and the power wiring board PB1 has a hole (through hole) HP1 through which the power supply connection pin PN1 is inserted. Further, the power supply wiring of the control wiring board PB2 and the power supply wiring of the power wiring board PB1 are electrically connected by the power supply connection pins PN1 inserted through the hole HC1 of the control wiring board PB2 and the hole HP1 of the power wiring board PB1. When applied to FIG. 7, the connection pin PN in FIG. 7 corresponds to the power supply connection pin PN1, the hole HC in FIG. 7 corresponds to the hole HCl, and the hole HP in FIG. 7 corresponds to the hole HP1. Also, the conductive films CD2*a* and CD2*b* in FIG. 7 correspond to the power supply wiring of the control wiring board PB2, and the conductive films CD1*a* and CD1*b* in FIG. 7 correspond to the power supply wiring (power supply wirings WV1 and WV2 described below) of the power wiring board PB1.

In addition, the ground wiring of the control wiring board PB2 is electrically connected to a ground wiring (corresponding to ground wirings WG1 and WG2 described below) of the power wiring board PB1 through the ground connection pin PN2. Namely, the control wiring board PB2 has a hole (through hole) HC2 through which the ground connection pin PN2 is inserted, and the power wiring board PB1 has a hole (through hole) HP2 through which the ground connection pin PN2 is inserted. Then, the ground wiring of the control wiring board PB2 and the ground wiring of the power wiring board PB1 are electrically connected by the ground connection pins PN2 inserted through the hole HC2 of the control wiring board PB2 and the hole HP2 of the power wiring board PB1. When applied to FIG. 7, the connection pin PN in FIG. 7 corresponds to the ground connection pin PN2, the hole HC in FIG. 7 corresponds to the hole HC2, and the hole HP in FIG. 7 corresponds to the hole HP2. Also, the conductive films CD2*a* and CD2*b* in FIG. 7 correspond to the ground wiring of the control wiring board PB2, and the conductive films CD1*a* and CD1*b* in FIG. 7 correspond to the ground wiring (ground wirings WG1 and WG2 described below) of the power wiring board PB1.

Accordingly, the power supply potential VIN that has been supplied to the power supply wiring of the control wiring board PB2 through the cable CB for supplying the power supply potential VIN is supplied to the power supply wiring (power supply wirings WV1 and WV2 described below) of the power wiring board PB1 through the power supply connection pin PN1. Namely, the power supply potential VIN is supplied from the power supply connection pin PN1 to the power supply wiring (power supply wirings WV1 and WV2 described below) of the power wiring board PB1. Also, the ground potential GND that has been supplied to the ground wiring of the control wiring board PB2 through the cable CB for supplying the ground potential GND is supplied to the ground wiring (ground wirings WG1 and WG2 described below) of the power wiring board PB1 through the ground connection pin PN2. Namely, the ground potential GND is supplied from the ground connection pin PN2 to the ground wiring (ground wirings WG1 and WG2 described below) of the power wiring board PB1.

Next, connection between (signal wiring of) the power wiring board PB1 and (signal wiring of) the control wiring board PB2 through the signal pin PN3 will be described.

(The signal wiring of) the power wiring board PB1 is electrically connected to (the signal wiring of) the control wiring board PB2 through a plurality of signal pins PN3. The signal pins PN3 are connection pins used for electrically connecting the power system circuit constituting unit PK to the control circuit unit CT (see FIG. 1). Signals and others can be transmitted between the control circuit unit CT and the power system circuit constituting unit PK through the signal pins PN3.

More specifically, the control wiring board PB2 has a hole (through hole) HC3 through which the signal pin PN3 is inserted, and the power wiring board PB1 has a hole (through hole) HP3 through which the signal pin PN3 is inserted. Then, the signal wiring of the control wiring board PB2 and the signal wiring of the power wiring board PB1 are electrically connected by the signal pin PN3 inserted through the hole HC3 of the control wiring board PB2 and the hole HP3 of the power wiring board PB1. When applied to FIG. 7, the connection pin PN in FIG. 7 corresponds to the signal pin PN3, the hole HC in FIG. 7 corresponds to the hole HC3, and the hole HP in FIG. 7 corresponds to the hole HP3. Also, the conductive films CD2*a* and CD2*b* in FIG. 7 correspond to the signal wiring of the control wiring board PB2, and the conductive films CD1*a* and CD1*b* in FIG. 7 correspond to the signal wiring of the power wiring board PB1. Note that the signal wiring of the control wiring board PB2 and the signal wiring of the power wiring board PB1 are wirings for connecting the power system circuit constituting unit PK to the control circuit unit CT.

A plurality of signal pins PN3 are provided. More specifically, the signal pins PN3 include two signal pins PN3 connected to both ends of the resistor R1, two signal pins PN3 connected to both ends of the resistor R4, and two signal pins PN3 connected to both ends of the resistor R7. The signal pins PN3 further include the signal pin PN3 electrically connected to the gate of the power MOSFET 1 through the resistor R2, the signal pins PN3 electrically connected to the gate of the power MOSFET 2 through the resistor R3, and the signal pins PN3 electrically connected to the gate of the power MOSFET 3 through the resistor R5. The signal pins PN3 further include the signal pin PN3 electrically connected to the gate of the power MOSFET 4 through the resistor R6, the signal pin PN3 electrically connected to the gate of the power MOSFET 5 through the resistor R8, and the signal pin PN3 electrically connected to the gate of the power MOSFET 6 through the resistor R9. In addition, the signal pins PN3 may further include six signal pins PN3 connected to each of the sources of the power MOSFETs 1, 2, 3, 4, 5, and 6.

Therefore, each of the gates of the power MOSFETs 1, 2, 3, 4, 5, and 6 is electrically connected to the signal pin PN3 through the signal wiring of the power wiring board PB1 and a resistor element (resistor element corresponding to any of the above-described resistors R2, R3, R5, R6, R8, and R9) and is further electrically connected to an electronic component constituting the control circuit unit CT through the signal pin PN3 and the signal wiring of the control wiring board PB2. Also, both ends of each of the resistors R1, R4, and R7 are electrically connected to the signal pin PN3 through the signal wiring of the power wiring board PB1 and are further electrically connected to the electronic component constituting the control circuit unit CT through the signal pin PN3 and the signal wiring of the control wiring board PB2. In addition, each of the sources of the power MOSFETs 1, 2, 3, 4, 5, and 6 is electrically connected to the signal pin PN3 through the signal wiring of the power wiring board PB1 and is further electrically connected to the electronic component constituting the control circuit unit CT through the signal pin PN3 and the signal wiring of the control wiring board PB2. The electronic component constituting the control circuit unit CT is an electronic component mounted on the control wiring board PB2, and is, for example, a semiconductor device (semiconductor package) incorporating a semiconductor chip.

Next, connection between the power wiring board PB1 and the motor MOT through the connection pin BB (BB1, BB2, and BB3) will be described with reference to FIG. 6.

(The wiring of) the power wiring board PB1 and the motor MOT are electrically connected through the connection pin BB (BB1, BB2, and BB3). The connection pins (bus bar) BB that electrically connect (the wiring of) the power wiring board PB1 and the motor MOT include the connection pin BB1, the connection pin BB2, and the connection pin BB3. However, one connection pin BB is shown as a representative in FIGS. 6 and 8. The connection pin BB1, the connection pin BB2, and the connection pin BB3 are not electrically connected with each other and are separate members. Also, holes (through holes) HM1, HM2, and HM3 through which the connection pins BB1, BB2, and BB3 are inserted are formed in the power wiring board PB1. However, one hole HM representing the holes HM1, HM2, and HM3 and one connection pin BB inserted therethrough are shown in FIGS. 6 and 8. In FIGS. 6 and 8, the connection pin BB corresponds to the connection pin BB1 when the hole HM is the hole HM1, the connection pin BB corresponds to the connection pin BB2 when the hole HM is the hole HM2, and the connection pin BB corresponds to the connection pin BB3 when the hole HM is the hole HM3.

Although the connection pin PN described above is intended to electrically connect (the wiring of) the power wiring board PB1 and (the wiring of) the control wiring board PB2, the connection pin BB is not intended to electrically connect the power wiring board PB1 and the control wiring board PB2 unlike the connection pin PN, but is intended to electrically connect (the wiring of) the power wiring board PB1 and (a coil of) the motor MOT. Each of the connection pins BB is made of a conductor and is preferably made of a metal material like the connection pins PN.

More specifically, the power wiring board PB1 has the hole (through hole) HM1 through which the connection pin BB1 is inserted, the hole (through hole) HM2 through which the connection pin BB2 is inserted, and the hole (through hole) HM3 through which the connection pin BB3 is inserted. Then, one end side of the connection pin BB1 is inserted through the hole HM1 of the power wiring board PB1, and the other end side of the connection pin BB1 is inserted into and fixed to the hole in an upper part of the motor MOT. Further, one end side of the connection pin BB2 is inserted through the hole HM2 of the power wiring board PB1, and the other end side of the connection pin BB2 is inserted into and fixed to the hole in the upper part of the motor MOT. Also, one end side of the connection pin BB3 is inserted through the hole HM3 of the power wiring board PB1, and the other end side of the connection pin BB3 is inserted into and fixed to the hole in the upper part of the motor MOT. The connection pin BB1 is electrically connected to the U-phase coil in the motor MOT through an internal wiring (not shown) of the motor MOT and the like, the connection pin BB2 is electrically connected to the V-phase coil in the motor MOT through the internal wiring (not shown) of the motor MOT and the like, and the connection pin BB3 is electrically connected to the W-phase coil in the motor MOT through the internal wiring (not shown) of the motor MOT and the like.

Here, a structure that electrically connects the power wiring board PB1 and the motor MOT through the connection pins BB1, BB2, and BB3 will be described with reference to FIG. 8.

As shown in FIG. 8, the conductive film CD1$c$ is formed on the side surface (inner wall) of the hole HM in the power wiring board PB1, and the conductive film CD1$c$ on the side surface of the hole HM is electrically connected to the connection pin BB inserted through the hole HM. For example, the conductive film CD1$c$ on the side surface of the hole HM of the power wiring board PB1 and the connection pin BB inserted through the hole HM are electrically connected through a conductive bonding material such as the solder SL interposed therebetween. Alternatively, the conductive film CD1$c$ on the side surface of the hole HM of the power wiring board PB1 may be electrically connected to the connection pin BB inserted through the hole HM by being in contact with each other. Note that it is also possible to fix the connection pin BB to the power wiring board PB1 with a conductive bonding material such as the solder SL.

The conductive film CD1$c$ on the side surface of the hole HM of the power wiring board PB1 is electrically connected to the conductive film CD1$a$ formed around the hole HM on the upper surface of the power wiring board PB1 and is electrically connected to the conductive film CD1$b$ formed around the hole HM on the lower surface of the power wiring board PB1. Thus, in FIG. 8, the conductive films CD1$a$, CD1$b$, and CD1$c$ of the power wiring board PB1 can be electrically connected to the connection pin BB.

In this manner, it is possible to electrically connect the wiring pattern (the conductive film CD1$a$ or the conductive film CD1$b$) formed on the upper surface or the lower surface of the power wiring board PB1 to the connection pin BB.

Also, in the power wiring board PB1, the resist layers RS1$a$ and RS1$b$ may have the opening portions OP1 and OP2 that enclose the hole HM in a plan view. In this case, it is also possible to electrically connect one or both of the conductive films CD1$a$ and CD1$b$ exposed from the opening portions OP1 and OP2 of the resist layers RS1$a$ and RS1$b$ around the hole HC of the power wiring board PB1 to the connection pin BB through a conductive bonding material such as the solder SL.

Therefore, output wirings WD1 and WD4 described below of the power wiring board PB1 are electrically connected to the connection pin BB1 inserted through the hole HM1, and are electrically connected to the U-phase coil in the motor MOT through the connection pin BB1 and the internal wiring (not shown) of the motor MOT. Also, output wirings WD2 and WD5 described below of the power wiring board PB1 are electrically connected to the connection pin BB2 inserted through the hole HM2, and are electrically connected to the V-phase coil in the motor MOT through the connection pin BB2 and the internal wiring (not shown) of the motor MOT. Further, output wirings WD3 and WD6 described below of the power wiring board PB1 are electrically connected to the connection pin BB3 inserted through the hole HM3, and are electrically connected to the W-phase coil in the motor MOT through the connection pin BB3 and the internal wiring (not shown) of the motor MOT.

Also, as shown in FIG. 6, the discharge port TK projecting from the motor MOT penetrates through a hole (through hole) HT1 of the power wiring board PB1 and a hole (through hole) HT2 of the control wiring board PB2. Fuel (not shown) sucked up by the motor MOT is supplied to the engine ENG (not shown in FIG. 6) through the discharge port TK and the fuel pipe (not shown in FIG. 6) connected thereto. <Mounting Structure on Control Wiring Board>

On the control wiring board PB2, one or more electronic components constituting the regulator RG and one or more electronic components constituting the control circuit unit CT are mounted, and an electronic component EC2 is shown as a representative of such electronic components in FIG. 6. The electronic component (EC2) mounted on the control wiring board PB2 is typically a semiconductor device (semiconductor package) incorporating a semiconductor chip, but an electronic component other than the semiconductor device (semiconductor package) (for example, a passive component such as a chip resistor) may also be additionally mounted on the control wiring board PB2.

Each of the electronic components (EC2) mounted on the control wiring board PB2 is electrically connected to wiring of the control wiring board PB2 and is coupled to each other as necessary by the wiring of the control wiring board PB2. Further, each of the electronic components (EC2) mounted on the control wiring board PB2 is electrically connected to the cable CB for supplying the power supply potential VIN, the cable CB for supplying the ground potential GND, the power supply connection pin PN1, the ground connection pin PN2, or the signal pin PN3 as necessary through the wiring of the control wiring board PB2.

<Mounting Structure on Power Wiring Board>

On the power wiring board PB1, a plurality of electronic components forming the power system circuit constituting unit PK are mounted, and an electronic component EC1 is shown as a representative of such electronic components in FIG. 6. Each of the electronic components (EC1) mounted on the power wiring board PB1 is electrically connected to wiring of the power wiring board PB1.

Figure 9:
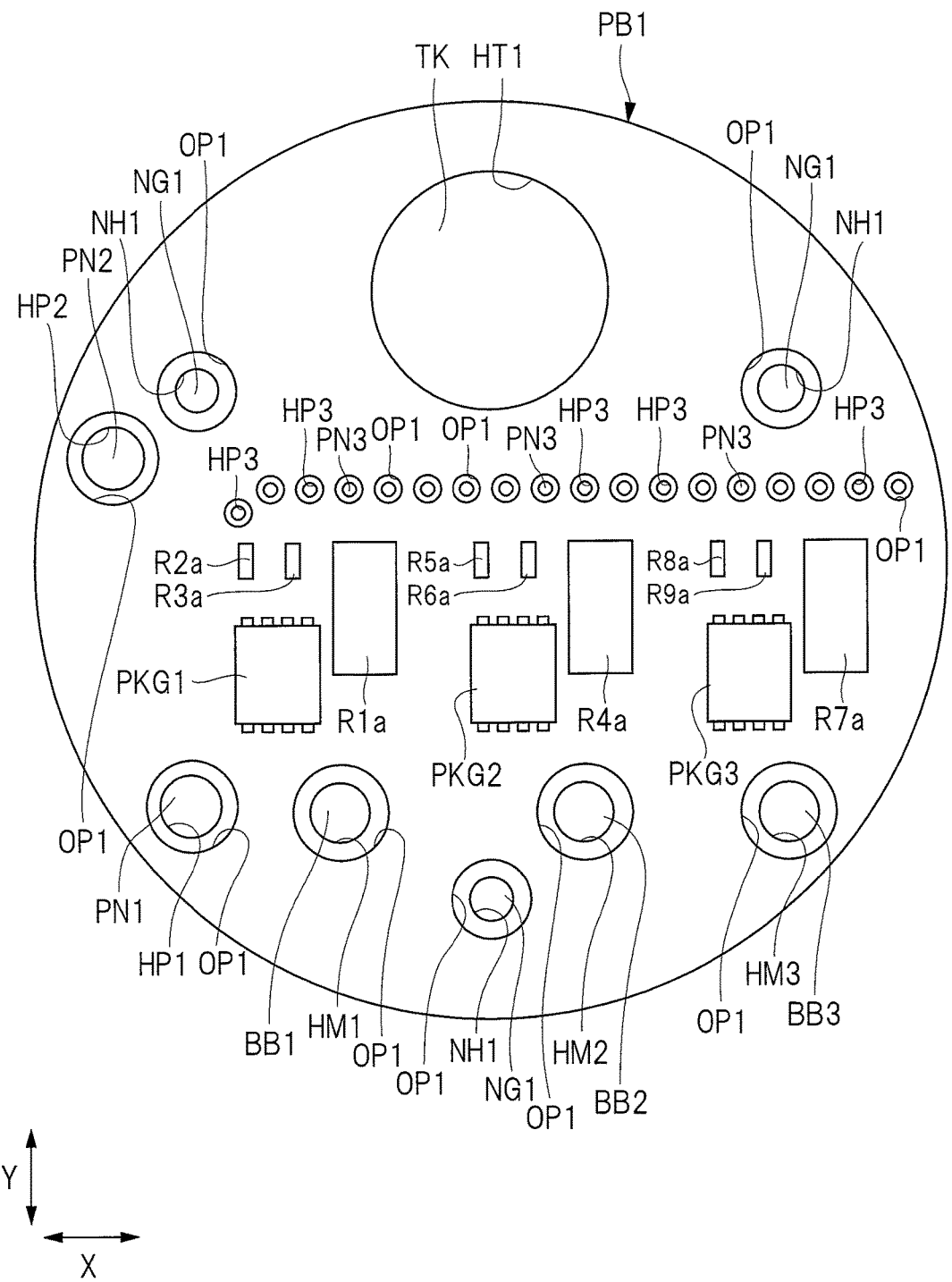
FIG. 9 is a top view of a power wiring board.

FIG. 9 is a top view of the power wiring board PB1, and the plurality of electronic components (EC1) mounted on the power wiring board PB1 are also shown. Specifically, on the upper surface of the power wiring board PB1, semiconductor devices (semiconductor packages) PKG1, PKG2, and PKG3 and chip resistors R1a, R2a, R3a, R4a, R5a, R6a, R7a, R8a, and R9a are mounted.

The semiconductor device PKG1 is a semiconductor device constituting the power MOSFET 1 and the power MOSFET 2, the semiconductor device PKG2 is a semiconductor device constituting the power MOSFET 3 and the power MOSFET 4, and the semiconductor device PKG3 is a semiconductor device constituting the power MOSFET 5 and the power MOSFET 6. The chip resistor R1a is a resistor element constituting the resistor R1, the chip resistor R2a is a resistor element constituting the resistor R2, the chip resistor R3a is a resistor element constituting the resistor R3, and the chip resistor R4a is a resistor element constituting the resistor R4. Also, the chip resistor R5a is a resistor element constituting the resistor R5, the chip resistor R6a is a resistor element constituting the resistor R6, the chip resistor R7a is a resistor element constituting the resistor R7, the chip resistor R8a is a resistor element constituting the resistor R8, and the chip resistor R9a is a resistor element constituting the resistor R9.

Among the plurality of electronic components (EC1) mounted on the power wiring board PB1, the semiconductor devices PKG1, PKG2, and PKG3 generate a large amount of heat during operation. Therefore, at a position overlapping each of the semiconductor devices PKG1, PKG2, and PKG3 in a plan view, that is, at a position directly below each of the semiconductor devices PKG1, PKG2, and PKG3, a heat dissipation member such as a heat dissipation sheet HS (see FIG. 6) may be interposed (disposed) between the lower surface of the power wiring board PB1 and the upper surface of the motor MOT. By doing so, it is possible to efficiently conduct (dissipate) the heat generated in the semiconductor devices PKG1, PKG2, and PKG3 to the motor MOT through the power wiring board PB1 and the heat dissipation sheet HS. Accordingly, it is possible to improve heat dissipation characteristics of the semiconductor devices PKG1, PKG2, and PKG3 and further stabilize and improve performance of the electronic device.

<Configuration of Semiconductor Device>

A configuration of the semiconductor devices PKG1, PKG2, and PKG3 mounted on the power wiring board PB1 will be described.

A structure of the semiconductor device PKG1, a structure of the semiconductor device PKG2, and a structure of the semiconductor device PKG3 are basically the same. Each of the semiconductor devices PKG1, PKG2, and PKG3 includes two semiconductor chips. One of the two semiconductor chips incorporated in the semiconductor device PKG1 constitutes the power MOSFET 1, and the other thereof constitutes the power MOSFET 2. Also, one of the two semiconductor chips incorporated in the semiconductor device PKG2 constitutes the power MOSFET 3, and the other thereof constitutes the power MOSFET 4. Further, one of the two semiconductor chips incorporated in the semiconductor device PKG3 constitutes the power MOSFET 5, and the other thereof constitutes the power MOSFET 6.

Since the configuration of the semiconductor device PKG1, the configuration of the semiconductor device PKG2, and the configuration of the semiconductor device PKG3 are basically the same, the configuration of the semiconductor device PKG1 is described herein as a representative with reference to FIGS. 10 to 16.

Figure 10:
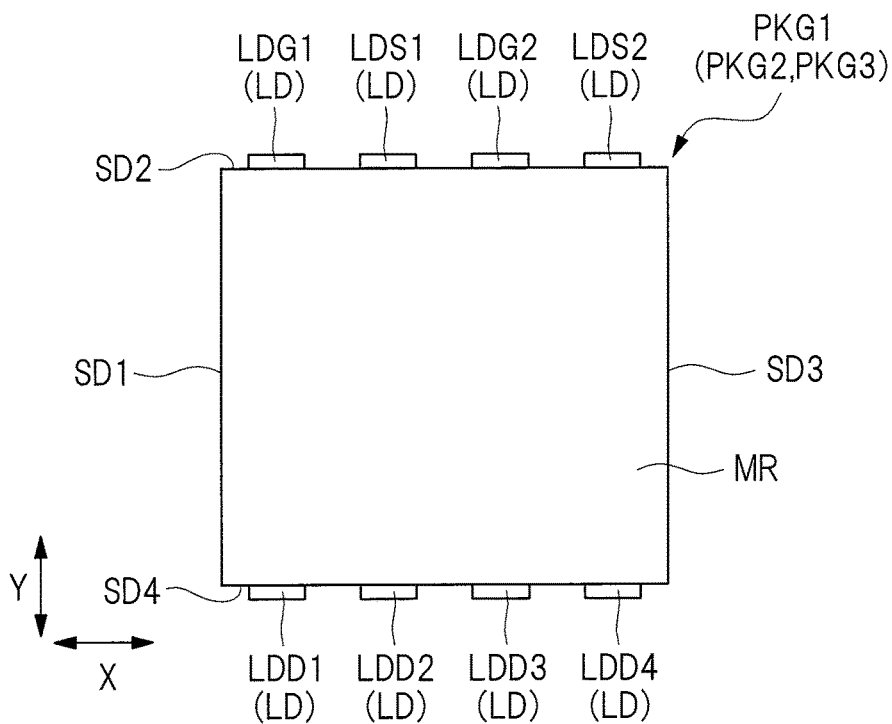
FIG. 10 is a top view of a semiconductor device.
Figure 11:
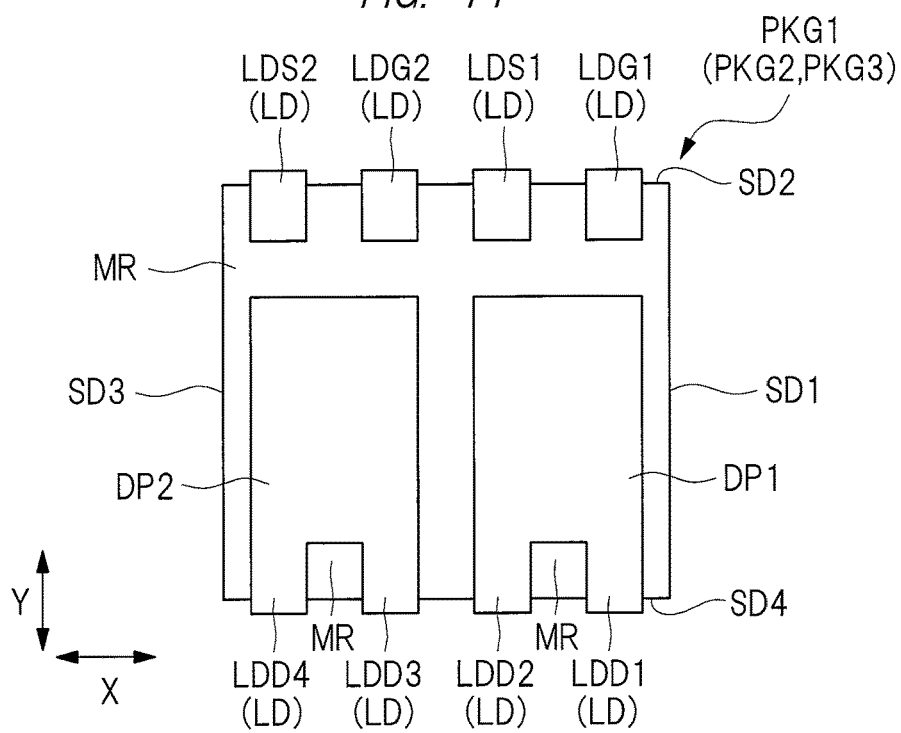
FIG. 11 is a bottom view of the semiconductor device.
Figure 12:
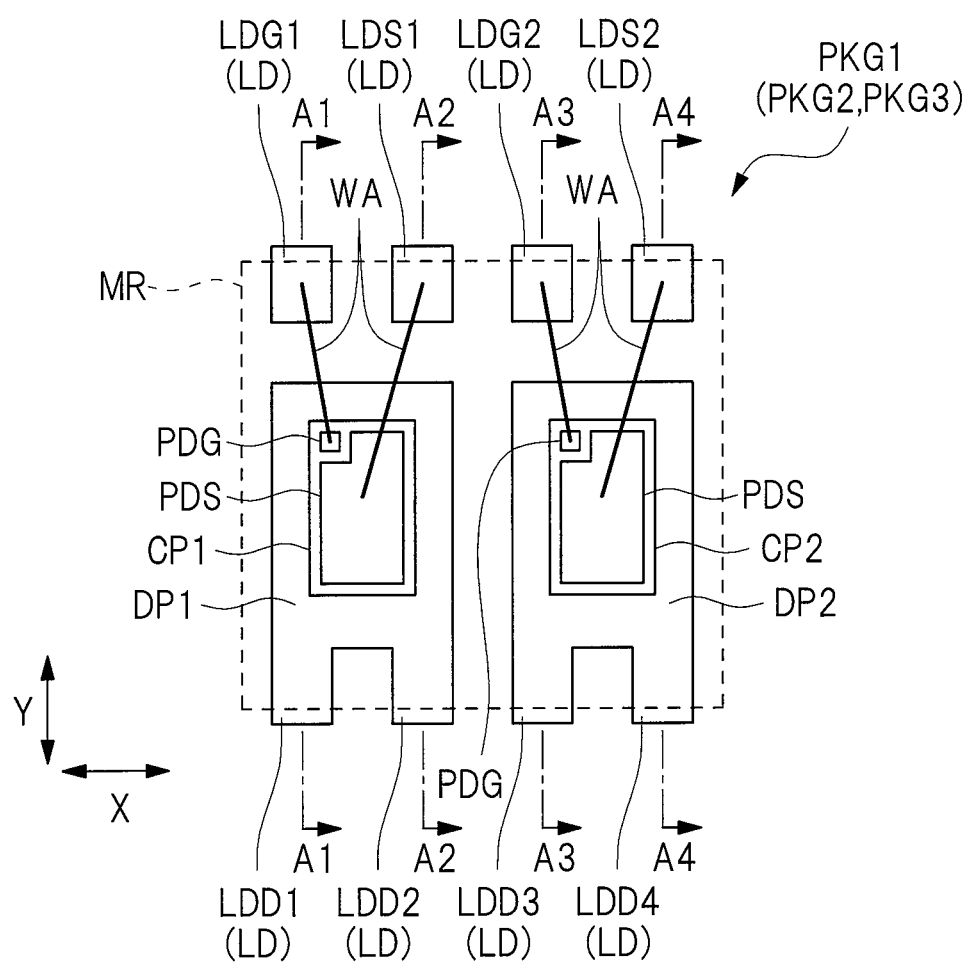
FIG. 12 is a plan perspective view of the semiconductor device.
Figure 13:
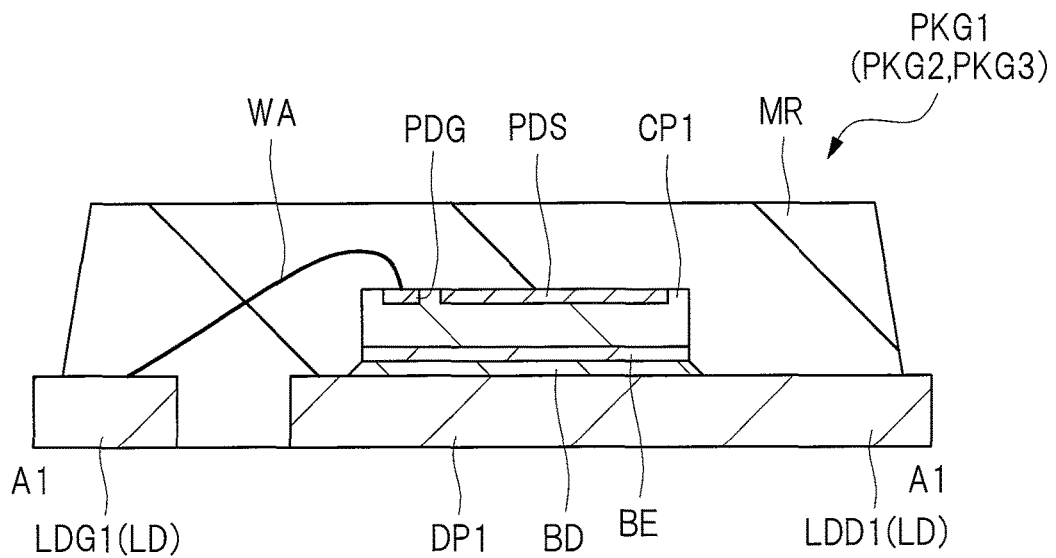
FIG. 13 is a sectional view of the semiconductor device.
Figure 14:
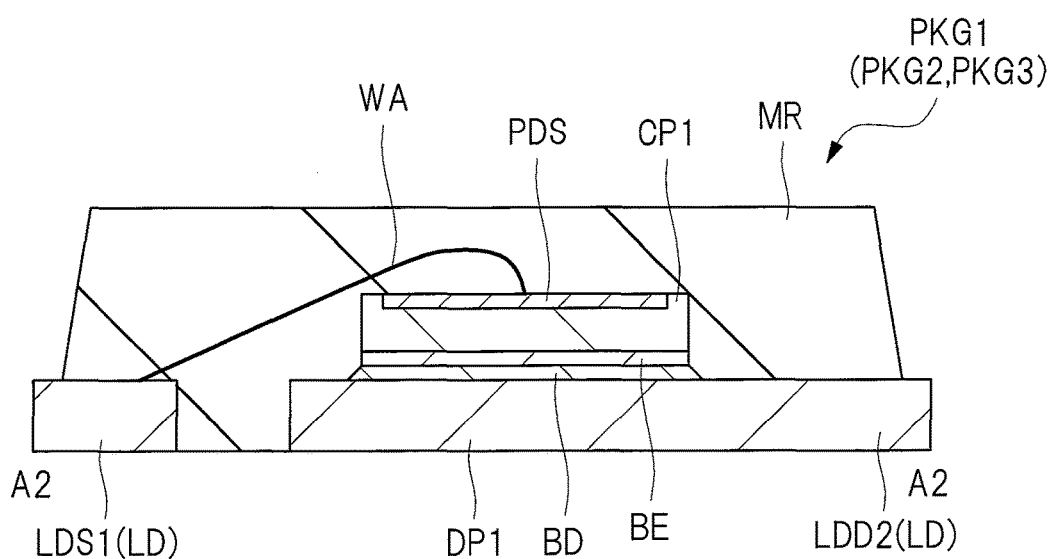
FIG. 14 is a sectional view of the semiconductor device.

FIG. 10 is a top view of the semiconductor device PKG1 and FIG. 11 is a bottom view of the semiconductor device PKG1. FIG. 12 is a plan perspective view of the semiconductor device PKG1, and shows an upper surface of the semiconductor device PKG1 seen through a sealing portion MR. In FIG. 12, an outer peripheral position of the sealing portion MR is indicated with a dotted line. FIGS. 13 to 16 are sectional views of the semiconductor device PKG1. FIG. 13 substantially corresponds to a sectional view taken along a line A1-A1 of FIG. 12, FIG. 14 substantially corresponds to a sectional view taken along a line A2-A2 of FIG. 12, FIG. 15 substantially corresponds to a sectional view taken along a line A3-A3 of FIG. 12, and FIG. 16 substantially corresponds to a sectional view taken along a line A4-A4 of FIG. 12.

As shown in FIGS. 10 to 16, the semiconductor device PKG1 includes die pads (chip mounting portions) DP1 and DP2, semiconductor chips CP1 and CP2 mounted on each upper surface of the die pads DP1 and DP2, a plurality of bonding wires (hereinafter, simply referred to as wires) WA, a plurality of leads LD, and the sealing portion (sealing resin portion, sealing body) MR that seals these components.

The sealing portion MR as a sealing body is made of, for example, a resin material such as a thermosetting resin material and may contain filler and the like.

Here, a surface mount type semiconductor package is taken as an example of the semiconductor device PKG1. Specifically, the semiconductor device PKG1 is a surface mount type semiconductor package of a HSON (Small Outline No Lead Package with Heat Sink) type. However, the configuration of the semiconductor device PKG1 is not limited to this and may be modified in various ways, and other flat package configurations such as a QFN (Quad Flat Non-leaded Package) configuration, a QFP (Quad Flat Package) configuration, and a SOP (Small Out-line Package) configuration may be adopted.

The die pad DP1 and the die pad DP2 are disposed side by side in a plan view. The semiconductor chip CP1 is mounted on the die pad DP1, and the semiconductor chip CP2 is mounted on the die pad DP2.

The power MOSFET is formed in the semiconductor chip CP1. Specifically, a large number of unit transistor cells are formed on a semiconductor substrate constituting the semiconductor chip CP1, and the power MOSFET is formed by connecting the large number of unit transistor cells in parallel. Each of the unit transistor cells is constituted of, for example, a trench gate type field effect transistor. On a front surface side of the semiconductor chip CP1, a source pad (source bonding pad, source electrode) PDS connected to a source of the power MOSFET and a gate pad (gate bonding pad, gate electrode) PDG connected to a gate of the power MOSFET are formed. On an entire back surface of the semiconductor chip CP1, a back surface electrode (back surface drain electrode, drain electrode) BE connected to a drain of the power MOSFET is formed.

The source pad PDS may be regarded as a source electrode (electrode for the source), the gate pad PDG may be regarded as a gate electrode (electrode for the gate), and the back surface electrode BE may be regarded as a drain electrode.

Since the configuration of the semiconductor chip CP2 is the same as the configuration of the semiconductor chip CP1, a repetitive description thereof is omitted here.

The back surface electrode BE of the semiconductor chip CP1 is bonded to the upper surface of the die pad DP1 through a conductive bonding material BD, and the back surface electrode BE of the semiconductor chip CP2 is bonded to the upper surface of the die pad DP2 through the conductive bonding material BD. Therefore, the back surface electrode BE of the semiconductor chip CP1 is electrically connected to the die pad DP1, and the back surface electrode BE of the semiconductor chip CP2 is electrically connected to the die pad DP2.

The plurality of leads LD provided in the semiconductor device PKG1 include gate leads LDG1 and LDG2, source leads LDS1 and LDS2, and drain leads LDD1, LDD2, LDD3, and LDD4.

The gate lead LDG1 is electrically connected to the gate pad PDG of the semiconductor chip CP1 through the wire WA. The gate lead LDG2 is electrically connected to the gate pad PDG of the semiconductor chip CP2 through the wire WA. The source lead LDS1 is electrically connected to the source pad PDS of the semiconductor chip CP1 through the wire WA. The source lead LDS2 is electrically connected to the source pad PDS of the semiconductor chip CP2 through the wire WA.

The semiconductor chip CP1 is a high-side semiconductor chip having a high-side MOSFET (any of the power MOSFETs 1, 3, and 5), and the semiconductor chip CP2 is a low-side semiconductor chip having a low-side MOSFET (any of the power MOSFETs 2, 4, and 6). Therefore, the source lead LDS1 electrically connected to the source pad PDS of the semiconductor chip CP1 may be regarded as a high-side source terminal, and the source lead LDS2 electrically connected to the source pad PDS of the semiconductor chip CP2 may be regarded as a low-side source terminal. Also, the gate lead LDG1 electrically connected to the gate pad PDG of the semiconductor chip CP1 may be regarded as a high-side gate terminal, and the gate lead LDG2 electrically connected to the gate pad PDG of the semiconductor chip CP2 maybe regarded as a low-side gate terminal. Further, the die pad DP1 (and the drain leads LDD1 and LDD2) electrically connected to the back surface electrode BE of the semiconductor chip CP1 may be regarded as a high-side drain terminal, and the die pad DP2 (and the drain leads LDD3 and LDD4) electrically connected to the back surface electrode BE of the semiconductor chip CP2 may be regarded as a low-side drain terminal.

Note that FIG. 12 shows a case in which the source lead LDS1 and the source pad PDS of the semiconductor chip CP1 are connected by one wire WA. Considering that a large current flows, the source lead LDS1 and the source pad PDS of the semiconductor chip CP1 may be connected by a plurality of wires WA, or the source lead LDS1 and the source pad PDS of the semiconductor chip CP1 may be connected by a metal plate instead of the wires WA. The same is true of the connection between the source lead LDS2 and the source pad PDS of the semiconductor chip CP2.

Since the drain lead LDD1 and the drain lead LDD2 are integrally formed with the die pad DP1, not only the die pad DP1 but also the drain lead LDD1 and the drain lead LDD2 are electrically connected to the back surface electrode BE of the semiconductor chip CP1. Further, since the drain lead LDD3 and the drain lead LDD4 are integrally formed with the die pad DP2, not only the die pad DP2 but also the drain lead LDD3 and the drain lead LDD4 are electrically connected to the back surface electrode BE of the semiconductor chip CP2. The drain leads LDD1 and LDD2 may be regarded as a part of the die pad DP1, and the drain leads LDD3 and LDD4 may be regarded as a part of the die pad DP2.

The gate lead LDG1 and the source lead LDS1 are disposed at positions spaced apart in a Y direction from the die pad DP1, and the gate lead LDG2 and the source lead LDS2 are disposed at positions spaced apart in the Y direction from the die pad DP2. On a side opposite to the side on which the gate lead LDG1 and the source lead LDS1 are disposed, the drain lead LDD1 and the drain lead LDD2 are integrally famed with the die pad DP1. Also, on a side opposite to the side on which the gate lead LDG2 and the source lead LDS2 are disposed, the drain lead LDD3 and the drain lead LDD4 are integrally famed with the die pad DP2.

The die pad DP1 and the die pad DP2 are arranged in an X direction. Also, the gate lead LDG1, the source lead LDS1, the gate lead LDG2, and the source lead LDS2 are arranged in the X direction in this order. Further, the drain lead LDD1, the drain lead LDD2, the drain lead LDD3, and the drain lead LDD4 are arranged in the X direction in this order.

Note that the X direction and the Y direction are directions intersecting each other and preferably are directions orthogonal to each other.

A planar shape of the sealing portion MR is substantially rectangular, and includes sides (side surfaces) SD1 and SD3 that are parallel in the Y direction and opposed in the X direction and sides (side surfaces) SD2 and SD4 that are parallel in the X direction and opposed in the Y direction. The gate lead LDG1, the source lead LDS1, the gate lead LDG2, and the source lead LDS2 are disposed on the side SD2, and the drain lead LDD1, the drain lead LDD2, the drain lead LDD3, and the drain lead LDD4 are disposed on the side SD4.

The die pads DP1 and DP2, the gate leads LDG1 and LDG2, the source leads LDS1 and LDS2, and the drain leads LDD1, LDD2, LDD3, and LDD4 are sealed with the sealing portion MR. However, a lower surface of each of the die pads DP1 and DP2, the gate leads LDG1 and LDG2, the source leads LDS1 and LDS2, and the drain leads LDD1, LDD2, LDD3, and LDD4 is exposed from the lower surface of the sealing portion MR and serves as external connection terminals of the semiconductor device PKG1.

The die pad DP1, the die pad DP2, the gate lead LDG1, the source lead LDS1, the gate lead LDG2, and the source lead LDS2 are separated from each other, and a part of the sealing portion MR is interposed therebetween.

Since the configuration of the semiconductor device PKG2 and the configuration of the semiconductor device PKG3 are the same as that of the semiconductor device PKG1, a repetitive description thereof is omitted here.

<Wiring Pattern of Power Wiring Board>

Figure 17:
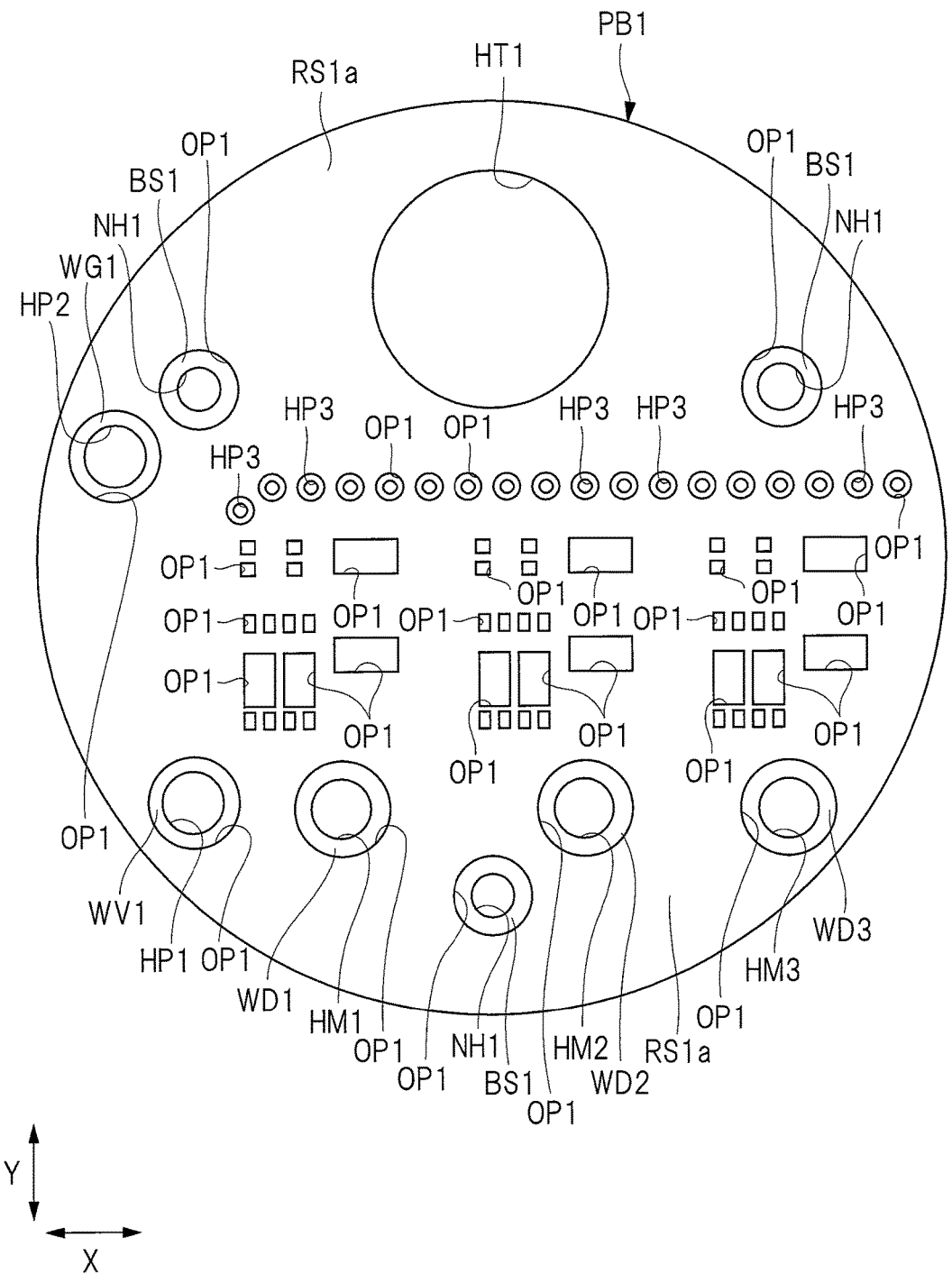
FIG. 17 is a plan view of an upper surface side of a power wiring board.
Figure 18:
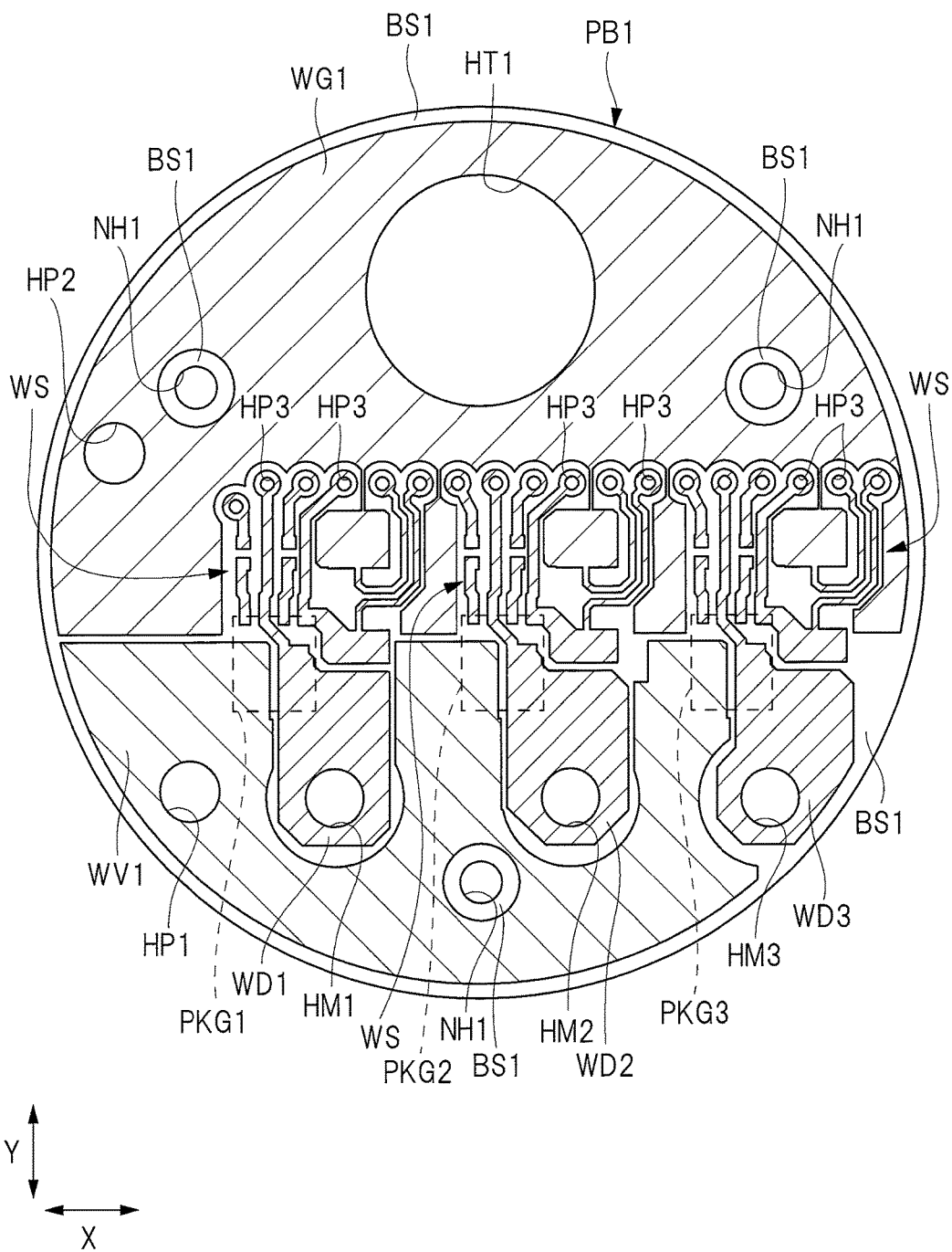
FIG. 18 is a plan perspective view of the upper surface side of the power wiring board.
Figure 19:
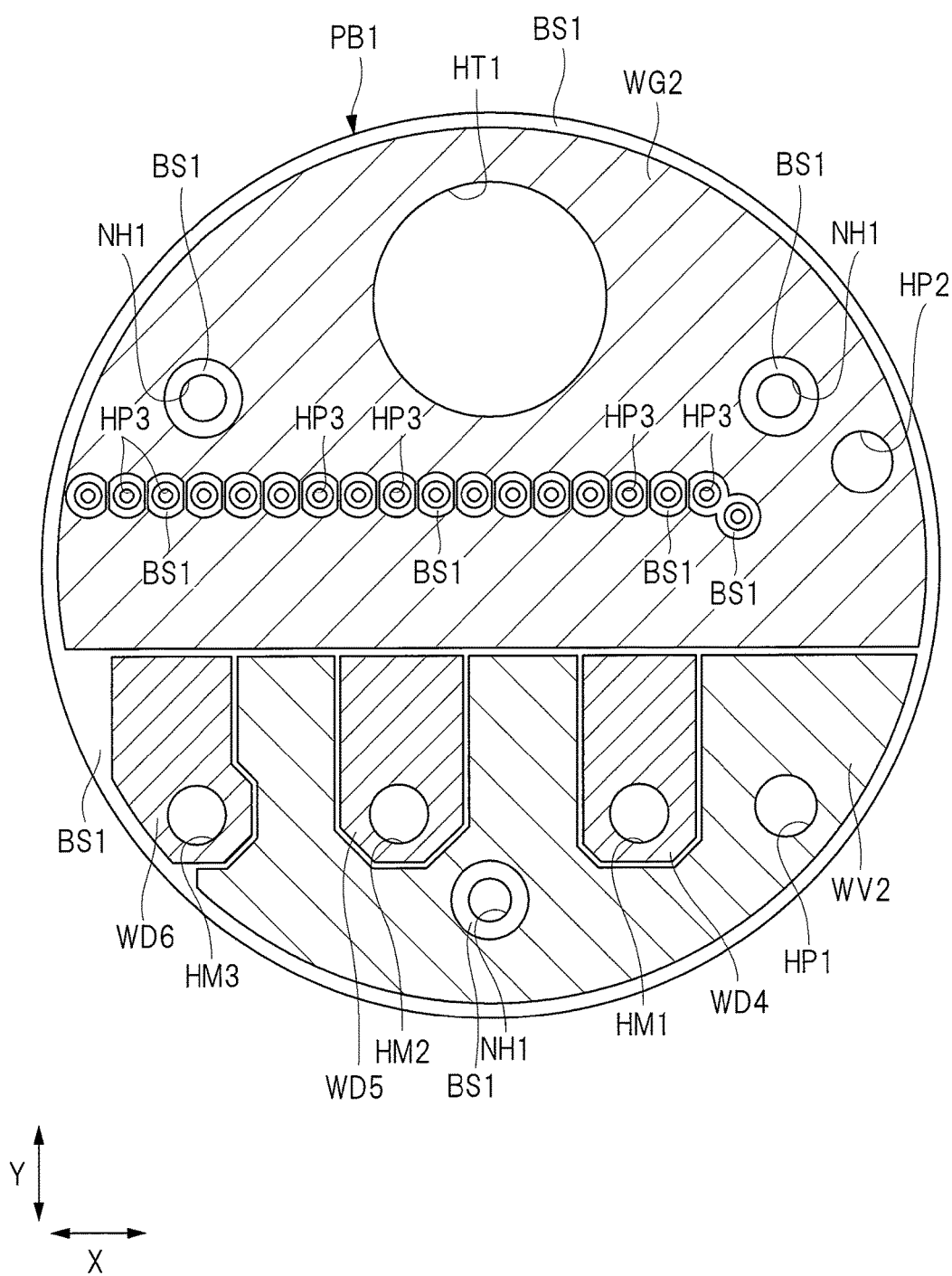
FIG. 19 is a plan perspective view of a lower surface side of the power wiring board.
Figure 20:
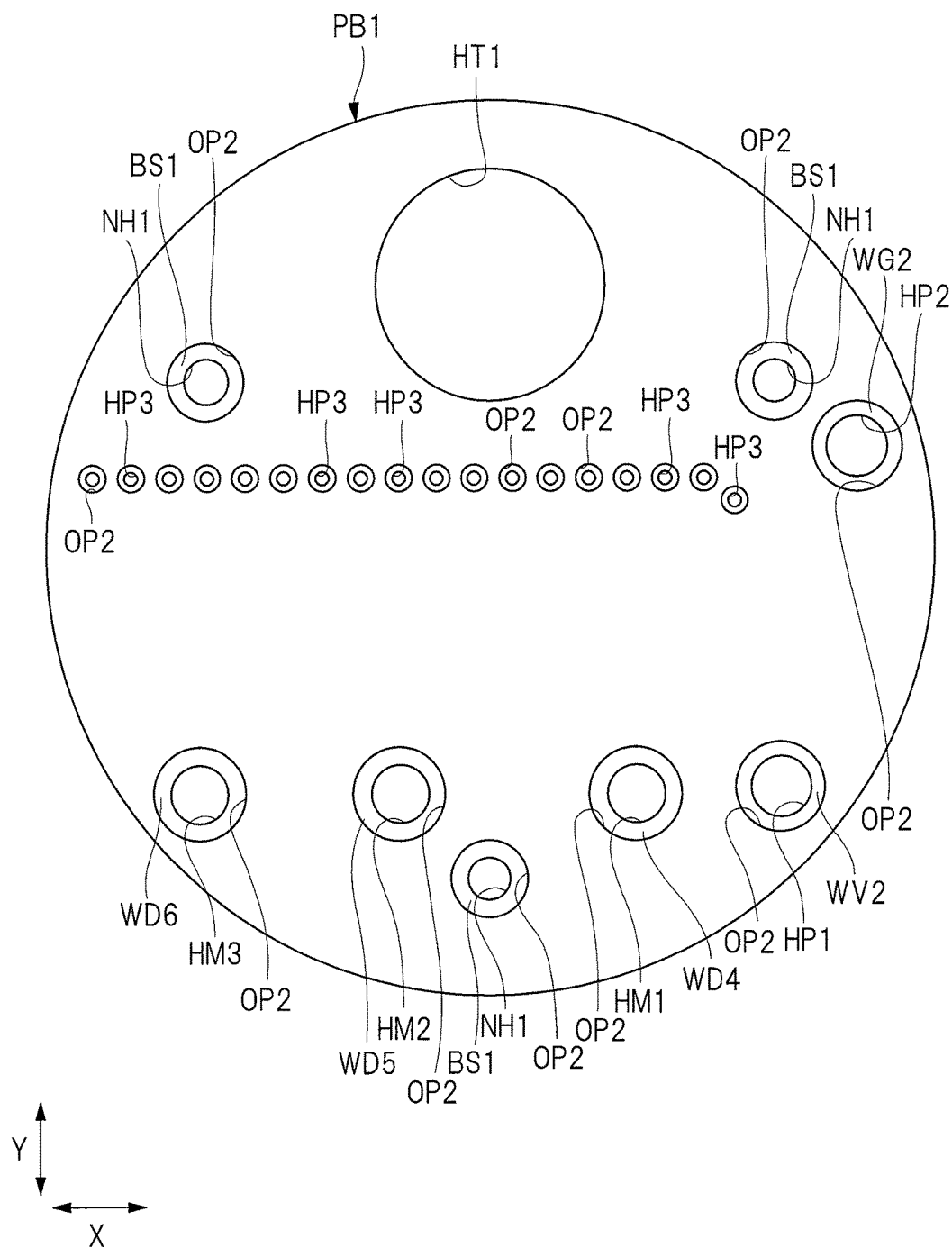
FIG. 20 is a plan view of the lower surface side of the power wiring board.

FIGS. 17 to 20 are plan views of the power wiring board PB1. Among them, FIG. 17 is a top view of the power wiring board PB1. FIG. 17 corresponds to a view in which the electronic components (specifically, the semiconductor devices PKG1, PKG2, and PKG3 and the chip resistors R1a, R2a, R3a, R4a, R5a, R6a, R7a, R8a, and R9a) mounted on the power wiring board PB1 are removed from FIG. 9. Also, FIG. 18 is a plan perspective view of the power wiring board PB1. FIG. 18 shows a plan view (plan perspective view) of the upper surface side of the power wiring board PB1 seen through the resist layer RS1a on the upper surface side of the power wiring board PB1. Namely, FIG. 18 corresponds to a view in which the power wiring board PB1 is seen through the resist layer RS1a on the upper surface side of the power wiring board PB1 in FIG. 17. Thus, in FIG. 18, the wiring pattern on the upper surface side of the power wiring board PB1 (the wiring pattern on the upper surface of the base material layer BS1, that is, the wiring pattern formed by the conductive film CD1a) is shown, but hatching is added to the wiring pattern on the upper surface side of the power wiring board PB1 for easier understanding even though it is a plan view. Also, in FIG. 18, positions at which the semiconductor devices PKG1, PKG2, and PKG3 are mounted are indicated with dotted lines for easier understanding. Further, FIG. 19 shows a plan perspective view of the lower surface side of the power wiring board PB1, and FIG. 20 shows a bottom view of the power wiring board PB1. Namely, FIG. 19 corresponds to a view in which the power wiring board PB1 is seen through the resist layer RS1b on the lower surface side of the power wiring board PB1 in FIG. 20. Thus, in FIG. 19, the wiring pattern on the lower surface side of the power wiring board PB1 (the wiring pattern on the lower surface of the base material layer BS1, that is, the wiring pattern formed by the conductive film CD1b) is shown, but hatching is added to the wiring pattern on the lower surface side of the power wiring board PB1 for easier understanding even though it is a plan view. Note that, in the power wiring board PB1, a principle surface on a side facing the motor MOT corresponds to the lower surface of the power wiring board PB1, and a principle surface on a side facing the control wiring board PB2 corresponds to the upper surface of the power wiring board PB1. Further, in the control wiring board PB2, a principle surface on a side facing the power wiring board PB1 corresponds to the lower surface of the control wiring board PB2.

As shown in FIG. 9 and FIGS. 17 to 20, the power wiring board PB1 has a circular planar shape. A wiring pattern is formed on each of the upper surface and the lower surface of the power wiring board PB1. Also, on the upper surface of the power wiring board PB1, the semiconductor device PKG1, the semiconductor device PKG2, the semiconductor device PKG3, the chip resistor R1a, the chip resistor R2a, the chip resistor R3a, the chip resistor R4a, the chip resistor R5a, the chip resistor R6a, the chip resistor R7a, the chip resistor R8a, and the chip resistor R9a are mounted at mutually different positions (planar positions).

Specifically, on the upper surface of the power wiring board PB1, a power supply wiring (conductor pattern) WV1, a ground wiring (conductor pattern) WG1, output wirings (conductor patterns) WD1, WD2, and WD3, and signal wiring (conductor pattern) WS are formed. Further, on the lower surface of the power wiring board PB1, a power supply wiring (conductor pattern) WV2, a ground wiring (conductor pattern) WG2, and output wirings (conductor patterns) WD4, WD5, and WD6 are formed. On the lower surface of the power wiring board PB1, an equivalent of the signal wiring WS is not formed. The wiring on the upper surface of the power wiring board PB1 (that is, the power supply wiring WV1, the ground wiring WG1, the output wirings WD1, WD2, and WD3, and the signal wiring WS) is formed of a conductive film (corresponding to the above-described conductive film CD1a) formed on the upper surface of the base material layer BS1 constituting the power wiring board PB1. Further, the wiring on the lower surface of the power wiring board PB1 (that is, the power supply wiring WV2, the ground wiring WG2, and the output wirings WD4, WD5, and WD6) is formed of a conductive film (corresponding to the above-described conductive film CD1b) formed on the lower surface of the base material layer BS1 constituting the power wiring board PB1. All of the power supply wiring WV1, the ground wiring WG1, the output wirings WD1, WD2, and WD3, the signal wiring WS, the power supply wiring WV2, the ground wiring WG2, and the output wirings WD4, WD5, and WD6 may be regarded as conductor patterns.

The power supply wiring WV1 and the power supply wiring WV2 are wirings through which the power supply potential VIN is supplied. The power supply wiring WV1 and the power supply wiring WV2 are electrically connected to the power supply connection pin PN1 inserted through the hole HP1 of the power wiring board PB1, and the power supply potential VIN is supplied from the power supply connection pin PN1 to the power supply wiring WV1 and the power supply wiring WV2.

Specifically, in the power wiring board PB1, the hole HP1 through which the power supply connection pin PN1 is inserted is provided at a position that is enclosed in both of the power supply wirings WV1 and WV2 in a plan view. Then, the conductive film (CD1c) which is electrically connected to the power supply wirings WV1 and WV2 is formed on a side surface of the hole HP1, and the power supply connection pin PN1 is inserted through the hole HP1. Further, as necessary, the power supply connection pin PN1 is bonded to the power wiring board PB1 with a conductive bonding material such as the solder (SL). Accordingly, the power supply wiring WV1 and the power supply wiring WV2 which are formed on the upper surface and the lower surface of the power wiring board PB1 can be electrically connected to the power supply connection pin PN1. When applied to FIG. 7 described above, the connection pin PN in FIG. 7 corresponds to the power supply connection pin PN1, the hole HP in FIG. 7 corresponds to the hole HP1, the conductive film CD1a in FIG. 7 corresponds to the power supply wiring WV1, and the conductive film CD1b in FIG. 7 corresponds to the power supply wiring WV2. Further, the power supply wiring WV1 formed on the upper surface of the power wiring board PB1 and the power supply wiring WV2 famed on the lower surface of the power wiring board PB1 are electrically connected to each other through a plurality of via portions (VH) provided in the power wiring board PB1 at positions overlapping both of the power supply wirings WV1 and WV2 in a plan view.

Note that each of the via portions (VH) of the power wiring board PB1 is constituted of a hole penetrating through the base material layer BS1 of the power wiring board PB1 and a conductor portion buried in the hole, and is shown in FIGS. 21 to 24 described below. Each of the via portions (VH) of the power wiring board PB1 functions as a conductor portion (buried conductor portion, via wiring) for electrically connecting the wiring on the upper surface side of the power wiring board PB1 and the wiring on the lower surface side of the power wiring board PB1.

The power supply wiring WV1 famed on the upper surface of the power wiring board PB1 and the power supply wiring WV2 famed on the lower surface of the power wiring board PB1 are famed in regions that almost overlap (coincide with) each other in a plan view. The power supply wiring WV2 is provided for reducing resistance of the power supply wiring WV1, in other words, for reducing connection resistance between the die pad DP1 of each of the semiconductor devices PKG1, PKG2, and PKG3 and the power supply connection pin PN1.

The ground wiring WG1 and the ground wiring WG2 are wirings through which the ground potential GND is supplied. The ground wiring WG1 and the ground wiring WG2 are electrically connected to the ground connection pin PN2 inserted through the hole HP2 of the power wiring board PB1, and the ground potential GND is supplied from the ground connection pin PN2 to the ground wiring WG1 and the ground wiring WG2.

Specifically, in the power wiring board PB1, the hole HP2 through which the ground connection pin PN2 is inserted is provided at a position that is enclosed in both of the ground wirings WG1 and WG2 in a plan view. Further, the conductive film (CD1c) which is electrically connected to the ground wirings WG1 and WG2 is formed on a side surface of the hole HP2, and the ground connection pin PN2 is inserted through the hole HP2. Then, as necessary, the ground connection pin PN2 is bonded to the power wiring board PB1 with a conductive bonding material such as the solder (SL). Accordingly, the ground wiring WG1 and the ground wiring WG2 which are formed on the upper surface and the lower surface of the power wiring board PB1 can be electrically connected to the ground connection pin PN2. When applied to FIG. 7 described above, the connection pin PN in FIG. 7 corresponds to the ground connection pin PN2, the hole HP in FIG. 7 corresponds to the hole HP2, the conductive film CD1a in FIG. 7 corresponds to the ground wiring WG1, and the conductive film CD1b in FIG. 7 corresponds to the ground wiring WG2. Further, the ground wiring WG1 formed on the upper surface of the power wiring board PB1 and the ground wiring WG2 famed on the lower surface of the power wiring board PB1 are electrically connected to each other through a plurality of via portions (VH) provided in the power wiring board PB1 at positions overlapping both of the ground wirings WG1 and WG2 in a plan view.

The ground wiring WG2 famed on the lower surface of the power wiring board PB1 is formed in a region that almost overlaps (coincides with) the ground wiring WG1 and the signal wiring WS on the upper surface of the power wiring board PB1 in a plan view. Namely, in a plan view, the ground wiring WG2 is famed on the lower surface of the power wiring board PB1 over the planar region where the ground wiring WG1 is formed and the planar region where the signal wiring WS is famed on the upper surface of the power wiring board PB1. The ground wiring WG2 is provided for reducing resistance of the ground wiring WG1.

The output wiring WD1 famed on the upper surface of the power wiring board PB1 is wiring that electrically connects the die pad DP2 of the semiconductor device PKG1 and the connection pin BB1, and extends on the upper surface of the power wiring board PB1 in the Y direction from a mounting position of the semiconductor device PKG1 to a fainting position of the hole HM1 through which the connection pin BB1 is inserted. The output wiring WD4 famed on the lower surface of the power wiring board PB1 is formed in a region that almost overlaps (coincides with) the output wiring WD1 on the upper surface of the power wiring board PB1 in a plan view.

In the power wiring board PB1, the hole HM1 through which the connection pin BB1 is inserted is provided at a position that is enclosed in both of the output wirings WD1 and WD4 in a plan view. Further, the conductive film (CD1c) which is electrically connected to the output wirings WD1 and WD4 is formed on a side surface of the hole HM1, and the connection pin BB1 is inserted through the hole HM1. Then, as necessary, the connection pin BB1 is bonded to the power wiring board PB1 with a conductive bonding material such as the solder (SL). Accordingly, the output wiring WD1 and the output wiring WD2 which are formed on the upper surface and the lower surface of the power wiring board PB1 can be electrically connected to the connection pin BB1. When applied to FIG. 8 described above, the connection pin BB in FIG. 8 corresponds to the connection pin BB1, the hole HM in FIG. 8 corresponds to the hole HM1, the conductive film CD1a in FIG. 8 corresponds to the output wiring WD1, and the conductive film CD1b in FIG. 8 corresponds to the output wiring WD4. Therefore, it is possible to transmit output (output voltage or output current) from the die pad DP2 of the semiconductor device PKG1 to (the U-phase coil of) the motor MOT through the output wirings WD1 and WD4 and the connection pin BB1.

Also, the output wiring WD1 formed on the upper surface of the power wiring board PB1 and the output wiring WD4 formed on the lower surface of the power wiring board PB1 are electrically connected to each other through a plurality of via portions (VH) provided in the power wiring board PB1 at positions overlapping both of the output wirings WD1 and WD4 in a plan view. In the power wiring board PB1, the output wiring WD1 foamed on a principle surface on a side where the semiconductor device PKG1 is mounted (here, the upper surface of the power wiring board PB1) is wiring provided for electrically connecting the die pad DP2 (or the drain leads LDD3 and LDD4) of the semiconductor device PKG1 to the connection pin BB1. The output wiring WD4 on a side opposite to the output wiring WD1 is provided for reducing wiring resistance by increasing a sectional area of the wiring so as to increase an allowable current amount that can flow in the output wiring.

The output wiring WD2 formed on the upper surface of the power wiring board PB1 is wiring that electrically connects the die pad DP2 of the semiconductor device PKG2 and the connection pin BB2, and extends on the upper surface of the power wiring board PB1 in the Y direction from a mounting position of the semiconductor device PKG2 to a foaming position of the hole HM2 through which the connection pin BB2 is inserted. The output wiring WD5 formed on the lower surface of the power wiring board PB1 is formed in a region that almost overlaps (coincides with) the output wiring WD2 on the upper surface of the power wiring board PB1 in a plan view.

In the power wiring board PB1, the hole HM2 through which the connection pin BB2 is inserted is provided at a position that is enclosed in both of the output wirings WD2 and WD5 in a plan view. Further, the conductive film (CD1c) which is electrically connected to the output wirings WD2 and WD5 is formed on a side surface of the hole HM2, and the connection pin BB2 is inserted through the hole HM2. Then, as necessary, the connection pin BB2 is bonded to the power wiring board PB1 with a conductive bonding material such as the solder (SL). Accordingly, the output wiring WD2 and the output wiring WD5 which are formed on the upper surface and the lower surface of the power wiring board PB1 can be electrically connected to the connection pin BB2. When applied to FIG. 8 described above, the connection pin BB in FIG. 8 corresponds to the connection pin BB2, the hole HM in FIG. 8 corresponds to the hole HM2, the conductive film CD1a in FIG. 8 corresponds to the output wiring WD2, and the conductive film CD1b in FIG. 8 corresponds to the output wiring WD5. Therefore, it is possible to transmit output (output voltage or output current) from the die pad DP2 of the semiconductor device PKG2 to (the V-phase coil of) the motor MOT through the output wirings WD2 and WD5 and the connection pin BB2.

Also, the output wiring WD2 famed on the upper surface of the power wiring board PB1 and the output wiring WD5 famed on the lower surface of the power wiring board PB1 are electrically connected to each other through a plurality of via portions (VH) provided in the power wiring board PB1 at positions overlapping both of the output wirings WD2 and WD5 in a plan view. In the power wiring board PB1, the output wiring WD2 famed on a principle surface on a side where the semiconductor device PKG2 is mounted (here, the upper surface of the power wiring board PB1) is wiring provided for electrically connecting the die pad DP2 (or the drain leads LDD3 and LDD4) of the semiconductor device PKG2 to the connection pin BB2. The output wiring WD5 on a side opposite to the output wiring WD2 is provided for reducing wiring resistance by increasing a sectional area of the wiring so as to increase an allowable current amount that can flow in the output wiring.

The output wiring WD3 formed on the upper surface of the power wiring board PB1 is wiring that electrically connects the die pad DP2 of the semiconductor device PKG3 and the connection pin BB3, and extends on the upper surface of the power wiring board PB1 in the Y direction from a mounting position of the semiconductor device PKG3 to a fainting position of the hole HM3 through which the connection pin BB3 is inserted. The output wiring WD6 formed on the lower surface of the power wiring board PB1 is formed in a region that almost overlaps (coincides with) the output wiring WD3 on the upper surface of the power wiring board PB1 in a plan view.

In the power wiring board PB1, the hole HM3 through which the connection pin BB3 is inserted is provided at a position that is enclosed in both of the output wirings WD3 and WD6 in a plan view. Further, the conductive film (CD1c) which is electrically connected to the output wirings WD3 and WD6 is formed on a side surface of the hole HM3, and the connection pin BB3 is inserted through the hole HM3. Then, as necessary, the connection pin BB3 is bonded to the power wiring board PB1 with a conductive bonding material such as the solder (SL). Accordingly, the output wiring WD3 and the output wiring WD6 which are formed on the upper surface and the lower surface of the power wiring board PB1 can be electrically connected to the connection pin BB3. When applied to FIG. 8 described above, the connection pin BB in FIG. 8 corresponds to the connection pin BB3, the hole HM in FIG. 8 corresponds to the hole HM3, the conductive film CD1a in FIG. 8 corresponds to the output wiring WD3, and the conductive film CD1b in FIG. 8 corresponds to the output wiring WD6. Therefore, it is possible to transmit output (output voltage or output current) from the die pad DP2 of the semiconductor device PKG3 to (the W-phase coil of) the motor MOT through the output wirings WD3 and WD6 and the connection pin BB3.

Also, the output wiring WD3 formed on the upper surface of the power wiring board PB1 and the output wiring WD6 formed on the lower surface of the power wiring board PB1 are electrically connected to each other through a plurality of via portions (VH) provided in the power wiring board PB1 at positions overlapping both of the output wirings WD3 and WD6 in a plan view. In the power wiring board PB1, the output wiring WD3 foamed on a principle surface on a side where the semiconductor device PKG3 is mounted (here, the upper surface of the power wiring board PB1) is wiring provided for electrically connecting the die pad DP2 (or the drain leads LDD3 and LDD4) of the semiconductor device PKG3 to the connection pin BB3. The output wiring WD6 on a side opposite to the output wiring WD3 is provided for reducing wiring resistance by increasing a sectional area of the wiring so as to increase an allowable current amount that can flow in the output wiring.

The signal wiring WS is mainly constituted of wiring that is electrically connected to the signal pin PN3. As can be seen from FIGS. 9 and 18, the signal wiring WS is provided between a row of signal pins in which a plurality of signal pins PN3 are arrayed in the X direction (or a row of holes in which a plurality of holes HP3 through which the signal pins PN3 are inserted are arrayed in the X direction) and a row of semiconductor devices in which the semiconductor devices PKG1, PKG2, and PKG3 are arrayed in the X direction, on the upper surface of the power wiring board PB1.

The signal wiring WS formed on the upper surface of the power wiring board PB1 includes wiring that connects each of the gate leads LDG1 and LDG2 of each of the semiconductor devices PKG1, PKG2, and PKG3 to the signal pin PN3 through the chip resistor (any of the chip resistors R2a, R3a, R5a, R6a, R8a, and R9a). Also, the signal wiring WS formed on the upper surface of the power wiring board PB1 includes wiring that connects each of the source leads LDS1 and LDS2 of each of the semiconductor devices PKG1, PKG2, and PKG3 to the signal pin PN3. In addition, the signal wiring WS formed on the upper surface of the power wiring board PB1 includes wiring that connects the source lead LDS2 of each of the semiconductor devices PKG1, PKG2, and PKG3 to the ground wiring WG1 (or the ground wiring WG2) through the chip resistor (any of the chip resistors R1a, R4a, and R7a). Further, the signal wiring WS formed on the upper surface of the power wiring board PB1 includes wiring that connects both electrodes of each of the chip resistors R1a, R4a, and R7a to the signal pin PN3.

Next, a mounting structure of the semiconductor devices PKG1, PKG2, and PKG3 on the power wiring board PB1 will be described with reference to FIGS. 9, 17, 18, and 21 to 24.

Figure 21:
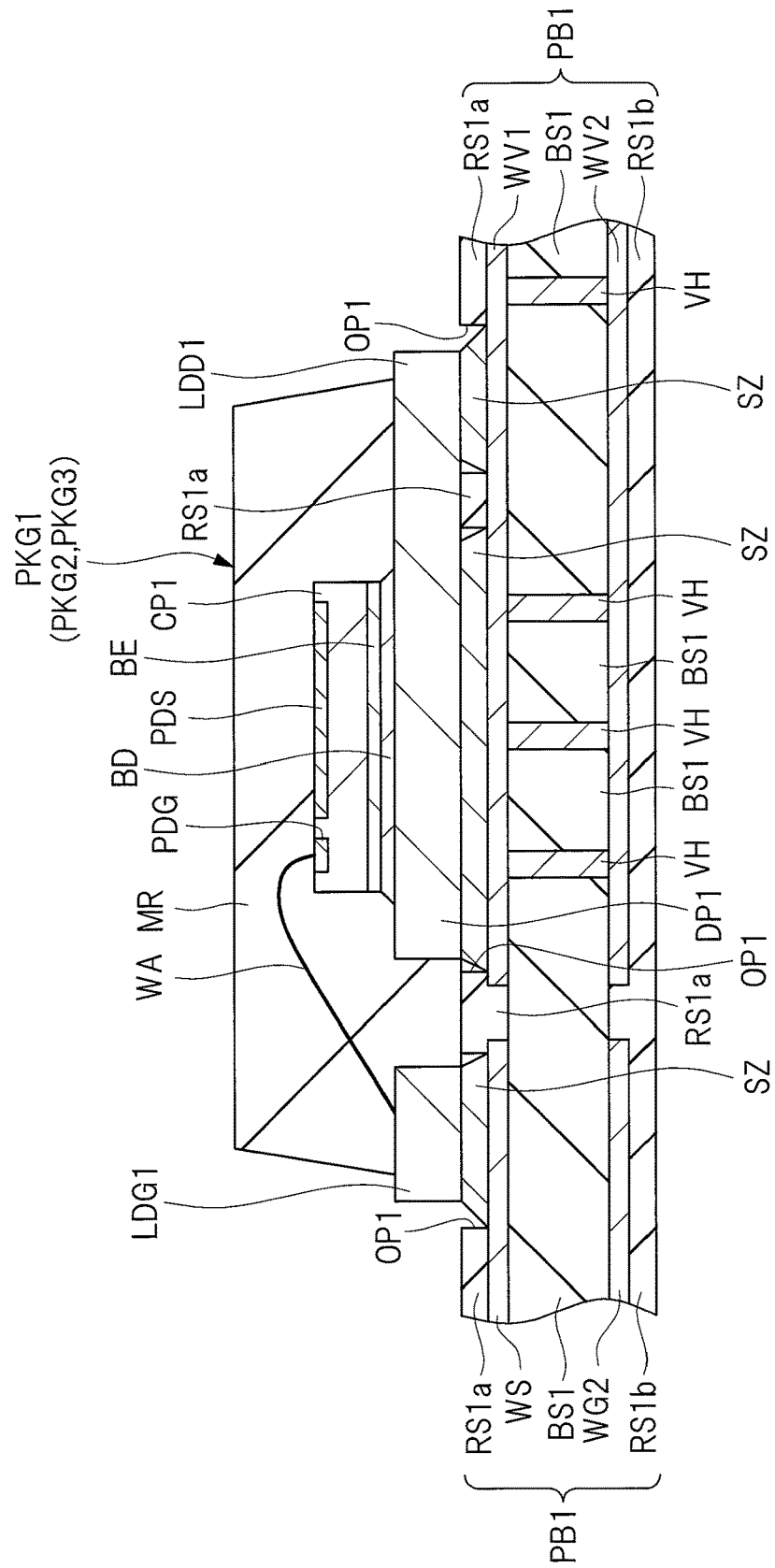
FIG. 21 is a sectional view of a structure in which the semiconductor device is mounted on the power wiring board.
Figure 22:
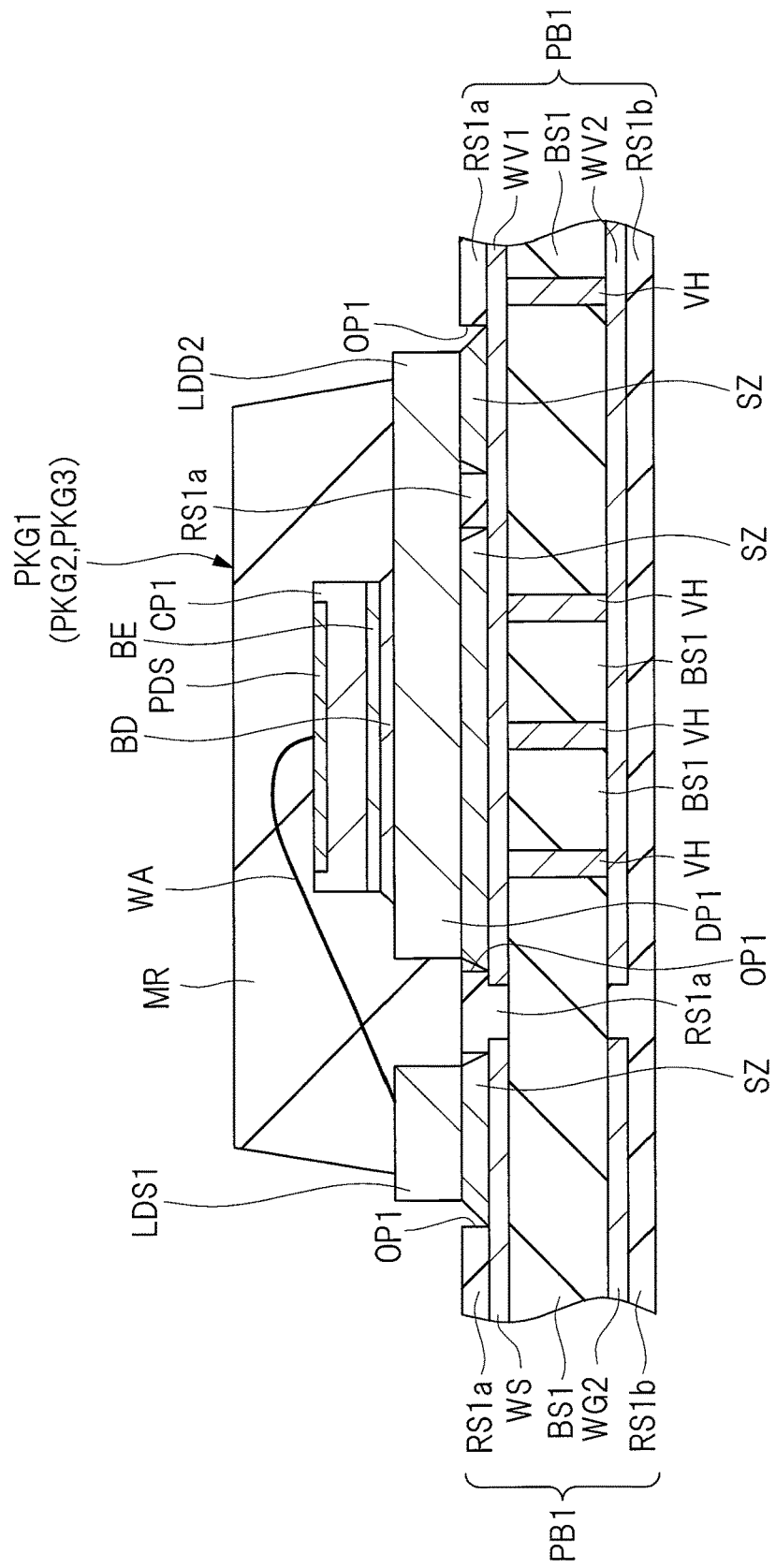
FIG. 22 is a sectional view of the structure in which the semiconductor device is mounted on the power wiring board.
Figure 23:
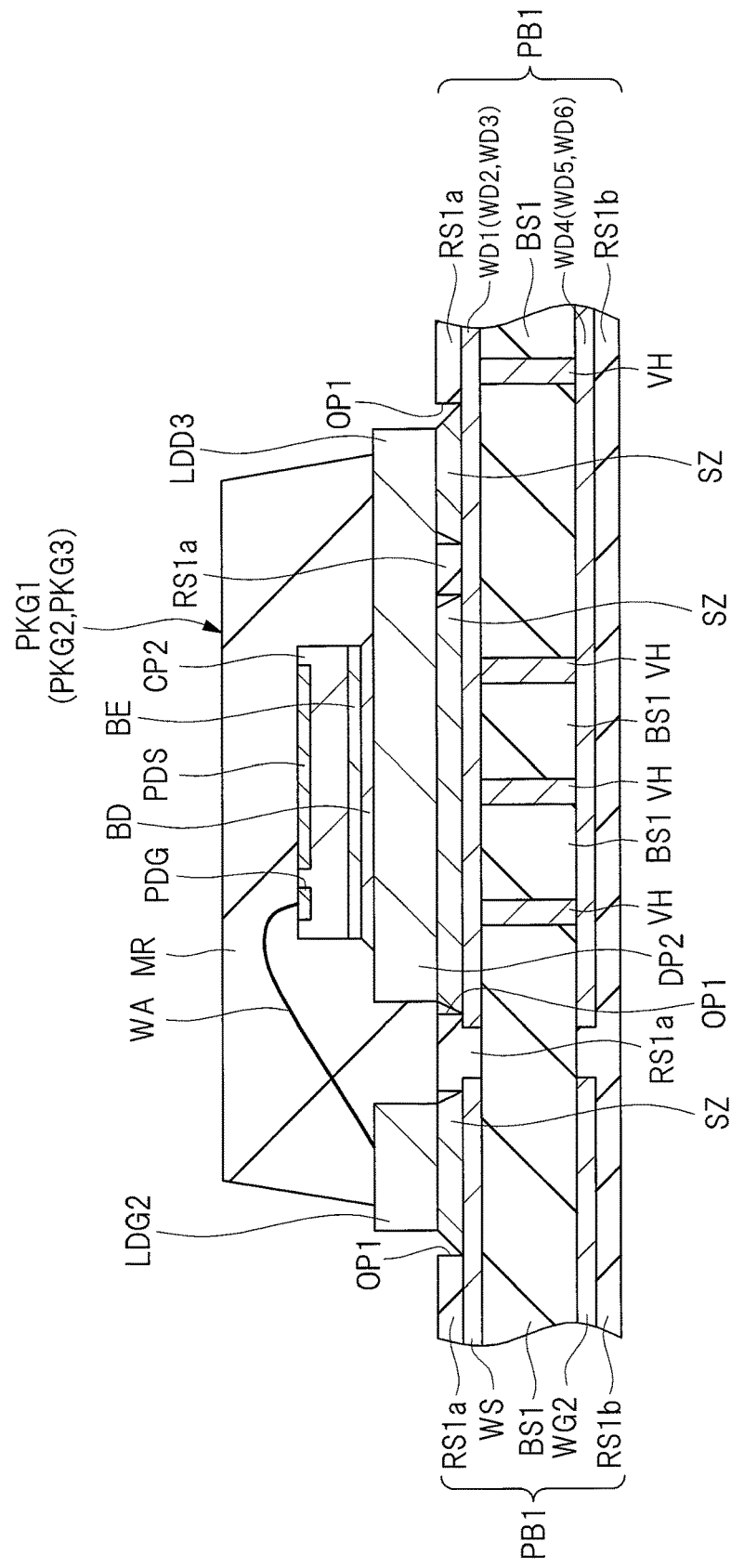
FIG. 23 is a sectional view of the structure in which the semiconductor device is mounted on the power wiring board.
Figure 24:
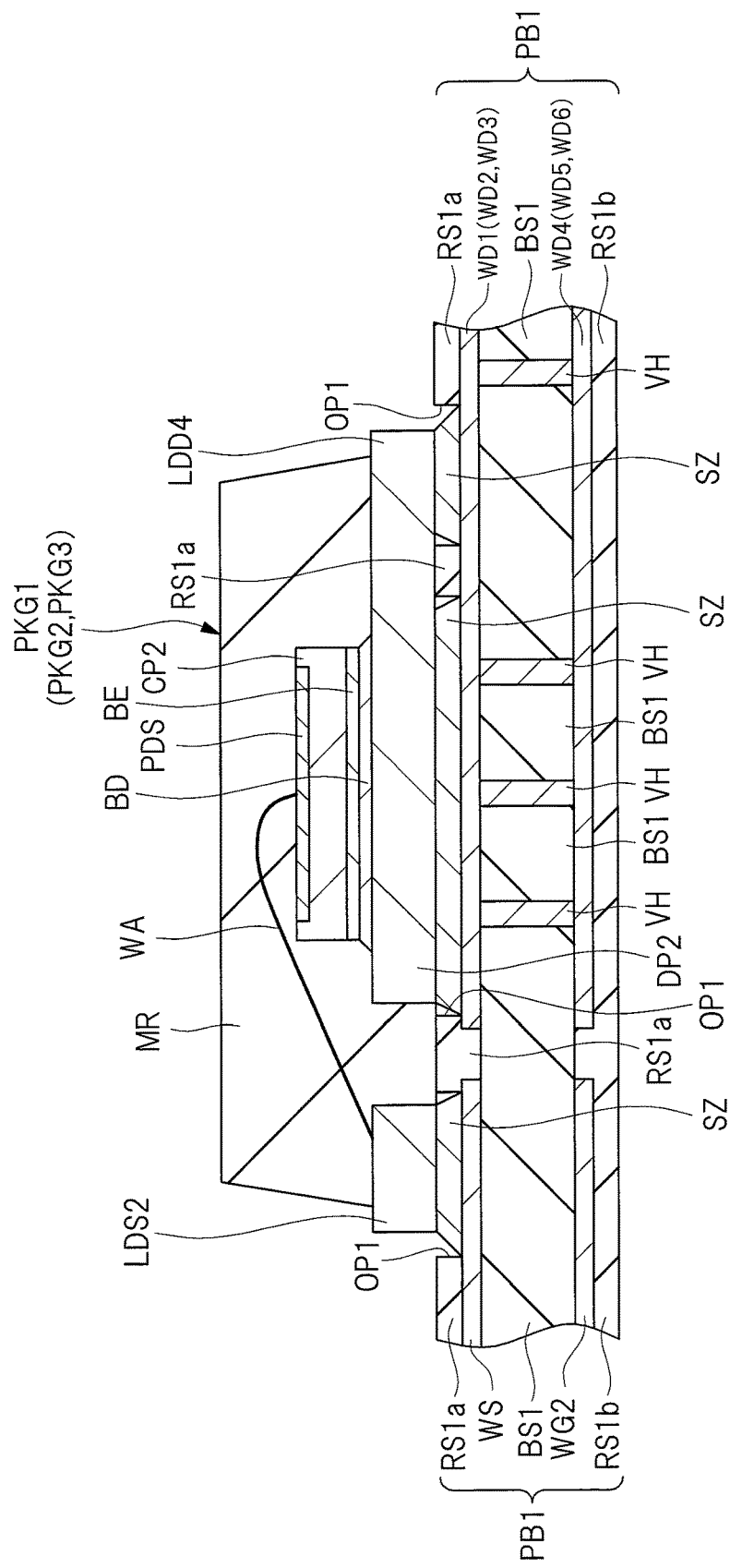
FIG. 24 is a sectional view of the structure in which the semiconductor device is mounted on the power wiring board.

FIGS. 21 to 24 are sectional views of a structure in which the semiconductor devices PKG1, PKG2, and PKG3 are mounted on the upper surface of the power wiring board PB1, and correspond to the sectional views of a part of FIG. 9. Among them, FIG. 21 is a cross section corresponding to FIG. 13 (that is, a cross section taken along the line A1-A1 in FIG. 12). Also, FIG. 22 is a cross section corresponding to FIG. 14 (that is, a cross section taken along the line A2-A2 in FIG. 12). In addition, FIG. 23 is a cross section corresponding to FIG. 15 (that is, across section taken along the line A3-A3 in FIG. 12). Further, FIG. 24 is a cross section corresponding to FIG. 16 (that is, a cross section taken along the line A4-A4 in FIG. 12). Note that the X direction and the Y direction shown in FIGS. 9 to 12, FIGS. 17 to 20, and FIGS. 25 and 26 described below are common directions. Then, it is possible to understand the position of the cross section in FIGS. 9 and 18 to which each of FIGS. 21 to 24 corresponds, by comparing FIGS. 9 and 18 with FIG. 12.

When the semiconductor device shown in FIGS. 21 to 24 is the semiconductor device PKG1, the output wiring shown in FIGS. 23 and 24 (that is, the output wiring electrically connected to the die pad DP1 of the semiconductor device PKG1) corresponds to the output wiring WD1 and the output wiring WD4.

Also in the case of the semiconductor device PKG2, the mounting structure thereof is the same as that of the semiconductor device PKG1. However, when the semiconductor device shown in FIGS. 21 to 24 is the semiconductor device PKG2 instead of the semiconductor device PKG1, the output wiring shown in FIGS. 23 and 24 (that is, the output wiring electrically connected to the die pad DP1 of the semiconductor device PKG2) corresponds to the output wiring WD2 and the output wiring WD5 instead of the output wiring WD1 and the output wiring WD4.

Further, also in the case of the semiconductor device PKG3, the mounting structure thereof is the same as that of the semiconductor device PKG1. However, when the semiconductor device shown in FIGS. 21 to 24 is the semiconductor device PKG3 instead of the semiconductor device PKG1, the output wiring shown in FIGS. 23 and 24 (that is, the output wiring electrically connected to the die pad DP1 of the semiconductor device PKG3) corresponds to the output wiring WD3 and the output wiring WD6 instead of the output wiring WD1 and the output wiring WD4.

In the power wiring board PB1, the wirings (WG1, WD1, WD2, WD3, WS, and WV1) formed on the upper surface side thereof are covered with the resist layer RS1a, and the wirings (WG2, WD4, WD5, WD6, and WV2) formed on the lower surface side thereof are covered with the resist layer RS1b. However, in the power wiring board PB1, a connection portion of the wiring with a terminal (electrode) of the electronic component (EC1) is exposed from the resist layer RS1a. Namely, as can be seen from FIGS. 9, 17 and 18, in the power wiring board PB1, the wirings (WG1, WD1, WD2, WD3, WS, and WV1) famed on the upper surface side thereof, which is a principle surface on which the electronic component EC1 is mounted, are covered with the resist layer RS1a, but the connection portion with the terminal of the electronic component (EC1) is exposed from the opening portion OP1 of the resist layer RS1a. Specifically, in the wirings (WG1, WD1, WD2, WD3, WS, and WV1) famed on the upper surface side of the power wiring board PB1, a part connected to each of the terminals (LDG1, LDG2, LDS1, LDS2, LDD1 to LDD4, DP1, and DP2) of the semiconductor devices PKG1, PKG2, and PKG3 and apart connected to each of the electrodes of the chip resistors R1a to R9a are exposed from the opening portion OP1 of the resist layer RS1a. Accordingly, the terminals or the electrodes of the semiconductor devices PKG1, PKG2, and PKG3 and the chip resistors R1a to R9a mounted on the upper surface of the power wiring board PB1 can be electrically connected to the wiring formed on the upper surface side of the power wiring board PB1 with a conductive bonding material (for example, solder).

First, the mounting structure of the semiconductor device PKG1 will be described.

As can be seen from FIGS. 9, 12, 18, 21, and 22, the die pad DP1 and the drain leads LDD1 and LDD2 of the semiconductor device PKG1 are overlapped with the power supply wiring WV1 formed on the upper surface of the power wiring board PB1 in a plan view, and are bonded and electrically connected to the power supply wiring WV1 through a conductive bonding material SZ (for example, solder). Thus, the back surface electrode BE of the semiconductor chip CP1 (that is, the drain of the power MOSFET 1) of the semiconductor device PKG1 is electrically connected to the power supply wiring WV1 through the die pad DP1 and the bonding material SZ, and is further electrically connected to the power supply connection pin PN1 through the power supply wiring WV1.

Also, as can be seen from FIGS. 9, 12, 18, 23, and 24, the die pad DP2 and the drain leads LDD3 and LDD4 of the semiconductor device PKG1 are overlapped with the output wiring WD1 formed on the upper surface of the power wiring board PB1 in a plan view, and are bonded and electrically connected to the output wiring WD1 through the conductive bonding material SZ (for example, solder). Thus, the back surface electrode BE of the semiconductor chip CP2 (that is, the drain of the power MOSFET 2) of the semiconductor device PKG1 is electrically connected to the output wiring WD1 through the die pad DP2 and the bonding material SZ, is further electrically connected to the connection pin BB1 through the output wiring WD1, and is further electrically connected to (the U-phase coil of) the motor MOT through the connection pin BB1.

Also, as can be seen from FIGS. 9, 12, 18, and 21, the gate lead LDG1 of the semiconductor device PKG1 is overlapped with the signal wiring WS formed on the upper surface of the power wiring board PB1 in a plan view, and is bonded and electrically connected to the signal wiring WS through the conductive bonding material SZ (for example, solder). The gate lead LDG1 of the semiconductor device PKG1 is electrically connected to one electrode of the chip resistor R2a through the signal wiring WS, and the other electrode of the chip resistor R2a is electrically connected to the signal pin PN3 through the signal wiring WS. Thus, the gate pad PDG of the semiconductor chip CP1 (that is, the gate of the power MOSFET 1) of the semiconductor device PKG1 is electrically connected to the signal wiring WS through the wire WA, the gate lead LDG1, and the bonding material SZ, and is further electrically connected to the signal pin PN3 through the signal wiring WS and the chip resistor R2a.

Also, as can be seen from FIGS. 9, 12, 18, and 23, the gate lead LDG2 of the semiconductor device PKG1 is overlapped with the signal wiring WS formed on the upper surface of the power wiring board PB1 in a plan view, and is bonded and electrically connected to the signal wiring WS through the conductive bonding material SZ (for example, solder). The gate lead LDG2 of the semiconductor device PKG1 is electrically connected to one electrode of the chip resistor R3a through the signal wiring WS, and the other electrode of the chip resistor R3a is electrically connected to the signal pin PN3 through the signal wiring WS. Thus, the gate pad PDG of the semiconductor chip CP2 (that is, the gate of the power MOSFET 2) of the semiconductor device PKG1 is electrically connected to the signal wiring WS through the wire WA, the gate lead LDG2, and the bonding material SZ, and is further electrically connected to the signal pin PN3 through the signal wiring WS and the chip resistor R3a.

Also, as can be seen from FIGS. 9, 12, 18, and 24, the source lead LDS2 of the semiconductor device PKG1 is overlapped with the signal wiring WS formed on the upper surface of the power wiring board PB1 in a plan view, and is bonded and electrically connected to the signal wiring WS through the conductive bonding material SZ (for example, solder). The source lead LDS2 of the semiconductor device PKG1 is electrically connected to one electrode of the chip resistor R1a through the signal wiring WS, and the other electrode of the chip resistor R1a is electrically connected to the ground wiring WG1 and the ground wiring WG2 through the signal wiring WS and the via portion VH. Namely, the source lead LDS2 of the semiconductor device PKG1 is electrically connected to the ground wirings WG1 and WG2 through the signal wiring WS, the chip resistor R1a, and the like. Thus, the source pad PDS of the semiconductor chip CP2 (that is, the source of the power MOSFET 2) of the semiconductor device PKG1 is electrically connected to the signal wiring WS through the wire WA, the source lead LDS2, and the bonding material SZ, and is further electrically connected to the ground wiring WG1 and the ground wiring WG2 through the signal wiring WS, the chip resistor R1a, and the like. Further, the source lead LDS2 of the semiconductor device PKG1 is electrically connected also to the signal pin PN3 through the signal wiring WS.

Also, as can be seen from FIGS. 9, 12, 18, and 22, the source lead LDS1 of the semiconductor device PKG1 is overlapped with the signal wiring WS formed on the upper surface of the power wiring board PB1 in a plan view, and is bonded and electrically connected to the signal wiring WS through the conductive bonding material SZ (for example, solder). The source lead LDS1 of the semiconductor device PKG1 is electrically connected to the signal pin PN3 through the signal wiring WS. Further, the signal wiring WS that is connected to the source lead LDS1 of the semiconductor device PKG1 is connected to the output wiring WD1. Therefore, the source lead LDS1 of the semiconductor device PKG1 is electrically connected to the output wiring WD1 through the signal wiring WS. Thus, the source pad PDS of the semiconductor chip CP1 (that is, the source of the power MOSFET 1) of the semiconductor device PKG1 is electrically connected to the signal wiring WS through the wire WA, the source lead LDS1, and the bonding material SZ, and is further electrically connected to the output wiring WD1 through the signal wiring WS.

Therefore, the source pad PDS of the semiconductor chip CP1 (the source of the power MOSFET 1) of the semiconductor device PKG1 is electrically connected to the back surface electrode BE of the semiconductor chip CP2 (the drain of the power MOSFET 1) of the semiconductor device PKG1 through the wire WA, the source lead LDS1, the bonding material SZ, the signal wiring WS, the output wiring WD1, the bonding material SZ, the die pad DP1, and the bonding material BD. Namely, by mounting the semiconductor device PKG1 on the power wiring board PB1, the source pad PDS of the semiconductor chip CP1 (the source of the power MOSFET 1) of the semiconductor device PKG1 and the back surface electrode BE of the semiconductor chip CP2 (the drain of the power MOSFET 1) of the semiconductor device PKG1 are electrically connected to each other.

Next, the mounting structure of the semiconductor device PKG2 will be described.

As can be seen from FIGS. 9, 12, 18, 21, and 22, the die pad DP1 and the drain leads LDD1 and LDD2 of the semiconductor device PKG2 are overlapped with the power supply wiring WV1 formed on the upper surface of the power wiring board PB1 in a plan view, and are bonded and electrically connected to the power supply wiring WV1 through the conductive bonding material SZ. Thus, the back surface electrode BE of the semiconductor chip CP1 (that is, the drain of the power MOSFET 3) of the semiconductor device PKG2 is electrically connected to the power supply wiring WV1 through the die pad DP1 and the bonding material SZ, and is further electrically connected to the power supply connection pin PN1 through the power supply wiring WV1.

Also, as can be seen from FIGS. 9, 12, 18, 23, and 24, the die pad DP2 and the drain leads LDD3 and LDD4 of the semiconductor device PKG2 are overlapped with the output wiring WD2 in a plan view, and are bonded and electrically connected to the output wiring WD2 through the conductive bonding material SZ. Thus, the back surface electrode BE of the semiconductor chip CP2 (that is, the drain of the power MOSFET 4) of the semiconductor device PKG2 is electrically connected to the output wiring WD2 through the die pad DP2 and the bonding material SZ, is further electrically connected to the connection pin BB2 through the output wiring WD2, and is further electrically connected to (the V-phase coil of) the motor MOT through the connection pin BB2.

Also, as can be seen from FIGS. 9, 12, 18, and 21, the gate lead LDG1 of the semiconductor device PKG2 is overlapped with the signal wiring WS formed on the upper surface of the power wiring board PB1 in a plan view, and is bonded and electrically connected to the signal wiring WS through the conductive bonding material SZ. The gate lead LDG1 of the semiconductor device PKG2 is electrically connected to one electrode of the chip resistor R5a through the signal wiring WS, and the other electrode of the chip resistor R5a is electrically connected to the signal pin PN3 through the signal wiring WS. Thus, the gate pad PDG of the semiconductor chip CP1 (that is, the gate of the power MOSFET 3) of the semiconductor device PKG2 is electrically connected to the signal wiring WS through the wire WA, the gate lead LDG1, and the bonding material SZ, and is further electrically connected to the signal pin PN3 through the signal wiring WS and the chip resistor R5a.

Also, as can be seen from FIGS. 9, 12, 18, and 23, the gate lead LDG2 of the semiconductor device PKG2 is overlapped with the signal wiring WS formed on the upper surface of the power wiring board PB1 in a plan view, and is bonded and electrically connected to the signal wiring WS through the conductive bonding material SZ. The gate lead LDG2 of the semiconductor device PKG2 is electrically connected to one electrode of the chip resistor R6a through the signal wiring WS, and the other electrode of the chip resistor R6a is electrically connected to the signal pin PN3 through the signal wiring WS. Thus, the gate pad PDG of the semiconductor chip CP2 (that is, the gate of the power MOSFET 4) of the semiconductor device PKG2 is electrically connected to the signal wiring WS through the wire WA, the gate lead LDG2, and the bonding material SZ, and is further electrically connected to the signal pin PN3 through the signal wiring WS and the chip resistor R6a.

Also, as can be seen from FIGS. 9, 12, 18, and 24, the source lead LDS2 of the semiconductor device PKG2 is overlapped with the signal wiring WS formed on the upper surface of the power wiring board PB1 in a plan view, and is bonded and electrically connected to the signal wiring WS through the conductive bonding material SZ. The source lead LDS2 of the semiconductor device PKG2 is electrically connected to one electrode of the chip resistor R4a through the signal wiring WS, and the other electrode of the chip resistor R4a is electrically connected to the ground wiring WG1 and the ground wiring WG2 through the signal wiring WS and the via portion VH. Namely, the source lead LDS2 of the semiconductor device PKG2 is electrically connected to the ground wirings WG1 and WG2 through the signal wiring WS, the chip resistor R4a, and the like. Thus, the source pad PDS of the semiconductor chip CP2 (that is, the source of the power MOSFET 4) of the semiconductor device PKG2 is electrically connected to the signal wiring WS through the wire WA, the source lead LDS2, and the bonding material SZ, and is further electrically connected to the ground wiring WG1 and the ground wiring WG2 through the signal wiring WS, the chip resistor R4a, and the like. Further, the source lead LDS2 of the semiconductor device PKG2 is electrically connected also to the signal pin PN3 through the signal wiring WS.

Also, as can be seen from FIGS. 9, 12, 18, and 22, the source lead LDS1 of the semiconductor device PKG2 is overlapped with the signal wiring WS formed on the upper surface of the power wiring board PB1 in a plan view, and is bonded and electrically connected to the signal wiring WS through the conductive bonding material SZ. The source lead LDS1 of the semiconductor device PKG2 is electrically connected to the signal pin PN3 through the signal wiring WS. Further, the signal wiring WS connected to the source lead LDS1 of the semiconductor device PKG2 is connected to the output wiring WD2. Therefore, the source lead LDS1 of the semiconductor device PKG2 is electrically connected to the output wiring WD2 through the signal wiring WS. Thus, the source pad PDS of the semiconductor chip CP1 (that is, the source of the power MOSFET 3) of the semiconductor device PKG2 is electrically connected to the signal wiring WS through the wire WA, the source lead LDS1, and the bonding material SZ, and is further electrically connected to the output wiring WD2 through the signal wiring WS.

Therefore, the source pad PDS of the semiconductor chip CP1 (the source of the power MOSFET 3) of the semiconductor device PKG2 is electrically connected to the back surface electrode BE of the semiconductor chip CP2 (the drain of the power MOSFET 4) of the semiconductor device PKG2 through the wire WA, the source lead LDS1, the bonding material SZ, the signal wiring WS, the output wiring WD2, the bonding material SZ, the die pad DP1, and the bonding material BD. Namely, by mounting the semiconductor device PKG2 on the power wiring board PB1, the source pad PDS of the semiconductor chip CP1 (the source of the power MOSFET 3) of the semiconductor device PKG2 and the back surface electrode BE of the semiconductor chip CP2 (the drain of the power MOSFET 4) of the semiconductor device PKG2 are electrically connected to each other.

Next, the mounting structure of the semiconductor device PKG3 will be described.

As can be seen from FIGS. 9, 12, 18, 21, and 22, the die pad DP1 and the drain leads LDD1 and LDD2 of the semiconductor device PKG3 are overlapped with the power supply wiring WV1 formed on the upper surface of the power wiring board PB1 in a plan view, and are bonded and electrically connected to the power supply wiring WV1 through the conductive bonding material SZ. Thus, the back surface electrode BE of the semiconductor chip CP1 (that is, the drain of the power MOSFET 5) of the semiconductor device PKG3 is electrically connected to the power supply wiring WV1 through the die pad DP1 and the bonding material SZ, and is further electrically connected to the power supply connection pin PN1 through the power supply wiring WV1.

Also, as can be seen from FIGS. 9, 12, 18, 23, and 24, the die pad DP2 and the drain leads LDD3 and LDD4 of the semiconductor device PKG3 are overlapped with the output wiring WD3 in a plan view, and are bonded and electrically connected to the output wiring WD3 through the conductive bonding material SZ. Thus, the back surface electrode BE of the semiconductor chip CP2 (that is, the drain of the power MOSFET 6) of the semiconductor device PKG3 is electrically connected to the output wiring WD3 through the die pad DP2 and the bonding material SZ, is further electrically connected to the connection pin BB3 through the output wiring WD3, and is further electrically connected to (the W-phase coil of) the motor MOT through the connection pin BB3.

Also, as can be seen from FIGS. 9, 12, 18, and 21, the gate lead LDG1 of the semiconductor device PKG3 is overlapped with the signal wiring WS formed on the upper surface of the power wiring board PB1 in a plan view, and is bonded and electrically connected to the signal wiring WS through the conductive bonding material SZ. The gate lead LDG1 of the semiconductor device PKG3 is electrically connected to one electrode of the chip resistor R8a through the signal wiring WS, and the other electrode of the chip resistor R8a is electrically connected to the signal pin PN3 through the signal wiring WS. Thus, the gate pad PDG of the semiconductor chip CP1 (that is, the gate of the power MOSFET 5) of the semiconductor device PKG3 is electrically connected to the signal wiring WS through the wire WA, the gate lead LDG1, and the bonding material SZ, and is further electrically connected to the signal pin PN3 through the signal wiring WS and the chip resistor R8a.

Also, as can be seen from FIGS. 9, 12, 18, and 23, the gate lead LDG2 of the semiconductor device PKG3 is overlapped with the signal wiring WS formed on the upper surface of the power wiring board PB1 in a plan view, and is bonded and electrically connected to the signal wiring WS through the conductive bonding material SZ. The gate lead LDG2 of the semiconductor device PKG3 is electrically connected to one electrode of the chip resistor R9a through the signal wiring WS, and the other electrode of the chip resistor R9a is electrically connected to the signal pin PN3 through the signal wiring WS. Thus, the gate pad PDG of the semiconductor chip CP2 (that is, the gate of the power MOSFET 6) of the semiconductor device PKG3 is electrically connected to the signal wiring WS through the wire WA, the gate lead LDG2, and the bonding material SZ, and is further electrically connected to the signal pin PN3 through the signal wiring WS and the chip resistor R9a.

Also, as can be seen from FIGS. 9, 12, 18, and 24, the source lead LDS2 of the semiconductor device PKG3 is overlapped with the signal wiring WS formed on the upper surface of the power wiring board PB1 in a plan view, and is bonded and electrically connected to the signal wiring WS through the conductive bonding material SZ. The source lead LDS2 of the semiconductor device PKG3 is electrically connected to one electrode of the chip resistor R7a through the signal wiring WS, and the other electrode of the chip resistor R7a is electrically connected to the ground wiring WG1 and the ground wiring WG2 through the signal wiring WS and the via portion VH. Namely, the source lead LDS2 of the semiconductor device PKG3 is electrically connected to the ground wirings WG1 and WG2 through the signal wiring WS, the chip resistor R7a, and the like. Thus, the source pad PDS of the semiconductor chip CP2 (that is, the source of the power MOSFET 6) of the semiconductor device PKG3 is electrically connected to the signal wiring WS through the wire WA, the source lead LDS2, and the bonding material SZ, and is further electrically connected to the ground wiring WG1 and the ground wiring WG2 through the signal wiring WS, the chip resistor R7a, and the like. Further, the source lead LDS2 of the semiconductor device PKG3 is electrically connected also to the signal pin PN3 through the signal wiring WS.

Also, as can be seen from FIGS. 9, 12, 18, and 22, the source lead LDS1 of the semiconductor device PKG3 is overlapped with the signal wiring WS formed on the upper surface of the power wiring board PB1 in a plan view, and is bonded and electrically connected to the signal wiring WS through the conductive bonding material SZ. The source lead LDS1 of the semiconductor device PKG3 is electrically connected to the signal pin PN3 through the signal wiring WS. Further, the signal wiring WS connected to the source lead LDS1 of the semiconductor device PKG3 is connected to the output wiring WD3. Therefore, the source lead LDS1 of the semiconductor device PKG3 is electrically connected to the output wiring WD3 through the signal wiring WS. Thus, the source pad PDS of the semiconductor chip CP1 (that is, the source of the power MOSFET 5) of the semiconductor device PKG3 is electrically connected to the signal wiring WS through the wire WA, the source lead LDS1, and the bonding material SZ, and is further electrically connected to the output wiring WD3 through the signal wiring WS.

Therefore, the source pad PDS of the semiconductor chip CP1 (the source of the power MOSFET 5) of the semiconductor device PKG3 is electrically connected to the back surface electrode BE of the semiconductor chip CP2 (the drain of the power MOSFET 6) of the semiconductor device PKG3 through the wire WA, the source lead LDS1, the bonding material SZ, the signal wiring WS, the output wiring WD3, the bonding material SZ, the die pad DP1, and the bonding material BD. Namely, by mounting the semiconductor device PKG3 on the power wiring board PB1, the source pad PDS of the semiconductor chip CP1 (the source of the power MOSFET 5) of the semiconductor device PKG3 and the back surface electrode BE of the semiconductor chip CP2 (the drain of the power MOSFET 6) of the semiconductor device PKG3 are electrically connected to each other.

As described above, the semiconductor devices PKG1, PKG2, and PKG3 are mounted on the upper surface of the power wiring board PB1. The die pad DP1 of the semiconductor device PKG1, the die pad DP1 of the semiconductor device PKG2, and the die pad DP1 of the semiconductor device PKG3 are electrically connected to the common power supply wiring WV1. Accordingly, the power supply potential VIN is supplied from the power supply connection pin PN1 through the power supply wiring WV1 to the die pad DP1 of each of the semiconductor devices PKG1, PKG2, and PKG3, and thus to the back surface electrode BE of the semiconductor chip CP1 of each of the semiconductor devices PKG1, PKG2, and PKG3. Also, the die pad DP2 of the semiconductor device PKG1 is electrically connected to the output wiring WD1, the die pad DP2 of the semiconductor device PKG2 is electrically connected to the output wiring WD2, and the die pad DP2 of the semiconductor device PKG3 is electrically connected to the output wiring WD3. Accordingly, output from the die pad DP2 of the semiconductor device PKG1 is supplied to the connection pin BB1 through the output wiring WD1, output from the die pad DP2 of the semiconductor device PKG2 is supplied to the connection pin BB2 through the output wiring WD2, and output from the die pad DP2 of the semiconductor device PKG3 is supplied to the connection pin BB3 through the output wiring WD3.

<Wiring Layout of Power Wiring Board PB1 and the Like>

In the present embodiment, a wiring layout, a mounting structure of electronic components, a layout of the holes (HP1, HP2, HP3, HM1, HM2, HM3, HT1, and NH1) and the like in the power wiring board PB1 are devised. The devised points will be described hereinafter.

The planar shape of the power wiring board PB1 is circular. Accordingly, the power wiring board PB1 can be attached to a device having a circular planar shape (here, the motor MOT) without useless space.

The plurality of holes HP3 through which the signal pins PN3 are inserted are provided in the power wiring board PB1. The plurality of holes HP3 are arrayed (arranged) substantially in the X direction in a plan view. The plurality of holes HP3 are preferably arrayed in a row substantially in the X direction.

Hereinafter, an entire array of the plurality of holes HP3 in the power wiring board PB1 is referred to as a "row of the holes HP3".

In a plan view, it is preferable that the row of the holes HP3 is disposed at a position where the holes HP3 pass near the center of the circular power wiring board PB1. Thus, it is preferable that the row of the holes HP3 is disposed at a position where the holes HP3 form substantially a diameter of the circular power wiring board PB1. Accordingly, under the condition that the diameter of the power wiring board PB1 is constant, the number of holes HP3 that can be provided in the power wiring board PB1 can be increased, so that it is possible to increase the number of signal pins PN3 that can be provided in the power wiring board PB1. Therefore, it is possible to efficiently increase the number of signal pins PN3 that connect the power wiring board PB1 and the control wiring board PB2. From a different point of view, it is possible to downsize (reduce an area of) the power wiring board PB1 while maintaining the number of signal pins PN3.

The plurality of semiconductor devices PKG1, PKG2, and PKG3 are disposed so as to be adjacent to the row of the holes HP3 in the Y direction on the upper surface of the power wiring board PB1, and the semiconductor device PKG1, the semiconductor device PKG2, and the semiconductor device PKG3 are arrayed (arranged) in the X direction in this order. Namely, in the power wiring board PB1, the plurality of holes HP3 and the plurality of signal pins PN3 inserted therethrough are arrayed substantially in the X direction, and the plurality of semiconductor devices PKG1, PKG2, and PKG3 are also arrayed in the X direction. Accordingly, each of the plurality of semiconductor devices PKG1, PKG2, and PKG3 faces the signal pins PN3 in the Y direction, so that it becomes easier to connect the semiconductor devices PKG1, PKG2, and PKG3 and the plurality of signal pins PN3 through the signal wiring WS and the like.

Hereinafter, an entire array of the semiconductor device PKG1, the semiconductor device PKG2, and the semiconductor device PKG3 in the power wiring board PB1 is referred to as a "row of the semiconductor devices PKG1, PKG2, and PKG3".

On the upper surface of the power wiring board PB1, the signal wiring WS is disposed between the row of the holes HP3 and the row of the semiconductor devices PKG1, PKG2, and PKG3. Accordingly, it becomes easier to electrically connect the semiconductor devices PKG1, PKG2, and PKG3 and the signal pins PN3 inserted through the holes HP3 through the signal wiring WS.

Also, on the upper surface of the power wiring board PB1, the chip resistors R1a, R2a, R3a, R4a, R5a, R6a, R7a, R8a, and R9a are disposed closer to the row of the holes HP3 than the row of the semiconductor devices PKG1, PKG2, and PKG3. Accordingly, it becomes easier to connect the chip resistors R1a, R2a, R3a, R4a, R5a, R6a, R7a, R8a, and R9a to the signal pins PN3 or the semiconductor devices PKG1, PKG2, and PKG3. Further, on the upper surface of the power wiring board PB1, it becomes easier to secure areas of the output wirings WD1, WD2, and WD3 and the power supply wiring WV1.

Also, on the upper surface of the power wiring board PB1, the chip resistors R2a and R3a are disposed between the semiconductor device PKG1 and the row of the holes HP3, the chip resistors R5a and R6a are disposed between the semiconductor device PKG2 and the row of the holes HP3, and the chip resistors R8a and R9a are disposed between the semiconductor device PKG3 and the row of the holes HP3. Accordingly, it becomes easier to connect the gate leads (LDG1 and LDG2) of each of the semiconductor devices PKG1, PKG2, and PKG3 to the signal pins PN3 respectively through the signal wiring WS and the chip resistors (R2a, R3a, R5a, R6a, R8a, and R9a).

Also, on the upper surface of the power wiring board PB1, the chip resistor 1a is disposed next to the semiconductor device PKG1 and between the output wiring WD1 and the row of the holes HP3, the chip resistor 4a is disposed next to the semiconductor device PKG2 and between the output wiring WD2 and the row of the holes HP3, and the chip resistor 7a is disposed next to the semiconductor device PKG3 and between the output wiring WD3 and the row of the holes HP3. Accordingly, it becomes easier to connect the source leads LDS2 of the semiconductor devices PKG1, PKG2, and PKG3 to the chip resistors R1a, R4a, and R7a through the signal wiring WS.

Also, on the upper surface of the power wiring board PB1, the plurality of holes HM1, HM2, and HM3 are provided so as to be adjacent to the row of the semiconductor devices PKG1, PKG2, and PKG3 in the Y direction, and the holes HM1, HM2, and HM3 are arrayed (arranged) in the X direction in this order. Namely, in the power wiring board PB1, the plurality of holes HP3 and the plurality of signal pins PN3 inserted therethrough are arrayed substantially in the X direction, the plurality of semiconductor devices PKG1, PKG2, and PKG3 are also arrayed in the X direction, and the plurality of holes HM1, HM2, and HM3 and the plurality of connection pins BB1, BB2, and BB3 inserted therethrough are also arrayed in the X direction.

Hereinafter, an entire array of the plurality of holes HM1, HM2, and HM3 in the power wiring board PB1 is referred to as a "row of the holes HM1, HM2, and HM3".

On the upper surface of the power wiring board PB1, when viewed in the Y direction, the row of the holes HP3 faces the row of the semiconductor devices PKG1, PKG2, and PKG3 in the Y direction, the row of the holes HM1, HM2, and HM3 faces the row of the semiconductor devices PKG1, PKG2, and PKG3 in the Y direction, and the row of the semiconductor devices PKG1, PKG2, and PKG3 is disposed between the row of the holes HP3 and the row of the holes HM1, HM2, and HM3. Accordingly, it becomes easier to connect the semiconductor devices PKG1, PKG2, and PKG3 and the signal pins PN3 through the signal wiring WS and the like, and it becomes easier to connect the semiconductor devices PKG1, PKG2, and PKG3 and the connection pins BB1, BB2, and BB3 through the output wirings WD1, WD2, and WD3.

Further, on the upper surface of the power wiring board PB1, the hole HM1 is spaced apart from the semiconductor device PKG1 substantially in the Y direction, the hole HM2 is spaced apart from the semiconductor device PKG2 substantially in the Y direction, and the hole HM3 is spaced apart from the semiconductor device PKG3 substantially in the Y direction.

On the upper surface of the power wiring board PB1, the output wirings WD1, WD2, and WD3 are disposed between the row of the holes HM1, HM2, and HM3 and the row of the semiconductor devices PKG1, PKG2, and PKG3. Accordingly, it becomes easier to connect the semiconductor devices PKG1, PKG2, and PKG3 and the connection pins BB1, BB2, and BB3 inserted through the holes HM1, HM2, and HM3 through the output wirings WD1, WD2, and WD3.

On the upper surface of the power wiring board PB1, each of the output wirings WD1, WD2, and WD3 extends in the Y direction. Namely, on the upper surface of the power wiring board PB1, the output wiring WD1 extends in the Y direction so as to connect the semiconductor device PKG1 and the hole HM1 (or the connection pin BB1 inserted through the hole HM1). The die pad DP2 (and the drain leads LDD3 and LDD4) of the semiconductor device PKG1 is connected at one end side of the output wiring WD1 in the Y direction, the hole HM1 is provided at the other end side thereof in the Y direction, and the connection pin BB1 is inserted through the hole HM1. The hole HM1 is enclosed in the output wiring WD1 in a plan view.

Also, on the upper surface of the power wiring board PB1, the output wiring WD2 extends in the Y direction so as to connect the semiconductor device PKG2 and the hole HM2 (or the connection pin BB2 inserted through the hole HM2). The die pad DP2 (and the drain leads LDD3 and LDD4) of the semiconductor device PKG2 is connected at one end side of the output wiring WD2 in the Y direction, the hole HM2 is provided at the other end side thereof in the Y direction, and the connection pin BB2 is inserted through the hole HM2. The hole HM2 is enclosed in the output wiring WD2 in a plan view.

Also, on the upper surface of the power wiring board PB1, the output wiring WD3 extends in the Y direction so as to connect the semiconductor device PKG3 and the hole HM3 (or the connection pin BB3 inserted through the hole HM3). The die pad DP2 (and the drain leads LDD3 and LDD4) of the semiconductor device PKG3 is connected at one end side of the output wiring WD3 in the Y direction, the hole HM3 is provided at the other end side thereof in the Y direction, and the connection pin BB3 is inserted through the hole HM3. The hole HM3 is enclosed in the output wiring WD3 in a plan view.

The output wirings WD1, WD2, and WD3 are spaced apart in the X direction and are arranged in the X direction in the order of the output wiring WD1, the output wiring WD2, and the output wiring WD3. By connecting the semiconductor devices PKG1, PKG2, and PKG3 and the connection pins BB1, BB2, and BB3 by the output wirings WD1, WD2, and WD3 extending in the Y direction, it is possible to connect the semiconductor devices PKG1, PKG2, and PKG3 and the connection pins BB1, BB2, and BB3 with low resistance.

Further, as shown in FIG. 18, on the upper surface of the power wiring board PB1, the power supply wiring WV1 integrally includes a part extending in the Y direction so as to be adjacent to each of the output wirings WD1, WD2, and WD3 in the X direction, and a part extending along an outer circumference of the upper surface of the power wiring board PB1 and connecting (coupling) the parts extending in the Y direction together. Specifically, the power supply wiring WV1 integrally includes a part located between the output wiring WD2 and the output wiring WD3 and extending in the Y direction, a part located between the output wiring WD1 and the output wiring WD2 and extending in the Y direction, a part adjacent to the output wiring WD1 in the X direction on a side opposite to a side adjacent to the output wiring WD2 and extending in the Y direction, and a part extending along the outer circumference of the upper surface of the power wiring board PB1 so as to couple these parts.

The power supply wiring WV1 extends in the Y direction so as to be adjacent to each of the output wirings WD1, WD2, and WD3 in the X direction. Therefore, it is possible to dispose the semiconductor device PKG1 so as to extend over both of the power supply wiring WV1 and the output wiring WD1 in a plan view. Also, it is possible to dispose the semiconductor device PKG2 so as to extend over both of the power supply wiring WV1 and the output wiring WD2. Further, it is possible to dispose the semiconductor device PKG3 so as to extend over both of the power supply wiring WV1 and the output wiring WD3. Namely, it is possible to dispose the die pad DP1 of each of the semiconductor devices PKG1, PKG2, and PKG3 on the power supply wiring WV1, to dispose the die pad DP2 of the semiconductor device PKG1 on the output wiring WD1, to dispose the die pad DP2 of the semiconductor device PKG2 on the output wiring WD2, and to dispose the die pad DP2 of the semiconductor device PKG3 on the output wiring WD3. Accordingly, it is possible to electrically connect the die pad DP1 of each of the semiconductor devices PKG1, PKG2, and PKG3 to the common power supply wiring WV1, to electrically connect the die pad DP2 of the semiconductor device PKG1 to the output wiring WD1, to electrically connect the die pad DP2 of the semiconductor device PKG2 to the output wiring WD2, and to electrically connect the die pad DP2 of the semiconductor device PKG3 to the output wiring WD3.

Also, in the power wiring board PB1, the hole HP1 through which the power supply connection pin PN1 is inserted is provided at a position adjacent to the row of the holes HM1, HM2, and HM3 in the X direction in a plan view. Specifically, the hole HP1 is disposed at a position adjacent to the hole HM1 in the X direction on a side opposite to a side adjacent to the hole HM2. Therefore, the hole HM1 is located between the hole HP1 and the hole HM2. Thus, the hole HP1, the hole HM1, the hole HM2, and the hole HM3 are arranged in the X direction in this order. The hole HP1 is enclosed in the power supply wiring WV1 and enclosed in the power supply wiring WV2 in a plan view.

Also, as shown in FIG. 18, when the upper surface of the power wiring board PB1 is divided into two regions with the row of the semiconductor devices PKG1, PKG2, and PKG3 as a boundary, the power supply wiring WV1, the output wirings WD1, WD2, and WD3, and the holes HP1, HM1, HM2, HM3, and NH1 are disposed in one region, and the ground wiring WG1, the signal wiring WS and the holes HP2, HP3, HT1, and NH1 are disposed in the other region.

Namely, on the upper surface of the power wiring board PB1, the power supply wiring WV1, the output wirings WD1, WD2, and WD3, and the holes HP1, HM1, HM2, and HM3 are provided on one side of both sides (both sides in the Y direction) of the row of the semiconductor devices PKG1, PKG2, and PKG3. Accordingly, it becomes easier to supply the power supply potential VIN from the common power supply wiring WV1 to the die pad DP1 of each of the semiconductor devices PKG1, PKG2, and PKG3. Further, it becomes easier to connect the die pad DP2 of the semiconductor device PKG1 to the connection pin BB1 through the output wiring WD1, to connect the die pad DP2 of the semiconductor device PKG2 to the connection pin BB2 through the output wiring WD2, and to connect the die pad DP2 of the semiconductor device PKG3 to the connection pin BB3 through the output wiring WD3.

Also, on the upper surface of the power wiring board PB1, the ground wiring WG1, the signal wiring WS, and the holes HP2, HP3, and HT1 are provided on the other side of both sides (both sides in the Y direction) of the row of the semiconductor devices PKG1, PKG2, and PKG3, and the ground wiring WG1 is formed in a substantially entire region where the signal wiring WS is not formed. Accordingly, it becomes easier to connect the semiconductor devices PKG1, PKG2, and PKG3, the chip resistors R1$a$ to R9$a$, and the signal pins PN3 through the signal wiring WS, and to increase an area of the ground wiring WG1. For example, it is possible to make the area of the ground wiring WG1 larger than an area of a region where the signal wiring WS is formed and larger than an area of each of the output wirings WD1, WD2, and WD3. By increasing the area of the ground wiring WG1, it becomes easier to prevent influence of noise.

As can be seen from the comparison between FIG. 18 and FIG. 19, when the lower surface of the power wiring board PB1 is divided into two regions with the row of the semiconductor devices PKG1, PKG2, and PKG3 as the boundary, the power supply wiring WV2, the output wirings WD4, WD5, and WD6, and the holes HP1, HM1, HM2, HM3, and NH1 are disposed in one region, and the ground wiring WG2 and the holes HP2, HP3, HT1, and NH1 are disposed in the other region. Since the signal wiring WS is not famed on the lower surface of the power wiring board PB1, the power supply wiring WV2 and the output wirings WD4, WD5, and WD6 are formed on one side of both sides (both sides in the Y direction) of the row of the semiconductor devices PKG1, PKG2, and PKG3, and the ground wiring WG2 is formed in a substantially entire region on the other side thereof. Accordingly, it is possible to increase an area of the ground wiring WG2 and to easily prevent the influence of noise. Further, on the lower surface of the power wiring board PB1, the ground wiring WG2 is formed over the entire region overlapping the region where the signal wiring WS is famed on the upper surface side in a plan view, and it is thus possible to further improve noise resistance of the signal wiring WS. In addition, in a plan view, the power supply wiring WV2 is formed in a region that substantially overlaps (coincides with) the power supply wiring WV1, the output wiring WD4 is formed in a region that substantially overlaps (coincides with) the output wiring WD1, the output wiring WD5 is famed in a region that substantially overlaps (coincides with) the output wiring WD2, and the output wiring WD6 is formed in a region that substantially overlaps (coincides with) the output wiring WD3.

Also, in the power wiring board PB1, the hole HP2 through which the ground connection pin PN2 is inserted is provided at a position adjacent to the row of the holes HP3 in the X direction in a plan view. The hole HP2 is enclosed in the ground wiring WG1 and enclosed in the ground wiring WG2 in a plan view.

Also, in the power wiring board PB1, the hole NH1 through which the screw NG1 for fixing is inserted is provided. It is preferable that the fixing hole NH1 is provided at a plurality of places in the power wiring board PB1, and it is more preferable that the hole NH1 is provided at three places in the power wiring board PB1 in consideration of the relation between the improvement of stability by increasing fixing places and the reduction of an effective wiring area.

Also, a wiring board in which a wiring layer is formed on the upper surface and the lower surface of the base material layer BS1 is used as the power wiring board PB1, and the power wiring board PB1 has two wiring layers. Therefore, it is possible to reduce a manufacturing cost of the power wiring board PB1. Although the wiring board having two wiring layers has been described as an example here, it is also possible to use a wiring board having four or six wiring layers.

Also, in the present embodiment, a principle surface (lower surface) on a side opposite to a principle surface (upper surface) of the power wiring board PB1 on which the semiconductor devices PKG1, PKG2, and PKG3 are mounted faces the upper surface of the motor MOT. As another embodiment, the power wiring board PB1 may be turned upside down. In this case, the principle surface of the power wiring board PB1 on which the power supply wiring WV1, the output wirings MD1, MD2, and MD3, the ground wiring MG1, and the signal wiring MS are formed and the semiconductor devices PKG1, PKG2, and PKG3 and the chip resistors Rla to R9a are mounted faces the upper surface of the motor MOT.

Further, in the present embodiment, of the control wiring board PB2 and the power wiring board PB1, the power wiring board PB1 is disposed on a side closer to the motor MOT. As another embodiment, it is also possible to change vertical positions of the control wiring board PB2 and the power wiring board PB1 with each other so as to dispose the control wiring board PB2 on the side closer to the motor MOT. However, the case where the power wiring board PB1 is disposed closer to the motor MOT than the control wiring board PB2 as in the present embodiment is more preferable because it is easier to transmit an output current from the power wiring board PB1 to (the coil of) the motor MOT.

<Main Features and Effects>

The electronic device of the present embodiment includes the power wiring board PB1 (first wiring board) having a plurality of terminals and the plurality of semiconductor devices PKG1, PKG2, and PKG3 mounted on a first principle surface (here, an upper surface) of the power wiring board PB1.

Each of the plurality of semiconductor devices PKG1, PKG2, and PKG3 has the semiconductor chip CP1 and the semiconductor chip CP2. The semiconductor chip CP1 is the high-side semiconductor chip having the high-side MOSFET, and the semiconductor chip CP2 is the low-side semiconductor chip having the low-side MOSFET. Each of the plurality of semiconductor devices PKG1, PKG2, and PKG3 further includes the high-side drain terminal (here, the die pad DP1) electrically connected to the drain electrode (here, the back surface electrode BE) of the semiconductor chip CP1 and the low-side drain terminal (here, the die pad DP2) electrically connected to the drain electrode (here, the back surface electrode BE) of the semiconductor chip CP2. Each of the plurality of semiconductor devices PKG1, PKG2, and PKG3 further includes the low-side source terminal (here, the source lead LDS1) electrically connected to the source electrode (here, the source pad PDS) of the semiconductor chip CP1 and the sealing body (here, the sealing portion MR) that seals the semiconductor chip CP1 and the semiconductor chip CP2. The source electrode (source pad PDS) of the semiconductor chip CP1 is electrically connected to the drain electrode (back surface electrode BE) of the low-side semiconductor chip CP2 in each of the plurality of semiconductor devices PKG1, PKG2, and PKG3.

The plurality of terminals of the power wiring board PB1 include a first terminal (power supply terminal, corresponding to the hole HP1 or the power supply connection pin PN1 inserted through the hole HP1) to which the power supply voltage (VIN) is supplied and a second terminal (ground terminal, corresponding to the hole HP2 or the ground connection pin PN2 inserted through the hole HP2 here) to which the reference voltage (ground potential GND) is supplied. The plurality of terminals of the power wiring board PB1 further include a plurality of output terminals (output terminals to the motor MOT, corresponding to the holes HM1, HM2, and HM3 or the connection pins BB1, BB2, and BB3 inserted through the holes HM1, HM2, and HM3 here) provided for the low-side drain terminal (die pad DP2) of each of the plurality of semiconductor devices PKG1, PKG2, and PKG3.

On the first principle surface (upper surface) of the power wiring board PB1, a first conductor pattern (here, the power supply wiring WV1) that electrically connects the high-side drain terminal (die pad DP1) of each of the plurality of semiconductor devices PKG1, PKG2, and PKG3 to the first terminal (here, the hole HP1 or the power supply connection pin PN1 inserted through the hole HP1) is famed. On the first principle surface (here, the upper surface) of the power wiring board PB1, a second conductor pattern (here, the output wirings WD1, WD2, and WD3) that electrically connects the low-side drain terminal (die pad DP2) of each of the plurality of semiconductor devices PKG1, PKG2, and PKG3 to each of the plurality of output terminals (here, the holes HM1, HM2, and HM3 or the connection pins BB1, BB2, and BB3 inserted through the holes HM1, HM2, and HM3) is further formed. On the first principle surface (upper surface) of the power wiring board PB1, a third conductor pattern (here, the ground wiring WG1) that is electrically connected to the second terminal (here, the hole HP2 or the ground connection pin PN2 inserted through the hole HP2) is further formed. The low-side source terminal (source lead LDS1) of each of the plurality of semiconductor devices PKG1, PKG2, and PKG3 is electrically connected to the third conductor pattern (ground wiring WG1).

One of main features of the present embodiment is that a current path width is made uniform for the power supply wiring WV1 (the first conductor pattern) and the output wirings WD1, WD2, and WD3 (the second conductor pattern) on the first principle surface (upper surface) of the power wiring board PB1, which is the principle surface on which the plurality of semiconductor devices PKG1, PKG2, and PKG3 are mounted.

Since large current flows through the power supply wiring WV1 and the output wirings WD1, WD2, and WD3, when there is a part in which a current path width is narrowed in the power supply wiring WV1 and the output wirings WD1, WD2, and WD3, a resistance component becomes large at that part, and power loss (conduction loss) is caused. In particular, in a case where the power wiring board PB1 has a circular planar shape and in a case where various holes are formed in the power wiring board PB1, the part in which a current path width is narrowed is likely to occur in the power supply wiring WV1 and the output wirings WD1, WD2, and WD3 depending on the position to arrange the wiring and the position to form the hole.

When the part in which a current path width is narrowed occurs in the power supply wiring WV1 and the output wirings WD1, WD2, and WD3 and the resistance component is increased at that part to cause the power loss, performance of the electronic device including the power wiring board PB1 and the semiconductor devices PKG1, PKG2, and PKG3 is degraded. Therefore, it is desired that the power loss (conduction loss) is reduced as much as possible in order to improve the performance of the electronic device.

Also, when a planar size of the power wiring board PB1 is increased so as to avoid the occurrence of the part in which a current path width is narrowed in the power supply wiring WV1 and the output wirings WD1, WD2, and WD3, a planar size of the entire electronic device is increased, with the result that a size of a driving system to which the electronic device is attached is increased. Further, when a thickness of the wiring and the number of wiring layers are increased in the power wiring board PB1 so as to reduce the power loss when the large current flows, a manufacturing cost of the power wiring board PB1 is increased, with the result that a manufacturing cost of the electronic device including the power wiring board PB1 and the semiconductor devices PKG1, PKG2, and PKG3 is increased.

Therefore, in the present embodiment, the current path width is made uniform in the power supply wiring WV1 (first conductor pattern) and the output wirings WD1, WD2, and WD3 (second conductor pattern) formed on the first principle surface (upper surface) of the power wiring board PB1. Namely, in the power supply wiring WV1 (first conductor pattern) and the output wirings WD1, WD2, and WD3 (second conductor pattern) formed on the first principle surface (upper surface) of the power wiring board PB1, the occurrence of the part in which a current path width is excessively narrowed is prevented.

Specifically, a planar layout of the power supply wiring WV1 (first conductor pattern) and the output wirings WD1, WD2, and WD3 (second conductor pattern) is designed as follows. That is, on the first principle surface (upper surface) of the power wiring board PB1, a minimum value of a current path width (W1) in the power supply wiring WV1 (first conductor pattern) is referred to as a first minimum width (power supply wiring minimum width), and a maximum value of the current path width (W1) in the power supply wiring WV1 (first conductor pattern) is referred to as a first maximum width (power supply wiring maximum width). Also, a minimum value of a current path width (W2) in the output wirings WD1, WD2, and WD3 (second conductor pattern) is referred to as a second minimum width (output wiring minimum width), and a maximum value of the current path width (W2) in the output wirings WD1, WD2, and WD3 (second conductor pattern) is referred to as a second maximum width (output wiring maximum width). At this time, when the first minimum width (power supply wiring minimum width) is smaller than the second minimum width (output wiring minimum width), the first minimum width (power supply wiring minimum width) is made to be larger than half of the second maximum width, and when the second minimum width (output wiring minimum width) is smaller than the first minimum width (power supply wiring minimum width), the second minimum width (output wiring minimum width) is made to be larger than half of the first maximum width (power supply wiring maximum width). This will be described with reference to FIG. 25.

Figure 25:
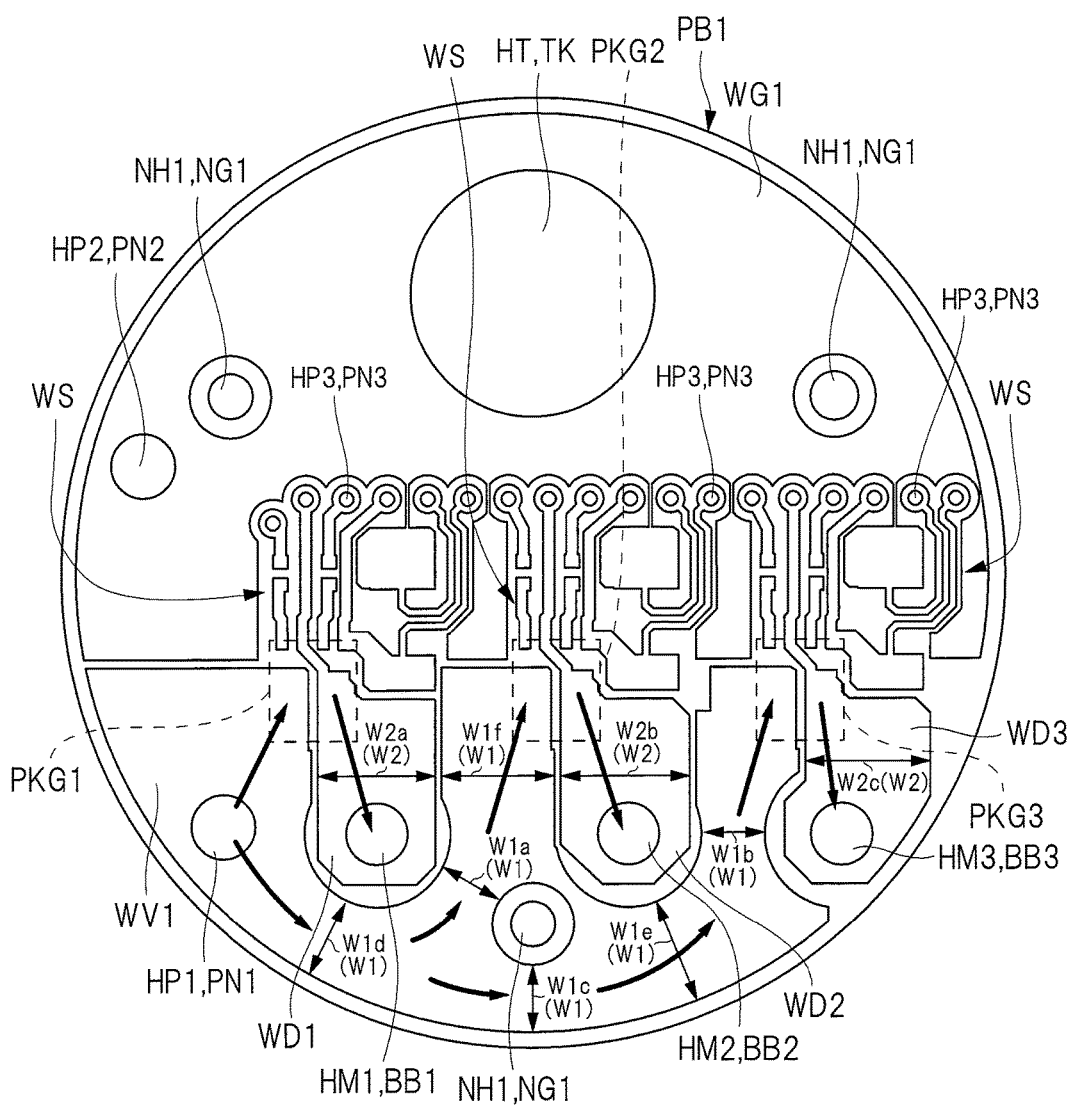
FIG. 25 is a plan perspective view of an upper surface side of the power wiring board.

FIG. 25 is a plan perspective view of the upper surface side of the power wiring board PB1, and shows the same plan view as FIG. 18 described above. However, the hatching shown in FIG. 18 is omitted in FIG. 25. Also in FIG. 25, the positions at which the semiconductor devices PKG1, PKG2, and PKG3 are mounted are indicated with dotted lines like in FIG. 18. Further, in FIG. 25, the current path in the power supply wiring WV1 and the output wirings WD1, WD2, and WD3 is schematically indicated with arrows.

Namely, in FIG. 25, the path of current flowing from the power supply connection pin PN1 to the die pad DP1 of each of the semiconductor devices PKG1, PKG2, and PKG3 in the power supply wiring WV1 is indicated with arrows. Also, in FIG. 25, the path of current flowing from the die pad DP2 of the semiconductor device PKG1 to the connection pin BB1 in the output wiring WD1, the path of current flowing from the die pad DP2 of the semiconductor device PKG2 to the connection pin BB2 in the output wiring WD2, and the path of current flowing from the die pad DP2 of the semiconductor device PKG3 to the connection pin BB3 in the output wiring WD3 are indicated with arrows.

A current path width W1 in the power supply wiring WV1 (first conductor pattern) is shown in FIG. 25. The current path width W1 in the power supply wiring WV1 is a width of the power supply wiring WV1 in the path of current flowing from the die pad DP1 of each of the semiconductor devices PKG1, PKG2, and PKG3 to the power supply connection pin PN1 in the power supply wiring WV1, and it corresponds to a width (size) of the power supply wiring WV1 in a direction substantially orthogonal to a direction of the current flow.

On the first principle surface (upper surface) of the power wiring board PB1, the current path width W1 in the power supply wiring WV1 is not uniform and differs depending on places. For example, in the current path width W1 in the power supply wiring WV1, widths W1$a$, W1$b$, W1$c$, and W1$d$ shown in FIG. 25 are relatively small, while widths W1$e$ and W1$f$ are relatively large. In the current path width W1 in the power supply wiring WV1, the smallest is the width W1$a$, and the second smallest is the width W1$b$. Namely, the width (W1) in the power supply wiring WV1 is not uniform, the current path width (W1) is the narrowest (smallest) at the position indicated as the width W1$a$, and the current path width (W1) is the second narrowest (smallest) at the position indicated as the width W1$b$. In addition, in the current path width W1 in the power supply wiring WV1, the largest is the width W1$f$. Namely, the width (W1) in the power supply wiring WV1 is not uniform, the current path width (W1) is the narrowest (smallest) at the position indicated as the width W1$a$, the current path width (W1) is the second narrowest (smallest) at the position indicated as the width W1$b$, and the current path width (W1) is the widest (largest) at the position indicated as the width W1$f$. Therefore, the minimum value of the current path width W1 in the power supply wiring WV1, that is, the first minimum width (power supply wiring minimum width) corresponds to the width W1$a$, and the maximum value of the current path width W1 in the power supply wiring WV1, that is, the first maximum width (power supply wiring maximum width) corresponds to the width W1f.

Also, a current path width W2 in the output wirings WD1, WD2, and WD3 (second conductor pattern) is shown in FIG. 25. In the output wiring WD1, the width W2 corresponds to a width of the output wiring WD1 in the path of current flowing from the die pad DP2 of the semiconductor device PKG1 to the connection pin BB1. In the output wiring WD2, the width W2 corresponds to a width of the output wiring WD2 in the path of current flowing from the die pad DP2 of the semiconductor device PKG2 to the connection pin BB2. In the output wiring WD3, the width W2 corresponds to a width of the output wiring WD3 in the path of current flowing from the die pad DP2 of the semiconductor device PKG3 to the connection pin BB3. Note that the width W2 corresponds to a width (size) of the output wirings WD1, WD2, and WD3 in a direction substantially orthogonal to a direction of the current flow in each of the output wirings WD1, WD2, and WD3.

There may be the case where the current path width W2 in the output wirings WD1, WD2, and WD3 is not uniform on the first principle surface (upper surface) of the power wiring board PB1. For example, in the current path width W2 in the output wirings WD1, WD2, and WD3, a width W2a shown in FIG. 25 is slightly smaller than widths W2b and W2c, and the width W2b is slightly larger than the widths W2a and W2c. Therefore, in the current path width W2 in the output wirings WD1, WD2, and WD3, the smallest is the width W2a, and the largest is the width W2b. Thus, the minimum value of the current path width W2 in the output wirings WD1, WD2, and WD3, that is, the second minimum width (output wiring minimum width) corresponds to the width W2a, and the maximum value of the current path width W2 in the output wirings WD1, WD2, and WD3, that is, the second maximum width (output wiring maximum width) corresponds to the width W2b.

In the case of FIG. 25, the minimum value of the current path width W1 in the power supply wiring WV1 (first minimum width, corresponding to the width W1a here) is smaller than the minimum value of the current path width W2 in the output wirings WD1, WD2, and WD3 (second minimum width, corresponding to the width W2a here). In this case, when a current flows through the power supply wiring WV1 and the output wirings WD1, WD2, and WD3, a part having the narrowest current path width is a part where the current path width W1 in the power supply wiring WV1 is the smallest (part having the first minimum width, that is, the width W1a here), and the resistance is increased and the power loss is increased at that part.

Thus, the layout of the power supply wiring WV1 and the output wirings WD1, WD2, and WD3 is designed such that the minimum value of the current path width W1 in the power supply wiring WV1 (first minimum width, corresponding to the width W1a here) is larger than half of the maximum value of the current path width W2 in the output wirings WD1, WD2, and WD3 (second maximum width, the width W2b here). Namely, W1a>W2b×1/2 holds.

Accordingly, it is possible to prevent the minimum value of the current path width W1 in the power supply wiring WV1 (first minimum width) from becoming excessively small, so that it is possible to suppress the phenomenon in which the resistance is increased at the part where the current path width W1 in the power supply wiring WV1 is the smallest and the power loss is caused. Further, it is possible to prevent the maximum value of the current path width W2 in the output wirings WD1, WD2, and WD3 (second maximum width) from becoming excessively large, so that it is possible to prevent the current path width W1 in the power supply wiring WV1 from becoming narrow.

Namely, although it is necessary to provide the power supply wiring WV1 and the output wirings WD1, WD2, and WD3 on the first principle surface (upper surface) of the power wiring board PB1, if there is a part where a width is excessively narrowed in the power supply wiring WV1 and the output wirings WD1, WD2, and WD3, the resistance is increased and the power loss is increased at that part. On the other hand, if there is a part where a width is excessively increased in the power supply wiring WV1 and the output wirings WD1, WD2, and WD3, the width tends to become narrow at the position adjacent thereto in the power supply wiring WV1 or the output wirings WD1, WD2, and WD3 due to the part where the width is excessively increased. Therefore, in the present embodiment, the layout of the power supply wiring WV1 and the output wirings WD1, WD2, and WD3 is designed such that the part where the current path width is excessively narrowed and the part where the current path width is excessively increased are not caused in the power supply wiring WV1 and the output wirings WD1, WD2, and WD3, thereby preventing an increase of the power loss.

As described above, in the present embodiment, the minimum value of the current path width W1 in the power supply wiring WV1 (here, the width W1a) is made to be larger than half of the maximum value of the current path width W2 in the output wirings WD1, WD2, and WD3 (width W2b), thereby preventing the increase of the power loss.

Here, in the case of FIG. 25, since the minimum value of the current path width W1 in the power supply wiring WV1 is smaller than the minimum value of the current path width W2 in the output wirings WD1, WD2, and WD3, the minimum value of the current path width W1 in the power supply wiring WV1 is made to be larger than half of the maximum value of the current path width W2 in the output wirings WD1, WD2, and WD3. However, there may be a case where the minimum value of the current path width W2 in the output wirings WD1, WD2, and WD3 (corresponding to the width W2a here) is smaller than the minimum value of the current path width W1 in the power supply wiring WV1 (corresponding to the width W1a here). When the minimum value of the current path width W2 in the output wirings WD1, WD2, and WD3 is smaller than the minimum value of the current path width W1 in the power supply wiring WV1, the minimum value of the current path width W2 in the output wirings WD1, WD2, and WD3 is made to be larger than half of the maximum value of the current path width W1 in the power supply wiring WV1.

Namely, a case in which the minimum value of the current path width W2 in the output wirings WD1, WD2, and WD3 (corresponding to the width W2a here) is smaller than the minimum value of the current path width W1 in the power supply wiring WV1 (corresponding to the width W1a here) is assumed. In this case, when a current flows through the power supply wiring WV1 and the output wirings WD1, WD2, and WD3, a part having the narrowest current path width is a part where the current path width W2 in the output wirings WD1, WD2, and WD3 is the smallest (part having the second minimum width, that is, the width W2a here), and the resistance is increased and the power loss is increased at that part. Therefore, the layout of the power supply wiring WV1 and the output wirings WD1, WD2, and WD3 is designed such that the minimum value of the current path width W2 in the output wirings WD1, WD2, and WD3 (second minimum width, corresponding to the width W2a here) is larger than half of the maximum value of the current path width W1 in the power supply wiring WV1 (first maximum width, or the width W1*f* here) (that is, W2*a*>W1*f*× 1/2). Accordingly, it is possible to prevent the minimum value of the current path width W2 in the output wirings WD1, WD2, and WD3 (second minimum width) from becoming excessively small, so that it is possible to suppress a phenomenon in which the resistance is increased at the part where the current path width W2 in the output wirings WD1, WD2, and WD3 is the smallest and the power loss is caused. Further, it is possible to prevent the maximum value of the current path width W1 in the power supply wiring WV1 (first maximum width) from becoming excessively large, so that it is possible to prevent the current path width W2 in the output wirings WD1, WD2, and WD3 from becoming narrow.

As described above, in a case where the minimum value of the width W1 (first minimum width) is smaller than the minimum value of the width W2 (second minimum width), the minimum value of the width W1 (first minimum width) is made to be larger than half of the maximum value of the width W2 (second maximum width). Also, in a case where the minimum value of the width W2 (second minimum width) is smaller than the minimum value of the width W1 (first minimum width), the minimum value of the width W2 (second minimum width) is made to be larger than half of the maximum value of the width W1 (first maximum width). Accordingly, it is possible to reduce the power loss in the power supply wiring WV1 and the output wirings WD1, WD2, and WD3. Thus, it is possible to improve the performance of the electronic device including the power wiring board PB1 and the plurality of semiconductor devices PKG1, PKG2, and PKG3.

In addition, in a case where the minimum value of the width W1 (first minimum width) is smaller than the minimum value of the width W2 (second minimum width), it is more preferable that the minimum value of the width W1 (first minimum width) is made to be larger than not only half of the maximum value of the width W2 (second maximum width) but also half of the maximum value of the width W1 (first maximum width). Further, in a case where the minimum value of the width W2 (second minimum width) is smaller than the minimum value of the width W1 (first minimum width), it is more preferable that the minimum value of the width W2 (second minimum width) is made to be larger than not only half of the maximum value of the width W1 (first maximum width) but also half of the maximum value of the width W2 (second maximum width).

Namely, in the case of FIG. 25, the minimum value of the current path width W1 in the power supply wiring WV1 (corresponding to the width W1*a* here) is smaller than the minimum value of the current path width W2 in the output wirings WD1, WD2, and WD3 (corresponding to the width W2*a* here). In this case, the layout of the power supply wiring WV1 and the output wirings WD1, WD2, and WD3 is designed such that the minimum value of the current path width W1 in the power supply wiring WV1 (width W1*a*) is larger than half of the maximum value of the current path width W2 in the output wirings WD1, WD2, and WD3 (width W2*b*) and is larger than half of the maximum value of the current path width W1 in the power supply wiring WV1 (width W1*f*). Namely, it is preferable that W1*a*>W2*b*× 1/2 and W1*a*>W1*f*×1/2 hold. Accordingly, it is possible to prevent the minimum value of the current path width W1 in the power supply wiring WV1 from becoming excessively small, so that it is possible to suppress the phenomenon in which the resistance is increased at the part where the current path width W1 in the power supply wiring WV1 is the smallest and the power loss is caused. Further, it is possible to prevent the maximum value of the current path width W2 in the output wirings WD1, WD2, and WD3 from becoming excessively large, so that it is possible to prevent the current path width W1 in the power supply wiring WV1 from becoming narrow. Still further, it is possible to prevent the maximum value of the current path width W1 in the power supply wiring WV1 from becoming excessively large, so that it is possible to prevent the current path width W2 in the output wirings WD1, WD2, and WD3 from becoming narrow.

In other words, if there is the part where a width is excessively increased in the power supply wiring WV1 and the output wirings WD1, WD2, and WD3, the width tends to become narrow at the position adjacent thereto in the power supply wiring WV1 and the output wirings WD1, WD2, and WD3 due to the part in which the width is excessively increased. Therefore, it is more preferable that the minimum value of the current path width W1 in the power supply wiring WV1 is made to be larger than half of the maximum value of the current path width W2 in the output wirings WD1, WD2, and WD3 (width W2*b*) and half of the maximum value of the current path width W1 in the power supply wiring WV1. Accordingly, it is possible to prevent the current path width (W1 and W2) in the power supply wiring WV1 and the output wirings WD1, WD2, and WD3 from becoming narrow.

Also, there may be a case where the minimum value of the current path width W2 in the output wirings WD1, WD2, and WD3 (corresponding to the width W2*a* here) is smaller than the minimum value of the current path width W1 in the power supply wiring WV1 (corresponding to the width W1*a* here). In this case, it is more preferable that the minimum value of the current path width W2 in the output wirings WD1, WD2, and WD3 is made to be larger than not only half of the maximum value of the current path width W1 in the power supply wiring WV1 but also half of the maximum value of the current path width W2 in the output wirings WD1, WD2, and WD3.

Also, it is more preferable that a relationship similar to the relationship between the current path width W1 in the power supply wiring WV1 and the current path width W2 in the output wirings WD1, WD2, and WD3 described above is applied to the power supply wiring WV2 and the output wirings WD4, WD5, and WD6 formed on the second principle surface (lower surface) of the power wiring board PB1. This will be described with reference to FIG. 26.

Figure 26:
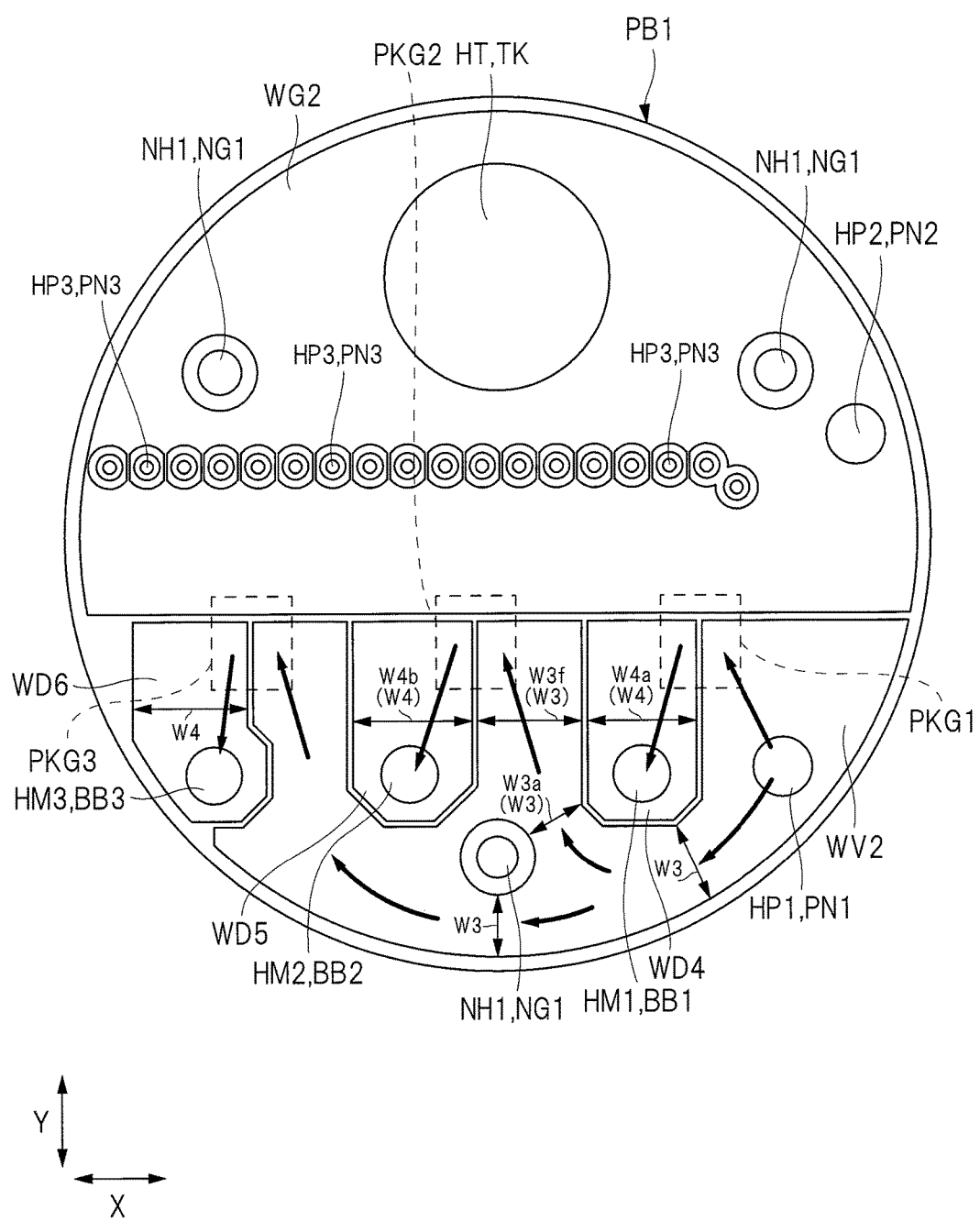
FIG. 26 is a plan perspective view of a lower surface side of the power wiring board.

FIG. 26 is a plan perspective view of the lower surface side of the power wiring board PB1, and shows the same plan view as FIG. 19 described above. However, the hatching shown in FIG. 19 is omitted in FIG. 26. Also, in FIG. 26, the positions at which the semiconductor devices PKG1, PKG2, and PKG3 are mounted on the upper surface side of the power wiring board PB1 are indicated with dotted lines. Further, in FIG. 26, the current path in the power supply wiring WV2 and the output wirings WD4, WD5, and WD6 is schematically indicated with arrows.

A current path width W3 in the power supply wiring WV2 (fourth conductor pattern) and a current path width W4 in the output wirings WD4, WD5, and WD6 (fifth conductor pattern) are shown in FIG. 26. The current path width W3 in the power supply wiring WV2 is a width of the power supply wiring WV2 in the path of current flowing from the die pad DP1 of each of the semiconductor devices PKG1, PKG2, and PKG3 to the power supply connection pin PN1 in the power supply wiring WV2, and it corresponds to a width (size) of the power supply wiring WV2 in a direction substantially orthogonal to a direction of the current flow. In the output wiring WD4, the width W4 corresponds to a width of the output wiring WD4 in the path of current flowing from the die pad DP2 of the semiconductor device PKG1 to the connection pin BB1. Also, in the output wiring WD5, the width W4 corresponds to a width of the output wiring WD5 in the path of current flowing from the die pad DP2 of the semiconductor device PKG2 to the connection pin BB2. Further, in the output wiring WD6, the width W4 corresponds to a width of the output wiring WD6 in the path of current flowing from the die pad DP2 of the semiconductor device PKG3 to the connection pin BB3. Note that the width W4 corresponds to a width (size) of the output wirings WD4, WD5, and WD6 in a direction substantially orthogonal to a direction of the current flow in each of the output wirings WD4, WD5, and WD6.

In the case of FIG. 26, the width W3 in the power supply wiring WV2 is not uniform, the current path width W3 is the narrowest (smallest) at a position indicated as a width W3a, and the current path width W3 is the widest (largest) at a position indicated as a width W3f. Further, in the current path width W4 in the output wirings WD4, WD5, and WD6, the smallest is a width W4a, and the largest is a width W4b.

In the case of FIG. 26, the minimum value of the current path width W3 in the power supply wiring WV2 (third minimum width, corresponding to the width W3a here) is smaller than the minimum value of the current path width W4 in the output wirings WD4, WD5, and WD6 (fourth minimum width, corresponding to the width W4a here). In this case, it is preferable that a layout of the power supply wiring WV2 and the output wirings WD4, WD5, and WD6 is designed such that the minimum value of the current path width W3 in the power supply wiring WV2 (width W3a)is larger than half of the maximum value of the current path width W4 in the output wirings WD4, WD5, and WD6 (width W4b). Namely, it is preferable that W3a>W4b×1/2 holds. Further, it is more preferable that the layout of the power supply wiring WV2 and the output wirings WD4, WD5, and WD6 is designed such that the minimum value of the current path width W3 in the power supply wiring WV2 (width W3a)is larger than half of the maximum value of the current path width W4 in the output wirings WD4, WD5, and WD6 (width W4b) and is larger than half of the maximum value of the current path width W3 in the power supply wiring WV2 (width W3f). Namely, it is more preferable that W3a>W4b×1/2 and W3a>W3f×1/2 hold. Accordingly, it is possible to more surely obtain a resistance reduction effect achieved by providing the power supply wiring WV2 and the output wirings WD4, WD5, and WD6, and it is possible to more accurately suppress the power loss.

Also, there may be a case where the minimum value of the current path width W4 in the output wirings WD4, WD5, and WD6 (corresponding to the width W4a here) is smaller than the minimum value of the current path width W3 in the power supply wiring WV2 (corresponding to the width W3a here). In this case, it is preferable that the layout of the power supply wiring WV2 and the output wirings WD4, WD5, and WD6 is designed such that the minimum value of the current path width W4 in the output wirings WD4, WD5, and WD6 is larger than half of the maximum value of the current path width W3 in the power supply wiring WV2. Further, it is more preferable that the layout of the power supply wiring WV2 and the output wirings WD4, WD5, and WD6 is designed such that the minimum value of the current path width W4 in the output wirings WD4, WD5, and WD6 is larger than half of the maximum value of the current path width W3 in the power supply wiring WV2 (width W3f) and is larger than half of the maximum value of the current path width W4 in the output wirings WD4, WD5, and WD6. Accordingly, it is possible to more surely obtain the resistance reduction effect achieved by providing the power supply wiring WV2 and the output wirings WD4, WD5, and WD6, and it is possible to more accurately suppress the power loss.

Namely, in a case where the minimum value of the width W3 is smaller than the minimum value of the width W4, it is preferable that the minimum value of the width W3 is larger than half of the maximum value of the width W4, and it is more preferable that the minimum value of the width W3 is larger than half of the maximum value of the width W3. Further, in a case where the minimum value of the width W4 is smaller than the minimum value of the width W3, it is preferable that the minimum value of the width W4 is larger than half of the maximum value of the width W3, and it is more preferable that the minimum value of the width W4 is larger than half of the maximum value of the width W4. Accordingly, it is possible to more surely obtain the resistance reduction effect achieved by providing the power supply wiring WV2 and the output wirings WD4, WD5, and WD6, and it is possible to more accurately suppress the power loss.

As described above, in the present embodiment, the current path widths W1 and W2 in the power supply wiring WV1 and the output wirings WD1 to WD3 are made uniform on the first principle surface (upper surface) of the power wiring board PB1, and the current path widths W3 and W4 in the power supply wiring WV2 and the output wirings WD4 to WD6 are made uniform on the second principle surface (lower surface) of the power wiring board PB1. Accordingly, it is possible to efficiently reduce the power loss, so that it is possible to improve the performance of the electronic device.

However, in the case where the power wiring board PB1 has the circular planar shape and in the case where various holes need to be provided in the power wiring board PB1 as in the present embodiment, it is difficult to make the current path widths (W1 to W4) in the power supply wirings (WV1 and MV2) and the output wirings (WD1 to WD6) uniform as described above unless the layout of the wirings and the holes in the power wiring board PB1 is devised. Therefore, it is preferable that the layout is devised in the following manner, for example.

That is, on the upper surface of the power wiring board PB1, it is preferable that the size (width) of the output wiring WD1 in the X direction, the size of the output wiring WD2 in the X direction, the size of the output wiring WD3 in the X direction, the X-direction size of a part of the power supply wiring WV1 extending in the Y direction between the output wirings WD1 and WD2, and the X-direction size of a part of the power supply wiring WV1 extending in the Y direction between the output wirings WD2 and WD3 are substantially the same (uniform). Further, on the lower surface of the power wiring board PB1, it is preferable that the size of the output wiring WD4 in the X direction, the size of the output wiring WD5 in the X direction, the size of the output wiring WD6 in the X direction, the X-direction size of a part of the power supply wiring WV2 extending in the Y direction between the output wirings WD4 and WD5, and the X-direction size of a part of the power supply wiring WV2 extending in the Y direction between the output wirings WD5 and WD6 are substantially the same (uniform).

Also, if the holes HM1 to HM3 are provided too close to the outer circumference of the power wiring board PB1, there is a possibility that a width (size in the Y direction) of a part of the power supply wiring WV1 sandwiched between the holes HM1 to HM3 and the outer circumference of the power wiring board PB1 becomes too small in a part of the power supply wiring WV1 extending along the outer circumference of the power wiring board PB1. Therefore, positions of the holes HM1 to HM3 (distances from the holes HM1 to HM3 to the outer circumference of the power wiring board PB1) are set such that the above-mentioned relationship between the widths W1 and W2 is established.

In a case where the fixing hole NH1 is provided at a position enclosed in the power supply wiring WV1 in a plan view, the current path width W1 in the power supply wiring WV1 is likely to be small at the position adjacent to the hole NH1. Therefore, even when the width W1 becomes small at the position adjacent to the hole NH1, the position of the hole NH1 is set such that the above-mentioned relationship between the widths W1 and W2 is established.

Further, the power wiring board PB1 has a plurality of holes (HT1, HP1, HP2, HP3, HM1, HM2, HM3, and NH1), and the hole HT1 has the largest area (planar size) and thus has the largest diameter among the holes (HT1, HP1, HP2, HP3, HM1, HM2, HM3, and NH1) provided in the power wiring board PB1. The hole HT1 is a hole through which a pipe (discharge port TK, here), through which the fuel sucked up by the fuel pump PM passes, is inserted, and a diameter of the pipe (discharge port TK, here) inserted through the hole HT1 needs to be increased to some extent in order to efficiently transport the fuel from the fuel pump PM to the engine ENG. Therefore, it is necessary to increase the area (diameter) of the hole HT1 to some extent. However, if the hole HT1 having the large area is formed in a region where the power supply wiring WV1 and the output wirings WD1 to WD3 are disposed in the power wiring board PB1, a part where the current path widths W1 and W2 in the power supply wiring WV1 and the output wirings WD1 to WD3 are excessively small tends to be formed due to the hole HT1, so that the power loss is likely to be increased.

Therefore, it is preferable that the hole HT1 is famed in the region where the ground wiring WG1 is disposed in the power wiring board PB1 instead of the region where the power supply wiring WV1 and the output wirings WD1 to WD3 are disposed. Namely, it is preferable that the hole HT1 is famed at a position enclosed in the ground wirings WG1 and WG2 in a plan view in the power wiring board PB1. In other words, it is preferable that the hole HT1 is formed at a position surrounded by the ground wiring WG1 on the upper surface side of the power wiring board PB1 and a position surrounded by the ground wiring WG2 on the lower surface side of the power wiring board PB1. Namely, of both sides (both sides in the Y direction) of the row of the semiconductor devices PKG1, PKG2, and PKG3 on the upper surface of the power wiring board PB1, the hole HT1 is preferably famed on the side where the signal wiring WS and the ground wiring WG1 are disposed instead of the side where the power supply wiring WV1 and the output wirings WD1, WD2, and WD3 are disposed. Accordingly, it is possible to prevent the occurrence of the part where the current path widths W1 and W2 in the power supply wiring WV1 and the output wirings WD1 to WD3 become small due to the hole HT1 provided in the power wiring board PB1. Thus, it is possible to prevent the increase of the power loss caused by providing the hole HT1.

In order to attach the power wiring board PB1 to the motor MOT, the power wiring board PB1 needs to have the fixing hole NH1. It is preferable that a plurality of fixing holes NH1 are provided in the power wiring board PB1, and it is more preferable that three fixing holes NH1 are provided therein. However, depending on the way to dispose the fixing holes NH1, the part where the current path widths W1 and W2 in the power supply wiring WV1 and the output wirings WD1 to WD3 are excessively small tends to be formed due to the hole HT1, so that the power loss is likely to be increased.

Therefore, in a case where the fixing holes NH1 are provided in the power wiring board PB1, of both sides (both sides in the Y direction) of the row of the semiconductor devices PKG1, PKG2, and PKG3, the number of the holes NH1 provided on the side where the signal wiring WS and the ground wiring WG1 are disposed is preferably made to be larger than the number of the holes NH1 provided on the side where the power supply wiring WV1 and the output wirings WD1, WD2, and WD3 are disposed. Also, it is preferable that the hole NH1 is not famed at a position enclosed in the output wirings WD1, WD2, and WD3 in a plan view. Further, in order to make it easier to connect the semiconductor devices PKG1, PKG2, and PKG3 to the signal pin PN3 through the signal wiring WS and the like, it is preferable that the hole NH1 is not formed in the region where the signal wiring WS is famed, that is, in the region between the row of the semiconductor devices PKG1, PKG2, and PKG3 and the row of the holes HP3 in a plan view. Therefore, it is preferable that the hole NH1 is famed at a position enclosed in the ground wiring WG1 (position surrounded by the ground wiring WG1) and at a position enclosed in the power supply wiring WV1 (position surrounded by the power supply wiring WV1) in a plan view, and it is also preferable that the number of the holes NH1 provided at the position enclosed in the power supply wiring WV1 is made to be smaller than the number of the holes NH1 provided at the position enclosed in the ground wiring WG1. For example, in order to stably fix the power wiring board PB1 to the motor MOT, three fixing holes NH1 are preferably provided, and in that case, it is desirable that one hole NH1 is provided at the position enclosed in the power supply wiring WV1 and two holes NH1 are provided at the position enclosed in the ground wiring WG1. Accordingly, it is possible to suppress or prevent the occurrence of the part where the current path widths W1 and W2 in the power supply wiring WV1 and the output wirings WD1 to WD3 become small due to the hole NH1 provided in the power wiring board PB1, and it is thus possible to suppress or prevent the increase of the power loss caused by providing the hole NH1.

In the foregoing, the invention made by the inventors of the present invention has been concretely described based on the embodiments. However, it is needless to say that the present invention is not limited to the foregoing embodiments and various modifications and alterations can be made within the scope of the present invention.

REFERENCE SIGNS LIST 1, 2, 3, 4, 5, 6 power MOSFET
11, 12 ECU
BB, BB1, BB2, BB3 connection pin
BD bonding material
BE back surface electrode
BS1, BS2 base material layer
CD1a, CD1b, CD1c, CD2a, CD2b, CD2c conductive film CT control circuit unit
CV cover member
DP1, DP2 die pad
EC1, EC2 electronic component
ENG engine
GS fuel
HC, HC1, HC2, HC3, HM, HM1, HM2, HM3, HP, HP1, HP2, HP3, HT1, HT2, NH1, NH2 hole
HS heat dissipation sheet
IMP impeller
LD lead
LDD1, LDD2, LDD3, LDD4 drain lead
LDG1, LDG2 gate lead
LDS1, LDS2 source lead
MOT motor
MR sealing portion
NG1, NG2 screw
OP1, OP2 opening portion
PB1 power wiring board
PB2 control wiring board
PDG gate pad
PDS source pad
PK power system circuit constituting unit
PKG1, PKG2, PKG3 semiconductor device
PM fuel pump
PN connection pin
PN1 power supply connection pin
PN2 ground connection pin
PN3 signal pin
R1-R9 resistor
R1a-R9a chip resistor
RG regulator
RS1a, RS1b, RS2a, RS2b resist layer
SD1, SD2, SD3, SD4 side
SFT shaft
SK control system circuit constituting unit
SL solder
TE1-TE6 terminal
TK discharge port
WA wire
WD1, WD2, WD3, WD4, WD5, and WD6 output wiring
WG1, WG2 ground wiring
WS signal wiring
WV1, WV2 power supply wiring

The invention claimed is:

1. An electronic device comprising:
a first wiring board having a first principle surface, a second principle surface opposite to the first principle surface, and a plurality of terminals; and
a plurality of semiconductor devices mounted on the first principle surface of the first wiring board,
wherein each of the plurality of semiconductor devices includes a high-side semiconductor chip having a high-side MOSFET, a low-side semiconductor chip having a low-side MOSFET, a high-side drain terminal electrically connected to a drain electrode of the high-side semiconductor chip, a low-side drain terminal electrically connected to a drain electrode of the low-side semiconductor chip, a low-side source terminal electrically connected to a source electrode of the low-side semiconductor chip, and a sealing member that seals the high-side semiconductor chip and the low-side semiconductor chip,
a source electrode of the high-side semiconductor chip and the drain electrode of the low-side semiconductor chip of each of the plurality of semiconductor devices are electrically connected to each other,
the plurality of terminals include a first terminal to which a power supply voltage is supplied, a second terminal to which a reference voltage is supplied, and a plurality of output terminals provided for the low-side drain terminal of each of the plurality of semiconductor devices,
on the first principle surface of the first wiring board, a first conductor pattern electrically connecting the high-side drain terminal of the plurality of semiconductor devices to the first terminal, a second conductor pattern electrically connecting the low-side drain terminal of the plurality of semiconductor devices to the plurality of output terminals, and a third conductor pattern electrically connected to the second terminal are formed,
the low-side source terminal of the plurality of semiconductor devices is electrically connected to the third conductor pattern, and
when a minimum value of a current path width in the first conductor pattern is referred to as a first minimum width, a maximum value of the current path width in the first conductor pattern is referred to as a first maximum width, a minimum value of a current path width in the second conductor pattern is referred to as a second minimum width, and a maximum value of the current path width in the second conductor pattern is referred to as a second maximum width, the first minimum width is larger than half of the second maximum width in a case where the first minimum width is smaller than the second minimum width, and the second minimum width is larger than half of the first maximum width in a case were the second minimum width is smaller than the first minimum width.

2. The electronic device according to claim 1,
wherein the first minimum width is larger than half of the first maximum width and is larger than half of the second maximum width in a case where the first minimum width is smaller than the second minimum width, and
the second minimum width is larger than half of the first maximum width and is larger than half of the second maximum width in a case where the second minimum width is smaller than the first minimum width.

3. The electronic device according to claim 1,
wherein the second conductor pattern is separated for each of the semiconductor devices.

4. The electronic device according to claim 1,
wherein, on the second principle surface of the first wiring board, a fourth conductor pattern electrically connected to the first conductor pattern through a plurality of first via portions, a fifth conductor pattern electrically connected to the second conductor pattern through a plurality of second via portions, and a sixth conductor pattern electrically connected to the third conductor pattern through a plurality of third via portions are formed.

5. The electronic device according to claim 4,
wherein, when a minimum value of a current path width in the fourth conductor pattern is referred to as a third minimum width, a maximum value of the current path width in the fourth conductor pattern is referred to as a third maximum width, a minimum value of a current path width in the fifth conductor pattern is referred to as a fourth minimum width, and a maximum value of the current path width in the fifth conductor pattern is referred to as a fourth maximum width, the third minimum width is larger than half of the third maximum width and is larger than half of the fourth maximum width, and the fourth minimum width is larger than half of the third maximum width and is larger than half of the fourth maximum width.

6. The electronic device according to claim 1, wherein a planar shape of the first wiring board is circular.

7. The electronic device according to claim 1, wherein the first wiring board is attached to a motor, and output from the plurality of output terminals is supplied to the motor to drive the motor.

8. The electronic device according to claim 1, wherein the plurality of terminals are constituted of a plurality of pins inserted through a plurality of first holes of the first wiring board.

9. The electronic device according to claim 1, wherein the number of the semiconductor devices mounted on the first wiring board is three.

10. The electronic device according to claim 1, wherein the first wiring board has a second hole at a position enclosed in the third conductor pattern in a plan view, and
the second hole is a hole having the largest area among holes provided in the first wiring board.

11. The electronic device according to claim 10, wherein a pipe is inserted through the second hole.

12. The electronic device according to claim 11, wherein the first wiring board is attached to a motor for a fuel pump,
output from the plurality of output terminals is supplied to the motor to drive the motor, and
fuel sucked up by the fuel pump passes through the pipe.

13. The electronic device according to claim 1, further comprising:
a second wiring board facing the first wiring board,
wherein an electronic component for controlling the plurality of semiconductor devices is mounted on the second wiring board.

14. The electronic device according to claim 1, wherein the first wiring board further includes third holes for fixing each formed at a position enclosed in the first conductor pattern and at a position enclosed in the third conductor pattern in a plan view, and
the number of the third holes formed at the position enclosed in the first conductor pattern is smaller than the number of the third holes formed at the position enclosed in the third conductor pattern.

15. The electronic device according to claim 14, wherein the number of the third holes provided in the first wiring board is three, and
one of the three third holes is formed at the position enclosed in the first conductor pattern and two of the third holes are formed at the position enclosed in the third conductor pattern in a plan view.

* * * * *